United States Patent
Zheng et al.

(10) Patent No.: US 10,603,685 B2
(45) Date of Patent: Mar. 31, 2020

(54) METHODS AND SYSTEMS FOR ASSEMBLY OF PARTICLE SUPERSTRUCTURES

(71) Applicant: BOARD OF REGENTS, THE UNIVERSITY OF TEXAS SYSTEM, Austin, TX (US)

(72) Inventors: Yuebing Zheng, Austin, TX (US); Linhan Lin, Austin, TX (US); Xiaolei Peng, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/902,019

(22) Filed: Feb. 22, 2018

(65) Prior Publication Data
US 2018/0236486 A1 Aug. 23, 2018

Related U.S. Application Data

(60) Provisional application No. 62/462,581, filed on Feb. 23, 2017.

(51) Int. Cl.
*C08J 3/14* (2006.01)
*B05D 3/06* (2006.01)
(Continued)

(52) U.S. Cl.
CPC ............ *B05D 3/06* (2013.01); *B05D 7/14* (2013.01); *C23C 26/00* (2013.01); *B05D 3/0263* (2013.01);
(Continued)

(58) Field of Classification Search
CPC .................. B05D 1/00–42; B05D 3/0263; B05D 3/0281; B05D 3/029; B05D 3/06;
(Continued)

(56) References Cited

U.S. PATENT DOCUMENTS

| 4,425,261 A | 1/1984 | Stenius et al. |
| 6,016,226 A | 1/2000 | Arisawa |

(Continued)

FOREIGN PATENT DOCUMENTS

| WO | WO-2016023904 A1 * | 2/2016 | ............ C09D 11/52 |
| WO | 2017106145 | 6/2017 | |

(Continued)

OTHER PUBLICATIONS

Coskun, et al., "Polyol synthesis of silver nanowires: An extensive parametric study", Cryst. Growth Des. 11, 4963-4969 (2011).
(Continued)

*Primary Examiner* — Marianne L Padgett
(74) *Attorney, Agent, or Firm* — Meunier Carlin & Curfman LLC

(57) ABSTRACT

Disclosed herein are methods comprising illuminating a first location of an optothermal substrate with electromagnetic radiation, wherein the optothermal substrate converts at least a portion of the electromagnetic radiation into thermal energy. The optothermal substrate can be in thermal contact with a liquid sample comprising a plurality of capped particles and a plurality of surfactant micelles, the liquid sample having a first temperature. The methods can further comprise generating a confinement region at a location in the liquid sample proximate to the first location of the optothermal substrate, wherein at least a portion of the confinement region has a second temperature that is greater than the first temperature such that the confinement region is bound by a temperature gradient. The methods can further comprise trapping and depositing at least a portion of the plurality of capped particles.

17 Claims, 27 Drawing Sheets

(51) Int. Cl.
  *C23C 26/00* (2006.01)
  *B05D 7/14* (2006.01)
  *C23C 14/24* (2006.01)
  *C23C 14/18* (2006.01)
  *B05D 3/02* (2006.01)

(52) U.S. Cl.
  CPC .......... *B05D 2401/32* (2013.01); *C23C 14/18* (2013.01); *C23C 14/24* (2013.01)

(58) Field of Classification Search
  CPC .......... B05D 3/065; B05D 3/067; B05D 7/14; B05D 2401/32; C23C 18/14; C23C 20/00–08; C23C 26/00
  USPC ................ 427/498, 512, 521, 551–559, 581; 204/491, 493, 494, 500, 501, 509, 533
  See application file for complete search history.

(56) References Cited

U.S. PATENT DOCUMENTS

| | | | |
|---|---|---|---|
| 6,348,295 B1* | 2/2002 | Griffith | B81C 1/00373 257/E21.174 |
| 8,431,903 B2 | 4/2013 | Duhr et al. | |
| 9,096,430 B2* | 8/2015 | Xiao | B82Y 5/00 |
| 10,281,398 B2* | 5/2019 | Zheng | G01N 21/553 |
| 10,371,892 B2* | 8/2019 | Zheng | G02B 5/008 |
| 10,392,519 B2* | 8/2019 | Dietsch | C09D 11/14 |
| 2003/0224162 A1* | 12/2003 | Hirai | C09D 5/24 428/402 |
| 2005/0281944 A1 | 12/2005 | Jang | |
| 2006/0057502 A1* | 3/2006 | Okada | C23C 18/14 430/313 |
| 2008/0245430 A1 | 10/2008 | Adleman et al. | |
| 2009/0034053 A1 | 2/2009 | King | |
| 2010/0142038 A1 | 6/2010 | Sugiura et al. | |
| 2011/0084218 A1 | 4/2011 | Duhr et al. | |
| 2015/0036234 A1* | 2/2015 | Ben-Yakar | G02B 5/206 359/885 |
| 2015/0056426 A1* | 2/2015 | Grouchko | C09D 11/52 428/208 |
| 2015/0111199 A1 | 4/2015 | Hart et al. | |
| 2015/0204810 A1 | 7/2015 | Pan et al. | |
| 2015/0316480 A1 | 11/2015 | Seidel et al. | |
| 2015/0380120 A1* | 12/2015 | Wereley | G21K 1/006 250/251 |
| 2017/0166760 A1* | 6/2017 | Dietsch | C09D 11/52 |
| 2017/0194144 A1* | 7/2017 | Duan | H01L 21/02381 |
| 2019/0113453 A1* | 4/2019 | Zheng | G01N 21/553 |
| 2019/0195805 A1* | 6/2019 | Zheng | G01N 21/658 |
| 2019/0264327 A1* | 8/2019 | Zheng | C23C 18/1865 |

FOREIGN PATENT DOCUMENTS

| | | |
|---|---|---|
| WO | 2017184741 | 10/2017 |
| WO | 2018049109 | 3/2018 |

OTHER PUBLICATIONS

Curto, et al., "Unidirectional Emission of a Quantum Dot Coupled to a Nanoantenna", Science 2010, 329(5994), 930-933.
Dahl, et al., "Composite Titanium Dioxide Nanomaterials", Composite Titanium Dioxide Nanomaterials, Chem. Rev. 2014, 114, 9853-9889.
Ditlbacher, et al., "Silver nanowires as surface plasmon resonators", Phys. Rev. Lett. 95, 257403 (2005), 4 Pages.
Eastman, Ed , "Theory of the soret effect", J. Am. Chem. Soc. 50, 283-291 (1928).
Guo, et al., "Controlling Cell-Cell Interactions Using Surface Acoustic Waves", Proc. Natl. Acad. Sci. 2015, 112, 43-48.
Hernandez-Santana, et al., "Nanolithography: Written with Light", Nature Nanotechnol. 2010, 5, 629-630.
Hildebrandt, et al., "Surface-Enhanced Resonance Raman Spectroscopy of Rhodamine 6G Adsorbed on Colloidal Silver", J. Phys. Chem. 1984, 88, 5935-5944.
Kneipp, et al., "Single Molecule Detection Using Surface-Enhanced Raman Scattering (SERS)", Phys. Rev. Lett. 1997, 78, 1667-1670.
Lee, et al., "Fano Resonance and Spectrally Modified Photoluminescence Enhancement in Monolayer MoS2 Integrated with Plasmonic Nanoantenna Array", Nano Lett. 2015, 15, 3646-3653.
Lee, et al., "InAs/GaAs Quantum-Dot Lasers Monolithically Grown on Si, Ge, and Ge-on-Si Substrates", IEEE J Sel Topics Quantum Electon 2013, 19(4); 1901107 (7 pages).
Li, et al., "Large-Scale Synthesis of Nearly Monodisperse CdSe/CdS Core/Shell Nanocrystals Using Air-Stable Reagents via Successive Ion Layer Adsorption and Reaction", J Am Chem Soc 2003, 125: 12567-12575.
Manz, et al., "Spatial organization and signal transduction at intercellular junctions", Nat. Rev. Mol. Cell Biol. 2010, 11(5): 342-352.
Pang, et al., "Optical Trapping of Individual Human Immunodeficiency Viruses in Culture Fluid Reveals Heterogeneity with Single-Molecule Resolution", Nat. Nanotechnol. 2014, 9, 624-630, 9(8).
Raut, et al., "Multiscale ommatidial arrays with broadband and omnidirectional antireflection and antifogging properties by sacrificial layer mediated nanoimprinting", ACS Nano 2015, 9, 1305-1314, vol. 9, No. 2.
Shcherbatyuk, et al., "Anomalous photo-induced spectral changes in CdSe/ZnS quantum dots", J Appl Phys 2011, 110(5), 053518.
Stiles, et al., "Surface-Enhanced Raman Spectroscopy", Annu. Rev. Anal. Chem. 2008, 1, 601-626.
Streuli, et al., "Control of mammary epithelial differentiation: basement membrane induces tissue-specific gene expression in the absence of cell-cell interaction and morphological polarity", J. Cell Biol 115, 1383-1395 (1991), vol. 115, No. 5.
Wang, et al., "A general strategy for nanocrystal synthesis", Nature 2005, 437, 121-124.
H. Kuwata, et al., "Resonant light scattering from metal nanoparticles: Practical analysis beyond Rayleigh approximation", Appl Phys Lett, 2003, 83, 162-164, vol. 83, No. 22.
Wiley, et al., "Synthesis of Silver Nanostructures with Controlled Shapes and Properties", Acc. Chem. Res. 2007, 40, 1067-1076.
Yan, et al., "Thermal conductivity of monolayer molybdenum disulfide obtained from temperature-dependent Raman spectroscopy", ACS Nano 2014, 8, 986-993, vol. 8 No. 1.
Yu, et al., "Experimental determination of the extinction coefficient of CdTe, CdSe and CdS nanocrystals", Chem Mater 2003, 15: 2854-2860.
Yu, et al., "Experimental Determination of the Extinction Coefficient of CdTe, CdSe, and CdS nanocrystals", Chem Mater 2004, 16, 560, (Correction of figure 4 of above-cited 2003 reference).
Yu, et al., "Formation of high-quality CdS and other II-VI semiconductor nanocrystals in noncoordinating solvents: Tunable reactivity of monomers", Angew Chem Int Edit 2002, 41(13), 2368-2371.
International Search Report and Written Opinion dated Mar. 2, 2017, issued for related International Application No. PCT/US2016/066291.
International Search Report and Written Opinion dated Jul. 14, 2017, issued for related International Application No. PCT/US2017/028379.
International Search Report and Written Opinion dated Nov. 13, 2017, issued for related International Application No. PCT/US2017/050605.
Ahn et al. Photonic-Plasmonic Mode coupling in On-Chip Integrated Optoplasmonic Molecules. ACS Nano 2012, 6, 951-960.
Ahn et al. Heterogenous Three-Dimensional Electronics by Use of Printed Semiconductor Nanomaterials. Science 2006, 314(5806), 1754-1757.
Anderson JL. Colloid Transport by Interfacial Forces. Annu. Rev. Fluid Mech. 1989, 21, 61-99.
Arias-González et al. Optical forces on small particles: Attractive and repulsive nature and plasmon-resonance conditions. J. Opt. Soc. Am. A 20, 1201-1209 (2003).

(56) References Cited

OTHER PUBLICATIONS

Ayala-Orozco et al. Au nanomatryoshkas as efficient near-infrared photothermal transducers for cancer treatment: Benchmarking against nanoshells. ACS Nano 8, 6372-6381 (2014).
Babynina et al. Bending gold nanorods with light. Nano Lett. 16, 6485-6490 (2016), Author version, 19 pages.
Baffou et al. Nanoscale Control of Optical Heating in Complex Plasmonic Systems. ACS Nano 2010, 4(2), 709-716.
Baffou et al. Photoinduced Heating of Nanoparticle Arrays. ACS Nano 2013, 7(8), 6478-6488.
Baffou et al. Super-Heating and Micro-Bubble Generation around Plasmonic Nanoparticles under cw Illumination. J Phys Chem C 2014, 118(9), 4890-4898.
Baffou et al. Thermo-plasmonics: Using metallic nanostructures as nano-sources of heat. Laser Photonics Rev. 7, 171-187 (2013).
Bagalkot et al. Quantum Dot-Aptamer Conjugates for Synchronous Cancer Imaging, Therapy, and Sensing of Drug Delivery Based on Bi-Fluorescence Resonance Energy Transfer. Nano Lett, 2007, 7, 3065-3070.
Banzer et al. Chiral optical response of planar and symmetric nanotrimers enabled by heteromaterial selection. Nat. Commun. 7, 13117 (2016), (1-9 pages).
Bao et al. Optical Printing of Electrodynamically Coupled Metallic Nanoparticle Arrays. J. Phys. Chem. C 2014, 118, 19315-19321.
Baral et al. Comparison of Vapor Formation of Water at the Solid/Water Interface to Colloidal Solutions Using Optically Excited Gold Nanostructures. ACS Nano 2014, 8, 1439-1448.
Barnes et al. Surface plasmon subwavelength optics. Nature 2003, 424(6950): 824-830.
Bendix et al. Optical trapping of nanoparticles and quantum dots. IEEE J. Sel. Top. Quantum Electron. 20, 15-26 (2014), Provided as manuscript 13 pages.
Berthelot et al. Three-dimensional manipulation with scanning near-field optical nanotweezers. Nat Nano 2014, 9(4): 295-299, +4 pages supplemental material.
Blattmann et al. Plasmonic coupling dynamics of silver nanoparticles in an optical trap. Nano Lett. 15, 7816-7821 (2015).
Boltasseva et al. Low-loss plasmonic metamaterials. Science 331, 290-291 (2011).
Bosanac et al. Efficient optical trapping and visualization of silver nanoparticles. Nano Lett. 8, 1486-1491 (2008).
Bradley et al. Clickable janus particles. J. Am. Chem. Soc. 138, 11437-11440 (2016).
Braun et al. Optically Controlled Thermophoretic Trapping of Single Nano-Objects. ACS Nano 2013, 7(12): 11200-11208.
Braun et al. Single molecules trapped by dynamic inhomogeneous temperature fields. Nano Lett. 15, 5499-5505 (2015).
Braun et al. Trapping of DNA by Thermophoretic Depletion and Convection. Phys. Rev. Lett. 2002, 89(18): 188103.
Braun et al. Trapping of Single Nano-Objects in Dynamic Temperature Fields. Phys. Chem. Chem. Phys. 2014, 16, 15207-15213.
Bregulla et al. Thermo-osmotic flow in thin films. Phys. Rev. Lett. 116, 188303 (2016).
Chen et al. Directed self-assembly of a colloidal kagome lattice. Nature 469, 381-384 (2011).
Chen et al. How to Light Special Hot Spots in Multiparticle-Film Configurations. ACS Nano 2015, 10, 581-587, Provided as manuscript with author + title, without other source info.
Chen et al. Supracolloidal reaction kinetics of janus spheres. Science 331, 199-202 (2011).
Cheng et al. Light-triggered assembly of gold nanoparticles for photothermal therapy and photoacoustic imaging of tumors in vivo. Adv. Mater. 29, 1604894, Dec. 2016.
Chikkaraddy et al. Single-Molecule Strong Coupling at Room Temperature in Plasmonic Nanocavities. Nature 2016, 535, 127-130, (As Author manuscript, 10 pages).
Chiou et al. Massively parallel manipulation of single cells and microparticles using optical images. Nature 2005, 436(7049): 370-372.
Chou et al. DNA assembly of nanoparticle superstructures for controlled biological delivery and elimination. Nat. Nanotechnol. 9, 148-155 (2014), (As 8 page manuscript).
Ding et al. On-chip manipulation of single microparticles, cells, and organisms using surface acoustic waves. Proc. Natl. Acad. Sci. 2012, 109(28): 11105-11109.
Duhr et al. Why molecules move along a temperature gradient. Proc. Natl. Acad. Sci. 103, 19678-19682 (2006).
Edwards et al. Depletion-Mediated Potentials and Phase Behavior for Micelles, Macromolecules, Nanoparticles, and Hydrogel Particles. Langmuir 2012, 28(39): 13816-13823.
Erb et al. Magnetic assembly of colloidal superstructures with multipole symmetry. Nature 457, 999-1002 (2009).
Fan et al. Self-assembled plasmonic nanoparticle clusters. Science 328, 1135-1138 (2010).
Fang et al. Evolution of Light-Induced Vapor Generation at a Liquid-Immersed Metallic Nanoparticle. Nano Lett 2013, 13(4), 1736-1742, as 13 page Author manuscript.
Fazio et al. SERS Detection of Biomolecules at Physiological Ph via Aggregation of Gold Nanorods Mediated by Optical Forces and Plasmonic Heating. Sci. Rep. 2016, 6, 26952.
Feng et al. Re-entrant solidification in polymer-colloid mixtures as a consequence of competing entropic and enthalpic attractions. Nature Mater. 14, 61-65, Oct. 2014.
Friedrich et al. Surface Imaging Beyond the Diffraction Limit with Optically Trapped Spheres. Nat. Nanotechnol. 2015, 10, 1064-1069.
Fujii et al. "Fabrication and Placement of a Ring Structure of Nanoparticles by a Laser-Induced Micronanobubble on a Gold Surface." Langmuir, 2011, 27(14), 8605-8610.
Galatsis et al. Patterning and Templating for Nanoelectronics. Adv Mater 2010, 22(6), 769-778.
Garces-Chavez et al. Simultaneous Micromanipulation in Multiple Planes Using a Self-Reconstructing Light Beam. Nature 2002, 419, 145-147.
Garcia-Leis et al. Silver Nanostars with High SERS Performance. J. Phys. Chem. C 2013, 117, 7791-7795, Provided as manuscript, pp. A-F.
Gargiulo et al. Connecting Metallic Nanoparticles by Optical Printing. Nano Lett. 2016, 16, 1224-1229.
Geissler et al. Patterning: Principles and Some New Developments. Adv. Mater. 2004, 16, 1249-1269.
Gluckstad, J. Microfluidics: Sorting Particles with Light. Nat. Mater. 2004, 3, 9-10.
Gosse et al. Magnetic Tweezers: Micromanipulation and Force Measurement at the Molecular Level. Biophys. J. 2002, 82(6): 3314-3329.
Govorov et al. Generating heat with metal nanoparticles. Nano Today 2, 30-38 (2007).
Grier DG. A Revolution in Optical Manipulation. Nature 2003, 424, 810-816.
Grigorenko et al. Nanometric Optical Tweezers Based on Nanostructured Substrates. Nat. Photonics 2008, 2, 365-370.
Gu et al. Facile one-pot synthesis of bifunctional heterodimers of nanoparticles: A conjugate of quantum dot and magnetic nanoparticles. J Am Chem Soc 2004, 126(18): 5664-5665.
Gu et al. Tweezing and Manipulating Micro- and Nanoparticles by Optical Nonlinear Endoscopy. Light Sci Appl 2014, 3, e126, (6 pages).
Guck et al. The Optical Stretcher: A Novel Laser Tool to Micromanipulate Cells. Biophys. J. 2001, 81, 767-784.
Guffey et al. All-Optical Patterning of Au Nanoparticles on Surfaces Using Optical Traps. Nano Lett. 2010, 10, 4302-4308.
Guo et al. Modular assembly of superstructures from polyphenol-functionalized building blocks. Nat. Nanotechnol. 11, 1105-1111 (2016), +1 page of methods.
Halas et al. Plasmons in Strongly Coupled Metallic Nanostructures. Chem. Rev. 2011, 111, 3913-3961.
Hansen et al. Expanding the optical trapping range of gold nanoparticles. Nano Lett. 5, 1937-1942 (2005).
Hansen et al. Nano-Optical Conveyor Belt, Part I: Theory. Nano Lett. 2014, 14(6): 2965-2970.
Hashmi et al. Oscillating bubbles: a versatile tool for lab on a chip application. Lab Chip 2012, 12, 4216-4227.

(56) References Cited

OTHER PUBLICATIONS

Haynes et al. Nanosphere Lithography: A versatile nanofabrication tool for studies of size-dependent nanoparticle optics. J. Phys. Chem. B 2001, 105, 5599-5611.
Helden et al. Direct measurement of thermophoretic forces. Soft Matter 11, 2379-2386 (2015).
Hoang et al. Ultrafast Room-Temperature Single Photon Emission from Quantum Dots Coupled to Plasmonic Nanocavities. Nano Lett 16(1), 270-275, Nov. 2015.
Hoang et al. Ultrafast Spontaneous Emission Source Using Plasmonic Nanoantennas. Nat. Commun. 2015, 6, 8788 (1-7).
Hu et al. Hydrogel microrobots actuated by optically generated vapour bubbles. Lab Chip 2012, 12, 3821-3826.
Huang et al. Optoelectronic tweezers integrated with lens-free holographic microscopy for wide-field interactive cell and particle manipulation on a chip. Lab Chip 2013, 13, 2278-2284, Provided as Author manuscript, 15 pages.
Huang et al. Microfluidic integrated optoelectronic tweezers for single-cell preparation and analysis. Lab Chip 2013, 13, 3721-3727.
Huang et al. Reversal of the optical force in a plasmonic trap. Opt. Lett. 33, 3001-3003 (2008).
Hulteen et al. Nanosphere Lithography: Size-Tunable Silver Nanoparticle and Surface Cluster Arrays. J. Phys. Chem. B 1999, 103, 3854-3863.
Huo et al. Beam Pen Lithography. Nat. Nanotechnol. 2010, 5, 637-640.
Huo et al. Polymer pen lithography. Science 2008, 321, 1658-1660.
Ilic et al. Exploiting Optical Asymmetry for Controlled Guiding of Particles with Light. ACS Photonics 2016, 3, 197-202.
Iracki et al. Charged Micelle Depletion Attraction and Interfacial Colloidal Phase Behavior. Langmuir 2010, 26(24): 18710-18717.
Ito et al. Pushing the limits of lithography. Nature 2000, 406, 1027-1031.
Jamshidi et al. NanoPen: Dynamic, Low-Power, and Light-Actuated Patterning of Nanoparticles. Nano Lett. 2009, 9, 2921-2925, Provided as Author manuscript 10 pages.
Jensen et al. Optical trapping and two-photon excitation of colloidal quantum dots using bowtie apertures. ACS Photonics, 2016, 3(3), 423-427.
Jin et al. Photoinduced Conversion of Silver Nanospheres to Nanoprisms. Science 2001, 294, 1901-1903.
Jones et al. DNA-nanoparticle superlattices formed from anisotropic building blocks. Nature Mater. 9, 913-917 (2010), With supplemental information, pp. 1-44.
Juan et al. Plasmon nano-optical tweezers. Nat. Photonics 2011, 5(6): 349-356.
Juan et al. Self-induced back-action optical trapping of dielectric nanoparticles. Nat. Phys. 5, 915-919 (2009).
Kang et al. "Low-power nano-optical vortex trapping via plasmonic diabolo nanoantennas." Nature Comm., 2011, 2, 1-6, #1592.
Kim et al. Full-colour quantum dot displays fabricated by transfer printing. Nat Photon 2011, 5(3), 176-182.
Kim et al. High-Resolution Patterns of Quantum Dots Formed by Electrohydrodynamic Jet Printing for Light-Emitting Diodes. Nano Lett 2015, 15(2), 969-973.
Kim et al. Multilayer Transfer Printing for Pixelated, Multicolor Quantum Dot Light-Emitting Diodes. ACS Nano 2016, 10(5), 4920-4925.
Kim et al. Transmutable nanoparticles with reconfigurable surface ligands. Science 351, 579-582 (2016).
Kimura et al. Photoinduced fluorescence enhancement in CdSe/ZnS quantum dot submonolayers sandwiched between insulating layers: Influence of dot proximity. J Phys Chem B 2004, 108(35), 13258-13264.
Klajn et al. Light-Controlled Self-Assembly of Reversible and Irreversible Nanoparticle Suprastructures. Proc. Natl. Acad. Sci. 2007, 104, 10305-10309.
Konstantatos et al. Ultrasensitive solution-cast quantum dot photodetectors. Nature 2006, 442(7099), 180-183.
Kraft et al. Surface roughness directed self-assembly of patchy particles into colloidal micelles. Proc. Natl. Acad. Sci. 10787-10792 (2012), vol. 102, No. 27.
Kramer et al. Plasmonic properties of silicon nanocrystals doped with boron and phosphorus. Nano Lett. 15, 5597-5603 (2015).
Kreysing et al. The Optical Cell Rotator. Opt. Express 2008, 16, 16984-16992.
Kundu et al. Light-Controlled Self-Assembly of Non-Photoresponsive Nanoparticles. Nat. Chem 2015, 7, 646-652.
Kyrsting et al. Heat Profiling of Three-Dimensionally Optically Trapped Gold Nanoparticles Using Vesicle Cargo Release. Nano Lett. 2011, 11, 888-892, Provided as pp. A-E.
Lan et al. Charge-extraction strategies for colloidal quantum dot photovoltaics. Nat Mater 2014, 13(3), 233-240.
Lan et al. Ordering, positioning and uniformity of quantum dot arrays. Nano Today 2012, 7(2), 94-123.
Lehmuskero et al. Laser trapping of colloidal metal nanoparticles. ACS Nano 9, 3453-3469 (2015).
Leunissen et al. Ionic colloidal crystals of oppositely charged particles. Nature 437, 235-240 (2005).
Li et al. Absorption spectroscopy of single optically trapped gold nanorods. Nano Lett. 15, 7731-7735 (2015).
Li et al. Dimers of Silver Nanospheres: Facile Synthesis and Their Use as Hot Spots for Surface-Enhanced Raman Scattering. Nano Lett. 2009, 9, 485-490, Author manuscript, 12 pages.
Li et al. Ph-Programmable Self-Assembly of Plasmonic Nanoparticles: Hydrophobic Interaction Versus Electrostatic Repulsion. Nanoscale 7, 956-964, Nov. 2014, as manuscript, 10 pages.
Li et al. Reversible Plasmonic Circular Dichroism of Au Nanorod and DNA Assemblies. J. Am. Chem. Soc. 2012, 134, 3322-3325.
Lim et al. Highly Uniform and Reproducible Surface-Enhanced Raman Scattering from DNA-Tailorable Nanoparticles with 1-nm Interior Gap. Nat. Nanotechnol. 2011, 6, 452-460.
Lin et al. Bubble-Pen Lithography. Nano Lett 2016, 16(1), 701 708, as Author manuscript 17 pages.
Lin et al. Light-directed reversible assembly of plasmonic nanoparticles using plasmon-enhanced thermophoresis. ACS Nano 10, 9659-9668 (2016), (Provided as pp. A-J).
Liu et al. Diamond family of nanoparticle superlattices. Science 351, 582-586 (2016), Author manuscript 12 pages.
Liu et al. Formation and dissolution of microbubbles on highly-ordered plasmonic nanopillar arrays. Sci Rep 2015, 5, 18515, (1-9).
Liu et al. Nanoantenna-enhanced gas sensing in a single tailored nanofocus. Nat. Mater. 2011, 10, 631-636.
Liu et al. Thermoresponsive Assembly of Charged Gold Nanoparticles and Their Reversible Tuning of Plasmon Coupling. Angew. Chem. Int. Ed. 2012, 51, 6373-6377.
Lohse et al. Surface nanobubbles and nanodroplets. Rev Mod Phys 2015, 87(3), 981-1035, Provided as manuscript, pp. 1-60.
Lu et al. Synthesis and Self-Assembly of Au—SiO2 Core-Shell Colloids. Nano Lett. 2002, 2, 785-788.
Macfarlane et al. Nanoparticle superlattice engineering with DNA. Science 334, 204-208 (2011).
Manoharan VN. Colloidal matter: Packing, geometry, and entropy. Science 349, (2015), #1253751 (26 pages).
Markman et al. Photon-Counting Security Tagging and Verification Using Optically Encoded QR Codes. IEEE Photonics J 2014, 6(1), #6800609.
Mashford et al. High-efficiency quantum-dot light-emitting devices with enhanced charge injection. Nat Photon 2013, 7(5), 407-412.
McHale et al. Bubble nucleation characteristics in pool boiling of a wetting liquid on smooth and rough surfaces. Int J Multiphas Flow 2010, 36(4), 249-260.
McLellan et al. The SERS Activity of a Supported Ag Nanocube Strongly Depends on Its Orientation Relative to Laser Polarization. Nano Lett. 2007, 7, 1013-1017.
Medintz et al. Quantum dot bioconjugates for imaging, labelling and sensing. Nat Mater 2005, 4(6), 435-446.
Medintz et al. Self-assembled nanoscale biosensors based on quantum dot FRET donors. Nat Mater 2003, 2(9), 630-638.

(56) References Cited

OTHER PUBLICATIONS

Messina et al. Manipulation and Raman Spectroscopy with Optically Trapped Metal Nanoparticles Obtained by Pulsed Laser Ablation in Liquids. J. Phys. Chem. C 2011, 115, 5115-5122, (Provided as manuscript).
Min et al. Focused plasmonic trapping of metallic particles. Nat Commun 2013, 4, 3891 (1-7).
Ndukaife et al. Long-range and rapid transport of individual nano-objects by a hybrid electrothermoplasmonic nanotweezer. Nat Nano 2016, 11(1): 53-59.
Nedev et al. Optical Force Stamping Lithography. Nano Lett. 2011, 11, 5066-5070, Author manuscript, 9 pages.
Neumann et al. Solar Vapor Generation Enabled by Nanoparticles. ACS Nano 2013, 7(1), 42-49.
Nie et al. Probing Single Molecules and Single Nanoparticles by Surface-Enhanced Raman Scattering. Science 1997, 275, 1102-1106.
O'Brien, et al. Programming colloidal crystal habit with anisotropic nanoparticle building blocks and DNA bonds. J. Am. Chem. Soc. 138 14562-14565 (2016).
Ohlinger et al. Optothermal escape of plasmonically coupled silver nanoparticles from a three-dimensional optical trap. Nano Lett. 11, 1770-1774 (2011), Author manuscript 10 pages.
Ozel et al. Coaxial Lithography. Nat. Nanotechnol. 2015, 10, 319-324.
Patra et al. Plasmofluidic Single-Molecule Surface-Enhanced Raman Scattering from Dynamic Assembly of Plasmonic Nanoparticles. Nat. Commun. 2014, 5, 4357, (1-8).
Patra et al. Single-Molecule Surface-Enhanced Raman Scattering Sensitivity of Ag-Core Au-Shell Nanoparticles: Revealed by Bi-Analyte Method. J. Phys. Chem. Lett. 2013, 4, 1167-1171.
Pauzauskie et al. Optical trapping and integration of semiconductor nanowire assemblies in water. Nat. Mater. 2006, 5(2): 97-101.
Pelton et al. Optical trapping and alignment of single gold nanorods by using plasmon resonances. Opt. Lett. 31, 2075-2077 (2006), Proc. of SPIE, vol. 6323; 63230E (1-9).
Perry et al. Real-space studies of the structure and dynamics of self-assembled colloidal clusters, Faraday Discuss. 159, pp. 211-239 (2012).
Perry et al. Two-Dimensional Clusters of Colloidal Spheres: Ground States, Excited States, and Structural Rearrangements, Phys. Rev. Lett. 114, 228301 (2015), pp. 1-13 (w/ supp. mat.).
Piazza et al. Thermophoresis in colloidal suspensions. J. Phys.: Condens. Matter 20, 153102 (2008), 18 pages.
Pietryga et al. Spectroscopic and Device Aspects of Nanocrystal Quantum Dots. Chem Rev 2016, 116(18), 10513-10622.
Pignolet et al. Electrodeposition of latex particles in the presence of surfactant: Investigation of deposit morphology. J Colloid Interface Sci 2010, 349(1): 41-48.
Pinchuk et al. Size-dependent Hamaker constants for silver and gold nanoparticles. Proc. of SPIE 9549, Physical Chemistry of Interfaces and Nanomaterials XIV, 95491J, 2015, (1-7 pages).
Piner et al. "Dip-Pen" Nanolithography. Science 1999, 283, 661-663.
Prieve et al. Simplified predictions of Hamaker constants from Lifshitz theory. J Colloid Interface Sci 1988, 125(1): 1-13.
Prikulis et al. Optical spectroscopy of single trapped metal nanoparticles in solution. Nano Lett. 4, 115-118 (2004).
Putnam et al. Temperature Dependence of Thermodiffusion in Aqueous Suspensions of Charged Nanoparticles. Langmuir 2007, 23, 9221-9228.
Rabani et al. Drying-mediated self-assembly of nanoparticles. Nature 2003, 426, 271-274.
Rajeeva et al. Regioselective Localization and Tracking of Biomolecules on Single Gold Nanoparticles. Adv Sci 2015, 2(11), 1500232 (1-8).
Regmi et al. All-dielectric silicon nanogap antennas to enhance the fluorescence of single molecules. Nano Lett. 16, 5143-5151 (2016), Manuscript pp. A-I + supp. mat. 12 pages.
Reichl et al. Why charged molecules move across a temperature gradient: The role of electric fields. Phys. Rev. Lett. 112, 198101 (2014), (1-5 pages).
Righini et al. Parallel and selective trapping in a patterned plasmonic landscape. Nat Phys 2007, 3(7): 477-480.
Roelants et al. Parameters affecting aqueous micelles of CTAC, TTAC, and DTAC probed by fluorescence quenching. Langmuir 1987, 3(2): 209-214.
Roxworthy et al. Application of Plasmonic Bowtie Nanoantenna Arrays for Optical Trapping, Stacking, and Sorting. Nano Lett. 2012, 12, 796-801.
Roy et al. "Self-Assembly of Mesoscopic Materials to Form Controlled and Continuous Patterns by Thermo-Optically Manipulated Laser Induced Microbubbles." Langmuir, 2013 29(47), 14733-14742.
Ruijgrok et al. Brownian fluctuations and heating of an optically aligned gold nanorod. Phys. Rev. Lett. 107, 037401 (2011), (4 pages).
Rycenga et al. Controlling the synthesis and assembly of silver nanostructures for plasmonic applications. Chem. Rev. 2011, 111, 3669-3712, Author manuscript, 92 pages.
Salaita et al. Nat. Applications of dip-pen nanolithography. Nature Nanotechnol. 2007, 2, 145-155.
Sánchez-Iglesias et al. Hydrophobic interactions modulate self-assembly of nanoparticles. ACS Nano 6, 11059-11065 (2012).
Scarabelli et al. Monodisperse Gold Nanotriangles: Size Control, Large-Scale Self-Assembly, and Performance in Surface-Enhanced Raman Scattering. ACS Nano 2014, 8, 5833-5842.
Selhuber-Unkel et al. Quantitative optical trapping of single gold nanorods. Nano Lett. 8, 2998-3003 (2008).
Serra et al. Curvature-Driven, One-Step Assembly of Reconfigurable Smectic Liquid Crystal "Compound Eye" Lenses. Adv. Opt. Mater. 2015, 3, 1287-1292, as Manuscript + supp. mat.; 17 pages.
Shams Mousavi et al. Band-Edge Bilayer Plasmonic Nanostructure for Surface Enhanced Raman Spectroscopy. ACS Photonics 2015, 2, 1546-1551, (Manuscript, 31 pages).
Shao et al. Gold nanorod rotary motors driven by resonant light scattering. ACS Nano 9, 12542-12551 (2015).
Si et al. Reversible Self-Assembly of Carboxylated Peptide-Functionalized Gold Nanoparticles Driven by Metal-Ion Coordination. ChemPhysChem 2008, 9, 1578-1584.
Srivastava et al. Light-controlled self-assembly of semiconductor nanoparticles into twisted ribbons. Science 327, 1355-1359 (2010).
Stamplecoskie et al. Optimal Size of Silver Nanoparticles for Surface-Enhanced Raman Spectroscopy. J. Phys. Chem. C 2011, 115, 1403-1409.
Stetciura et al. Composite SERS-Based Satellites Navigated by Optical Tweezers for Single Cell Analysis. Analyst 2015, 140, 4981-4986.
Su et al. Reversible Voltage-Induced Assembly of Au Nanoparticles at Liquid-Liquid Interfaces. J. Am. Chem. Soc. 2004, 126, 915-919, (Online Dec. 30, 2003).
Sun et al. A haptic digital tool to assist the design, planning and manufacture of micro- and nanostructures. Proc Inst Mech Eng E J Process Mech Eng 2015, 229(4), 290-298, Provided as manuscript 15 pages.
Svedberg et al. Creating Hot Nanoparticle Pairs for Surface-Enhanced Raman Spectroscopy through Optical Manipulation. Nano Lett. 2006, 6, 2639-2641.
Taladriz-Blanco et al. Reversible Assembly of Metal Nanoparticles Induced by Penicillamine. Dynamic Formation of SERS Hot Spots. J. Mater. Chem. 2011, 21, 16880-16887.
Tanaka et al. Nanostructured potential of optical trapping using a plasmonic nanoblock pair. Nano Lett. 13, 2146-2150 (2013).
Tao et al. Tunable plasmonic lattices of silver nanocrystals. Nat. Nanotechnol. 2007, 2, 435-440, (Provided as manuscript, 22 pages).
Thamdrup et al. Light-Induced Local Heating for Thermophoretic Manipulation of DNA in Polymer Micro- and Nanochannels. Nano Lett. 10, 826-832 (2010).
Tong et al. Alignment, rotation, and spinning of single plasmonic nanoparticles and nanowires using polarization dependent optical forces. Nano Lett. 10, 268-273 (2010).

(56) References Cited

OTHER PUBLICATIONS

Tong et al. Optical Aggregation of Metal Nanoparticles in a Microfluidic Channel for Surface-Enhanced Raman Scattering Analysis. Lab Chip 2009, 9, 193-195.
Tong et al. Plasmon hybridization reveals the interaction between individual colloidal gold nanoparticles confined in an optical potential well. Nano Lett. 11, 4505-4508 (2011).
Tulpar et al. Decay Lengths of Double-Layer Forces in Solutions of Partly Associated Ions. Langmuir 2001, 17(26): 8451-8454.
Urban et al. Laser Printing Single Gold Nanoparticles. Nano Lett. 2010, 10, 4794-4798.
Vigolo et al. Thermophoresis and thermoelectricity in surfactant solutions. Langmuir 26, 7792-7801 (2010).
Wang et al. Plasmonic trapping with a gold nanopillar. ChemPhysChem 2012, 13, 2639-2648.
Wang et al. Microfluidic Sorting of Mammalian Cells by Optical Force Switching. Nat. Biotechnol. 2005, 23, 83-87.
Wang et al. Nanosphere Arrays with Controlled Sub-10-Nm Gaps as Surface-Enhanced Raman Spectroscopy Substrates. J. Am. Chem. Soc. 2005, 127, 14992-14993, + supplemental information pp. s1-s5.
Weinert et al. An Optical Conveyor for Molecules. Nano Lett. 2009, 9, 4264-4267.
Weinert et al. Observation of Slip Flow in Thermophoresis. Phys. Rev. Lett. 2008, 101, 168301, (1-4).
Willets et al. Localized surface plasmon resonance spectroscopy and sensing. Annual Review of Physical Chemistry, vol. 58, 2007, pp. 267-297.
Wilson et al. Scalable nano-particle assembly by efficient light-induced concentration and fusion. Opt. Express 2008, 16(22), 17276-17281.
Wood et al. Single cell trapping and DNA damage analysis using microwell arrays. Proc. Natl. Acad. Sci. 2010, 107, 10008-10013.
Wu et al. Bioinspired fabrication of high-quality 3D artificial compound eyes by voxel-modulation femtosecond laser writing for distortion-free wide-field-of-view imaging. Adv. Opt. Mater. 2014, 2, 751-758.
Wu MC. Optoelectronic tweezers. Nat. Photonics 2011, 5(6): 322-324.
Würger A. Hydrodynamic Boundary Effects on Thermophoresis of Confined Colloids. Phys. Rev. Lett. 2016, 116, 138302.
Würger A. Thermal non-equilibrium transport in colloids. Rep. Prog. Phys. 73, 126601 (2010), (2 copies provided, at least one as manuscript, pp. 1-38).
Würger A. Thermophoresis in Colloidal Suspensions Driven by Marangoni Forces. Phys. Rev. Lett. 2007, 98(13): 138301, (As manuscript; pp. 1-28).
Würger A. Transport in Charged Colloids Driven by Thermoelectricity. Phys. Rev. Lett. 2008, 101, 108302, (Provided as manuscript; 4 pages).
Xia et al. Template-assisted self-assembly of spherical colloids into complex and controllable structures. Adv. Funct. Mater. 2003, 13, 907-918.
Xia et al. One-dimensional nanostructures: synthesis, characterization, and applications. Adv. Mater. 2003, 15, 353-389.
Xie et al. Nanoscale and Single-Dot Patterning of Colloidal Quantum Dots. Nano Lett 2015, 15(11), 7481-7487.
Xie et al. Optoacoustic Tweezers: A Programmable, Localized Cell Concentrator Based on Opto-Thermally Generated, Acoustically Activated, Surface Bubbles. Lab Chip 2013, 13, 1772-1779.
Yan et al. Colloidal superstructures programmed into magnetic janus particles. Adv. Mater. 27, 874-879 (2015), (Available online 2014; 6 pages).
Yan et al. Controlling the position and orientation of single silver nanowires on a surface using structured optical fields. ACS Nano 6, 8144-8155 (2012).
Yan et al. Fabrication of a Material Assembly of Silver Nanoparticles Using the Phase Gradients of Optical Tweezers. Phys. Rev. Lett. 114, 143901 (2015), (pp. 1-5).
Yan et al. Reconfiguring active particles by electrostatic imbalance. Nature Mater. 15, 1095-1099 (2016). (6 pages).
Yan et al. Why single-beam optical tweezers trap gold nanowires in three dimensions. ACS Nano 7, 8794-8800 (2013).
Yang et al. Breakthroughs in Photonics 2014: Advances in Plasmonic Nanolasers. IEEE Photonics J 2015, 7(3).
Ye et al. Plasmonic Nanoclusters: Near Field Properties of the Fano Resonance Interrogated with SERS. Nano Lett. 2012, 12, 1660-1667.
Yeom et al. Chiral templating of self-assembling nanostructures by circularly polarized light. Nature Mater. 14, 66-72 (2015), (Author manuscript, 13 pages).
Yin et al. The chemistry of functional nanomaterials. Chem Soc Rev 2013, 42(7), 2484-2487.
Yoshikawa et al. Reversible Assembly of Gold Nanoparticles Confined in an Optical Microcage. Phys. Rev. E 2004, 70, 061406, (1-6).
Yu et al. Forming biocompatible and non-aggregated nanocrystals in water using amphiphilic polymers. J Am Chem Soc 2007, 129: 2871-2879, (As Manuscript, pp. A-I).
Zerrouki et al. Chiral colloidal clusters. Nature 455, 380-382 (2008), (As provided #2711, pp. 1-3).
Zhang et al. Directed self-assembly pathways of active colloidal clusters. Angew. Chem. Int. Ed. 55, 5166-5169 (2016).
Zhang et al. Living Cell Multi-lifetime Encoding Based on Lifetime-Tunable Lattice-Strained Quantum Dots. ACS Appl Mater Inter 2016, 8(21), 13187-13191.
Zhang et al. Toward design rules of directional janus colloidal assembly. Annu. Rev. Phys. Chem. 66, 581-600 (2015).
Zhang et al. Trapping and sensing 10 nm metal nanoparticles using plasmonic dipole antennas. Nano Lett. 10, 1006-1011 (2010).
Zhao et al. Theory and experiment on particle trapping and manipulation via optothermally generated bubbles. Lab Chip 2014, 14, 384-391.
Zheng et al. Nano-Optical Conveyor Belt, Part II: Demonstration of Handoff Between Near-Field Optical Traps. Nano Lett. 14, 2971-2976 (2014).
Zhong et al. Trapping Red Blood Cells in Living Animals Using Optical Tweezers. Nat. Commun. 2013, 4, 2768, (1-7).

\* cited by examiner

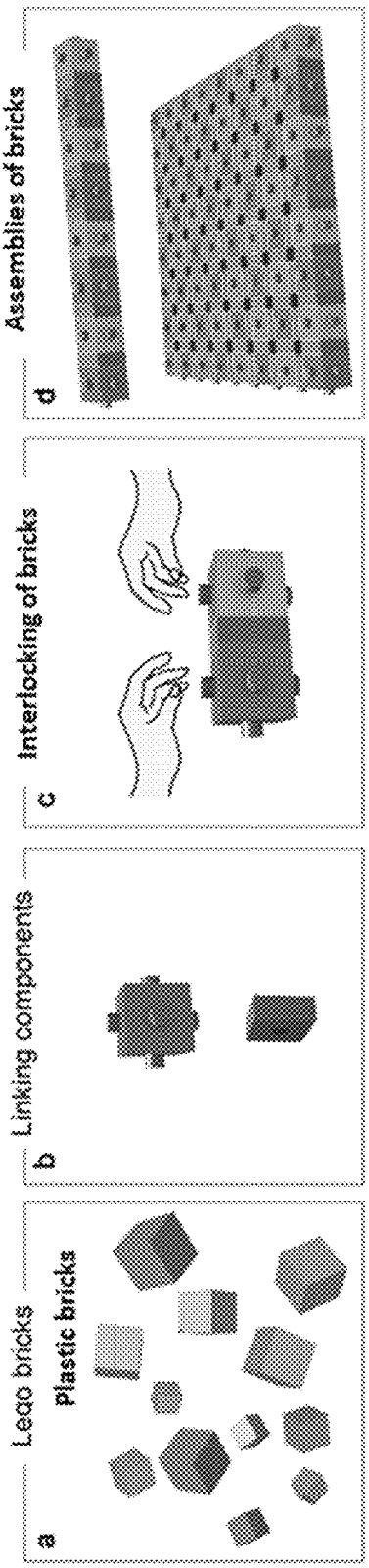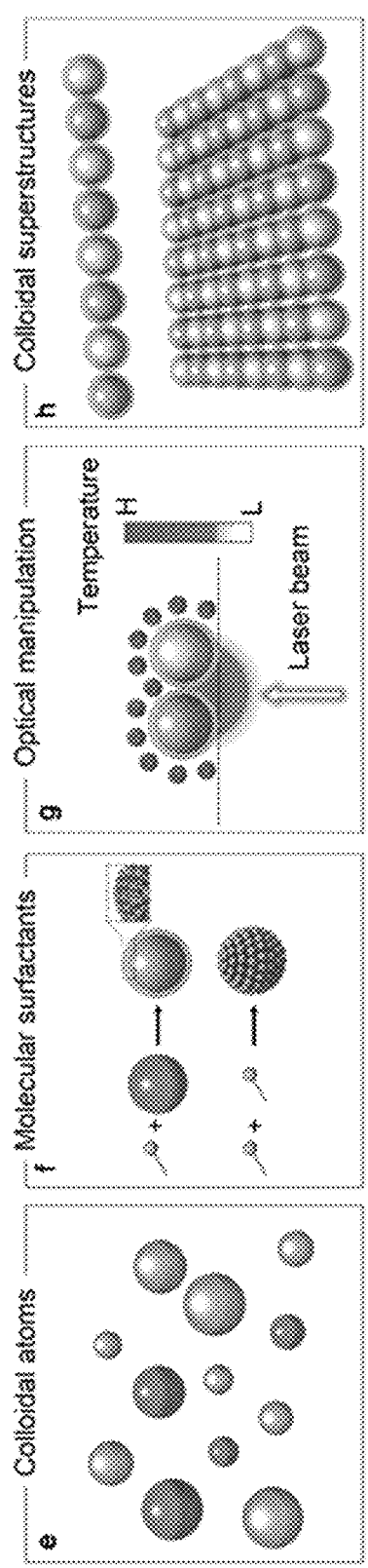

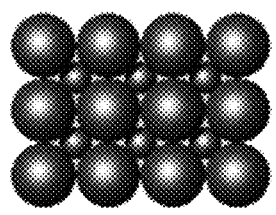
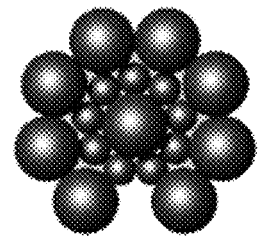
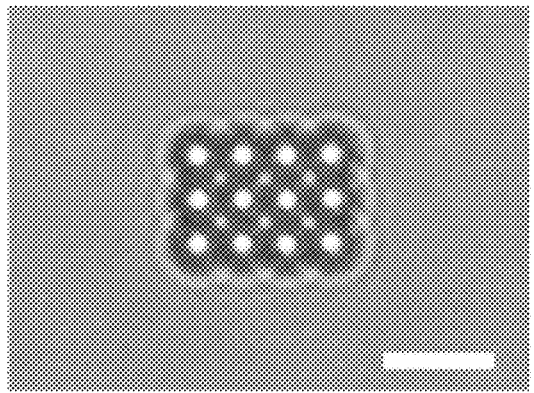
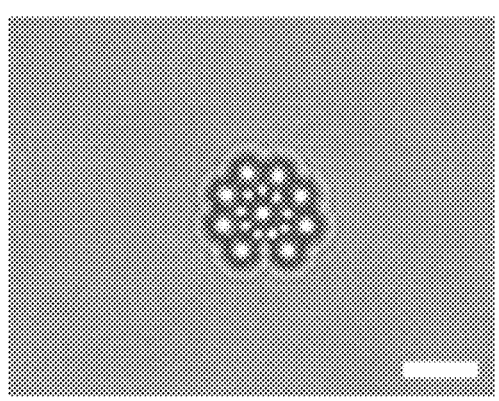
FIG. 43
FIG. 44
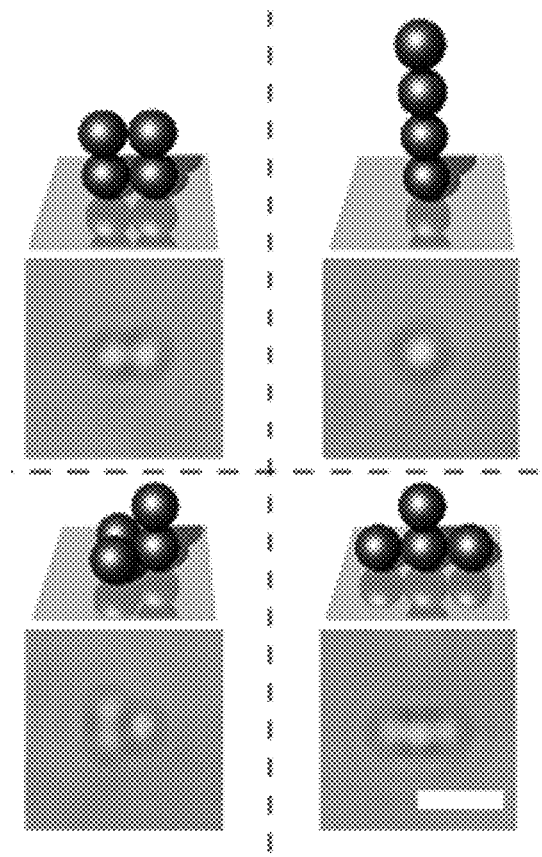
FIG. 45

METHODS AND SYSTEMS FOR ASSEMBLY OF PARTICLE SUPERSTRUCTURES

CROSS-REFERENCE TO RELATED APPLICATIONS

This application claims the benefit of priority to U.S. Provisional Application 62/462,581 filed Feb. 23, 2017, which is hereby incorporated herein by reference in its entirety.

BACKGROUND

Chemically synthesized colloidal particles of various materials, shapes and sizes exhibit unique electrical, optical and magnetic properties that are precisely tailorable down to the atomic scale. Taking the view that these colloidal particles can, to a certain extent, mimic atoms, researchers have been exploring the assembly of these so called colloidal "atoms" into complex structures, known as colloidal matter, to gain insights into general questions of how matter organizes itself, which are fundamental to materials science, chemistry, physics, and even life sciences. The colloidal matter also exhibits unique collective behavior beyond what occurs at the atomic scale, enabling new functions and devices (Manoharan V N. *Science* 2015, 349; Fan J A et al. *Science* 2010, 328, 1135-1138). Despite tremendous progress in directed and self-assembly, a truly versatile assembly technique without specific functionalization of the colloidal particles is still needed. The methods and systems discussed herein addresses these and other needs.

SUMMARY

In accordance with the purposes of the disclosed systems and methods, as embodied and broadly described herein, the disclosed subject matter relates to systems and methods for optothermal particle control. In some example, the disclosed subject matter relates to systems and methods for assembling colloidal matter (e.g., assembling particle superstructures) using optothermal particle control.

Additional advantages of the disclosed systems and methods will be set forth in part in the description which follows, and in part will be obvious from the description. The advantages of the disclosed systems and methods will be realized and attained by means of the elements and combinations particularly pointed out in the appended claims. It is to be understood that both the foregoing general description and the following detailed description are exemplary and explanatory only and are not restrictive of the disclosed systems and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

FIG. 8a-FIG. 8d are schematic illustrations of the macro scale modular brick assembly process. The modular bricks are the basic unit or building blocks (FIG. 8a). Locking components (FIG. 8b) are used to assemble and bond the bricks (FIG. 8c) to build various assemblies (FIG. 8d).

FIG. 8e-FIG. 8h are schematic illustrations of the concept of the modular brick like construction method for assembling colloidal particles into colloidal matter. FIG. 8e shows a dispersion of colloidal particles in solvents. FIG. 8f shows how CTAC surfactants enable the versatile manipulation and bonding of the colloidal particles. FIG. 8g shows the manipulation of the colloidal particles with the light-directed dynamic temperature field, and bonding of the closely positioned colloidal particles with depletion attraction. FIG. 8h shows the construction of the colloidal particles into 1D and 2D assemblies.

FIG. 43 shows a schematic illustration (top panel) and bright-field optical image (bottom panel) of a 2D hybrid square assembly of 2 μm and 0.96 μm polystyrene beads. Scale bar: 5 μm.

FIG. 44 shows a schematic illustration (top panel) and bright-field optical image (bottom panel) of a 2D hybrid assembly of double-layers "Saturn-ring" structure with 2 μm and 0.96 μm polystyrene beads. Scale bar: 5 μm.

FIG. 45 shows a schematic illustrations and bright-field optical images of a 3D assembly and manipulation of four 500 nm polystyrene beads. Scale bar: 2 μm.

DETAILED DESCRIPTION

Figure 1:
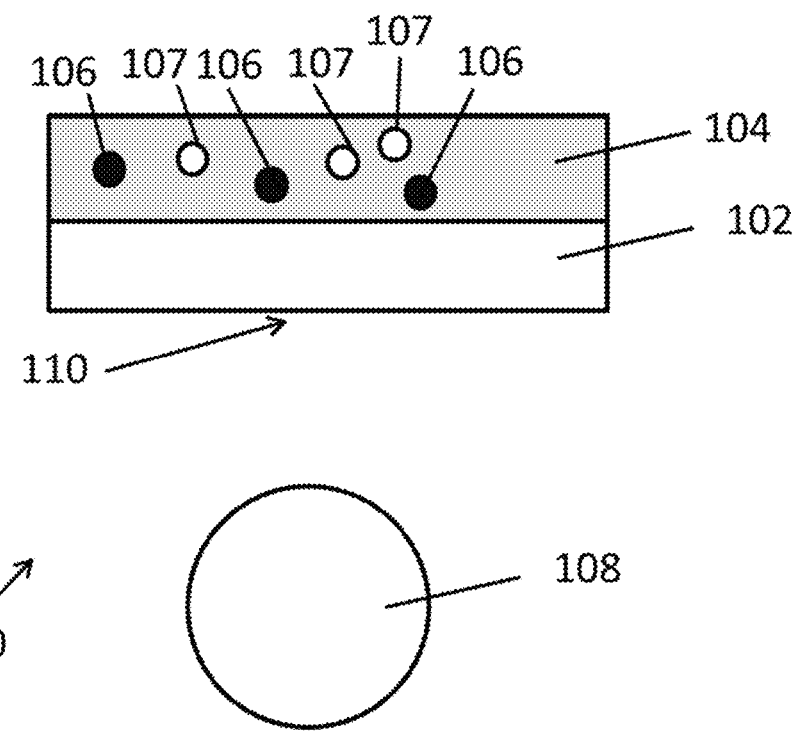
FIG. 1 is a schematic of an exemplary system as disclosed herein.

The systems and methods described herein may be understood more readily by reference to the following detailed description of specific aspects of the disclosed subject matter and the Examples included therein.

Before the present systems and methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Disclosed herein are systems and methods, for example, for dynamically controlling colloidal particles using thermally controlled confinement regions. In some examples, the methods and systems can comprise locally exposing a substrate to an optical signal according to a desired pattern to thereby confine the colloidal particles within said pattern. In some examples, the methods and systems can comprise assembling colloidal matter (e.g., particle superstructures) using optothermal particle control.

Disclosed herein are methods comprising illuminating a first location of an optothermal substrate with electromagnetic radiation. As used herein, "a first location" and "the first location" are meant to include any number of locations in any arrangement on the optothermal substrate. Thus, for example "a first location" includes one or more first locations. In some embodiments, the first location can comprise a plurality of locations. In some embodiments, the first locations can comprise a plurality of locations arranged in an ordered array.

In some examples, the power density of the electromagnetic radiation can be 0.2 mW/μm$^2$ or less (e.g., 0.19 mW/μm$^2$ or less, 0.18 mW/μm$^2$ or less, 0.17 mW/μm$^2$ or less, 0.16 mW/μm$^2$ or less, 0.15 mW/μm$^2$ or less, 0.14 mW/μm$^2$ or less, 0.13 mW/μm$^2$ or less, 0.12 mW/μm$^2$ or less, 0.11 mW/μm$^2$ or less, 0.1 mW/μm$^2$ or less, 0.09 mW/μm$^2$ or less, 0.08 mW/μm$^2$ or less, 0.07 mW/μm$^2$ or less, 0.06 mW/μm$^2$ or less, 0.05 mW/μm$^2$ or less, 0.04 mW/μm$^2$ or less, 0.03 mW/μm$^2$ or less, 0.02 mW/μm$^2$ or less, 0.01 mW/μm$^2$ or less, 0.009 mW/μm$^2$ or less, 0.008 mW/μm$^2$ or less, 0.007 mW/μm$^2$ or less, or 0.006 mW/μm$^2$ or less). In some examples, the power density of the electromagnetic radiation can be 0.005 mW/μm$^2$ or more (e.g., 0.006 mW/μm$^2$ or more, 0.007 mW/μm$^2$ or more, 0.008 mW/μm$^2$ or more, 0.009 mW/μm$^2$ or more, 0.01 mW/μm$^2$ or more, 0.02 mW/μm$^2$ or more, 0.03 mW/μm$^2$ or more, 0.04 mW/μm$^2$ or more, 0.05 mW/μm$^2$ or more, 0.06 mW/μm$^2$ or more, 0.07 mW/μm$^2$ or more, 0.08 mW/μm$^2$ or more, 0.09 mW/μm$^2$ or more, 0.1 mW/μm$^2$ or more, 0.11 mW/μm$^2$ or more, 0.12 mW/μm$^2$ or more, 0.13 mW/μm$^2$ or more, 0.14 mW/μm$^2$ or more, 0.15 mW/μm$^2$ or more, 0.16 mW/μm$^2$ or more, 0.17 mW/μm$^2$ or more, 0.18 mW/μm$^2$ or more, or 0.19 mW/μm$^2$ or more). The power density of the electromagnetic radiation can range from any of the minimum values described above to any of the maximum values described above. For example, the power density of the electromagnetic radiation can range from 0.005 mW/μm$^2$ to 0.2 mW/μm$^2$ (e.g., from 0.005 mW/μm$^2$ to 0.1 mW/μm$^2$, from 0.1 mW/μm$^2$ to 0.2 mW/μm$^2$, from 0.005 mW/μm$^2$ to 0.05 mW/μm$^2$, from 0.05 mW/μm$^2$ to 0.1 mW/μm$^2$, from 0.1 mW/μm$^2$ to 0.15 mW/μm$^2$, from 0.15 mW/μm$^2$ to 0.2 mW/μm$^2$, or from 0.01 mW/μm$^2$ to 0.15 mW/μm$^2$).

The electromagnetic radiation can, for example, be provided by a light source. The light source can be any type of light source. Examples of suitable light sources include natural light sources (e.g., sunlight) and artificial light sources (e.g., incandescent light bulbs, light emitting diodes, gas discharge lamps, arc lamps, lasers, etc.). In some examples, the light source is a laser.

In some examples, the light source is configured to illuminate a mirror, the mirror being configured to reflect the electromagnetic radiation from the light source to illuminate the first location of the optothermal substrate. In some examples, the mirror can comprise a plurality of mirrors, such as an array of micromirrors (e.g., a digital micromirror device).

As used herein, an optothermal substrate is any substrate that can convert at least a portion of the electromagnetic radiation into thermal energy. For example, the optothermal substrate can comprise a material with a high absorption efficiency at one or more wavelengths that overlaps with at least a portion of the electromagnetic radiation. The optothermal substrate can, for example, comprise a plasmonic substrate, a metal film, or a combination thereof.

The plasmonic substrate can, in some examples, comprise a plurality of plasmonic particles, a film permeated by a plurality of plasmonic nanoholes, or a combination thereof. In some examples, the electromagnetic radiation comprises a wavelength that overlaps with at least a portion of the plasmon resonance energy of the plasmonic substrate.

The plasmonic substrate can, in some examples, comprise a plurality of plasmonic particles. In some examples, the plurality of plasmonic particles can comprise a plurality of metal particles. The plurality of metal particles can, for example, comprise a metal selected from the group consisting of Au, Ag, Pd, Cu, Cr, Al, and combinations thereof. In some examples, the plurality of plasmonic particles can comprise a plurality of gold particles, a plurality of silver particles, or a combination thereof.

The plurality of plasmonic particles can have an average particle size. "Average particle size" and "mean particle size" are used interchangeably herein, and generally refer to the statistical mean particle size of the particles in a population of particles. For example, the average particle size for a plurality of particles with a substantially spherical shape can comprise the average diameter of the plurality of particles. For a particle with a substantially spherical shape, the diameter of a particle can refer, for example, to the hydrodynamic diameter. As used herein, the hydrodynamic diameter of a particle can refer to the largest linear distance between two points on the surface of the particle. For an anisotropic particle, the average particle size can refer to, for example, the average maximum dimension of the particle (e.g., the length of a rod shaped particle, the diagonal of a cube shape particle, the bisector of a triangular shaped particle, etc.) For an anisotropic particle, the average particle size can refer to, for example, the hydrodynamic size of the particle. Mean particle size can be measured using methods known in the art, such as evaluation by scanning electron microscopy, transmission electron microscopy, and/or dynamic light scattering.

The plurality of plasmonic particles have, for example, an average particle size of 10 nm or more (e.g., 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, 80 nm or more, 85 nm or more, 90 nm or more, 95 nm or more, 100 nm or more, 110 nm or more, 120 nm or more, 130 nm or more, 140 nm or more, 150 nm or more, 160 nm or more, 170 nm or more, 180 nm or more, 190 nm or more, 200 nm or more, 210 nm or more, 220 nm or more, 230 nm or more, 240 nm or more, 250 nm or more, 275 nm or more, 300 nm or more, 325 nm or more, 350 nm or more, 375 nm or more, 400 nm or more, 425 nm or more, 450 nm or more, or 475 nm or more).

In some examples, the plurality of plasmonic particles can have an average particle size of 500 nm or less (e.g., 475 nm or less, 450 nm or less, 425 nm or less, 400 nm or less, 375 nm or less, 350 nm or less, 325 nm or less, 300 nm or less, 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, 140 nm or less, 130 nm or less, 120 nm or less, 110 nm or less, 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, or 15 nm or less).

The average particle size of the plurality of plasmonic particles can range from any of the minimum values described above to any of the maximum values described above. For example, the plurality of plasmonic particles can have an average particle size of from 10 nm to 500 nm (e.g., from 10 nm to 250 nm, from 250 nm to 500 nm, from 10 nm to 100 nm, from 100 nm to 200 nm, from 200 nm to 300 nm, from 300 nm to 400 nm, from 400 nm to 500 nm, or from 10 nm to 300 nm).

In some examples, the plurality of plasmonic particles can be substantially monodisperse. "Monodisperse" and "homogeneous size distribution," as used herein, and generally describe a population of particles where all of the particles are the same or nearly the same size. As used herein, a monodisperse distribution refers to particle distributions in which 80% of the distribution (e.g., 85% of the distribution, 90% of the distribution, or 95% of the distribution) lies within 25% of the mean particle size (e.g., within 20% of the mean particle size, within 15% of the mean particle size, within 10% of the mean particle size, or within 5% of the mean particle size).

The plurality of plasmonic particles can comprise particles of any shape (e.g., a sphere, a rod, a quadrilateral, an ellipse, a triangle, a polygon, etc.). In some examples, the plurality of plasmonic particles can have an isotropic shape. In some examples, the plurality of plasmonic particles can have an anisotropic shape. In some examples, the plurality of plasmonic particles are substantially spherical.

In some examples, each plasmonic particle within the plurality of plasmonic particles on the substrate is separated from its neighboring plasmonic particles by an average distance of 3 nm or more (e.g., 4 nm or more, 5 nm or more, 6 nm or more, 7 nm or more, 8 nm or more, 9 nm or more, 10 nm or more, 11 nm or more, 12 nm or more, 13 nm or more, 14 nm or more, 15 nm or more, 16 nm or more, 17 nm or more, 18 nm or more, 19 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, 80 nm or more, 85 nm or more, 90 nm or more, 95 nm or more, 100 nm or more, 125 nm or more, 150 nm or more, 175 nm or more, 200 nm or more, 225 nm or more, 250 nm or more, 275 nm or more, 300 nm or more, 325 nm or more, 350 nm or more, 375 nm or more, 400 nm or more, 425 nm or more, 450 nm or more, 475 nm or more, 500 nm or more, 550 nm or more, 600 nm or more, 650 nm or more, 700 nm or more, 750 nm or more, 800 nm or more, 850 nm or more, 900 nm or more, 950 nm or more, 1000 nm or more, 1100 nm or more, 1200 nm or more, 1300 nm or more, or 1400 nm or more).

In some examples, each plasmonic particle within the plurality of plasmonic particles on the substrate is separated from its neighboring plasmonic particles by an average distance of 1500 nm or less (e.g., 1400 nm or less, 1300 nm or less, 1200 nm or less, 1100 nm or less, 1000 nm or less, 950 nm or less, 900 nm or less, 850 nm or less, 800 nm or less, 750 nm or less, 700 nm or less, 650 nm or less, 600 nm or less, 550 nm or less, 500 nm or less, 475 nm or less, 450 nm or less, 425 nm or less, 400 nm or less, 375 nm or less, 350 nm or less, 325 nm or less, 300 nm or less, 275 nm or less, 250 nm or less, 225 nm or less, 200 nm or less, 175 nm or less, 150 nm or less, 125 nm or less, 100 nm or less, 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 19 nm or less, 18 nm or less, 17 nm or less, 16 nm or less, 15 nm or less, 14 nm or less, 13 nm or less, 12 nm or less, 11 nm or less, 10 nm or less, 9 nm or less, 8 nm or less, 7 nm or less, 6 nm or less, 5 nm or less, or 4 nm or less).

The average distance that each plasmonic particle within the plurality of plasmonic particles on the substrate is separated from its neighboring plasmonic particles can range from any of the minimum values described above to any of the maximum values described above. For example, each plasmonic particle within the plurality of plasmonic particles on the substrate is separated from its neighboring plasmonic particles by an average distance of from 3 nm to 1500 nm (e.g., from 3 nm to 750 nm, from 750 nm to 1500 nm, from 3 nm to 500 nm, from 500 nm to 1000 nm, from 1000 nm to 1500 nm, or from 5 nm to 1000 nm).

The density of the plurality of plasmonic particles on the plasmonic substrate can, for example, be $10^7$ particles/cm$^2$ or more (e.g., $2.5 \times 10^7$ particles/cm$^2$ or more, $5 \times 10^7$ particles/cm$^2$ or more, $7.5 \times 10^7$ particles/cm$^2$ or more, $1 \times 10^8$ particles/cm$^2$ or more, $2.5 \times 10^8$ particles/cm$^2$ or more, $5 \times 10^8$ particles/cm$^2$ or more, $7.5 \times 10^8$ particles/cm$^2$ or more, $1 \times 10^9$ particles/cm$^2$ or more, $2.5 \times 10^9$ particles/cm$^2$ or more, $5 \times 10^9$ particles/cm$^2$ or more, $7.5 \times 10^9$ particles/cm$^2$ or more, $1 \times 10^{10}$ particles/cm$^2$ or more, $2.5 \times 10^{10}$ particles/cm$^2$ or more, $5 \times 10^{10}$ particles/cm$^2$ or more, or $7.5 \times 10^{10}$ particles/cm$^2$ or more). In some examples, the density of the plurality of plasmonic particles on the plasmonic substrate can be $10^{11}$ particles/cm$^2$ or less (e.g., $7.5 \times 10^{10}$ particles/cm$^2$ or less, $5 \times 10^{10}$ particles/cm$^2$ or less, $2.5 \times 10^{10}$ particles/cm$^2$ or less, $1 \times 10^{10}$ particles/cm$^2$ or less, $7.5 \times 10^9$ particles/cm$^2$ or less, $5 \times 10^9$ particles/cm$^2$ or less, $2.5 \times 10^9$ particles/cm$^2$ or less, $1 \times 10^9$ particles/cm$^2$ or less, $7.5 \times 10^8$ particles/cm$^2$ or less, $5 \times 10^8$ particles/cm$^2$ or less, $2.5 \times 10^8$ particles/cm$^2$ or less, $1 \times 10^8$ particles/cm$^2$ or less, $7.5 \times 10^7$ particles/cm$^2$ or less, $5 \times 10^7$ particles/cm$^2$ or less, or $2.5 \times 10^7$ particles/cm$^2$ or less). The density of the plasmonic particles on the plasmonic substrate can range from any of the minimum values described above to any of the maximum values described above. For example, the density of the plurality of plasmonic particles on the plasmonic substrate can be from $10^7$ particles/cm$^2$ to $10^{11}$ particles/cm$^2$ (e.g., from $1 \times 10^7$ particles/cm$^2$ to $1 \times 10^9$ particles/cm$^2$, from $1 \times 10^9$ particles/cm$^2$ to $1 \times 10^{11}$ particles/cm$^2$, from $1 \times 10^7$ particles/cm$^2$ to $1 \times 10^8$ particles/cm$^2$, from $1 \times 10^8$ particles/cm$^2$ to $1 \times 10^9$ particles/cm$^2$, from $1 \times 10^9$ particles/cm$^2$ to $1 \times 10^{10}$ particles/cm$^2$, from $1 \times 10^{10}$ particles/cm$^2$ to $1 \times 10^{11}$ particles/cm$^2$, or from $2.5 \times 10^7$ particles/cm$^2$ to $7.5 \times 10^{10}$ particles/cm$^2$).

The size, shape, and/or composition of the plurality of plasmonic particles; the separation between each particle within the plurality of plasmonic particles; the density of the plasmonic particles on the substrate; or combinations thereof can be selected in view of a variety of factors. In some examples, the size, shape, and/or composition of the plurality of plasmonic particles can be selected to maximize the electromagnetic field enhancement. For example, the size, shape, and/or composition of the plurality of plasmonic particles; the separation between each particle within the plurality of plasmonic particles; the density of the plasmonic particles on the substrate; or combinations thereof can be selected such that the intensity of an incident electromagnetic field is enhanced by a factor of 5 or more by the plurality of plasmonic particles (e.g., 10 or more, 20 or more, 30 or more, 40 or more, 50 or more, 60 or more 70 or more, 80 or more, 90 or more, or 100 or more). In some examples, the size, shape, and/or composition of the plurality of plasmonic particles; the separation between each particle within the plurality of plasmonic particles; the density of the plasmonic particles on the substrate; or combinations thereof can be selected such that the plasmon resonance energy of the plasmonic substrate overlaps with at least a portion of the electromagnetic radiation used to illuminate the plasmonic substrate.

The methods can further comprise, for example, making the plasmonic substrate by depositing the plurality of plasmonic particles on a substrate. Depositing the plurality of plasmonic particles can comprise, for example, printing, lithographic deposition, electron beam deposition, thermal deposition, spin coating, drop-casting, zone casting, dip coating, blade coating, spraying, vacuum filtration, or combinations thereof.

The methods can further comprise, for example, making the plasmonic substrate by thermally annealing a film of a plasmonic metal deposited on a substrate, thereby forming the plurality of plasmonic particles on the substrate. In some examples, the methods can further comprise depositing the film of the plasmonic metal on the substrate. The film of plasmonic metal can be deposited on the substrate, for example, by thin film processing techniques, such as sputtering, pulsed layer deposition, molecular beam epitaxy, evaporation, atomic layer deposition, or combinations thereof.

In some examples, the film of the plasmonic metal can have a thickness of 2 nm or more (e.g., 3 nm or more, 4 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, or 175 nm or more). In some examples, the film of the plasmonic metal can have a thickness of 200 nm or less (e.g., 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, 9 nm or less, 8 nm or less, 7 nm or less, 6 nm or less, 5 nm or less, 4 nm or less, or 3 nm or less). The thickness of the film of the plasmonic metal can range from any of the minimum values described above to any of the maximum values described above. For example, the film of the plasmonic metal can have a thickness of from 2 nm to 200 nm (e.g., from 2 nm to 100 nm, from 100 nm to 200 nm, from 2 nm to 50 nm, from 50 nm to 100 nm, from 100 nm to 150 nm, from 150 nm to 200 nm, from 10 nm to 150 nm, or from 2 nm to 10 nm).

Thermally annealing the film can, for example, comprise heating the film at a temperature of 400° C. or more (e.g., 410° C. or more, 420° C. or more, 430° C. or more, 440° C. or more, 450° C. or more, 460° C. or more, 470° C. or more, 480° C. or more, 490° C. or more, 500° C. or more, 510° C. or more, 520° C. or more, 530° C. or more, 540° C. or more, 550° C. or more, 560° C. or more, 570° C. or more, 580° C. or more, or 590° C. or more). In some examples, thermally annealing the film can comprise heating the film at a temperature of 600° C. or less (e.g., 590° C. or less, 580° C. or less, 570° C. or less, 560° C. or less, 550° C. or less, 540° C. or less, 530° C. or less, 520° C. or less, 510° C. or less, 500° C. or less, 490° C. or less, 480° C. or less, 470° C. or less, 460° C. or less, 450° C. or less, 440° C. or less, 430° C. or less, 420° C. or less, or 410° C. or less). The temperature at which the film is heated during thermal annealing can range from any of the minimum values described above to any of the maximum values described above. For example, thermally annealing the film can comprise heating the film at a temperature of from 400° C. to 600° C. (e.g., from 400° C. to 500° C., from 500° C. to 600° C., from 400° C. to 450° C., from 450° C. to 500° C., from 500° C. to 550° C., from 550° C. to 600° C., from 450° C. to 550° C., or from 520° C. to 580° C.). In some examples, thermally annealing the film can comprise heating the film at a temperature of 550° C.

In some examples, the film can be thermally annealed for 1 hour or more (e.g., 1.5 hours or more, 2 hours or more, 2.5 hours or more, 3 hours or more, 3.5 hours or more, 4 hours or more, 4.5 hours or more, 5 hours or more, 5.5 hours or more, 6 hours or more, 7 hours or more, 8 hours or more, 9 hours or more, 10 hours or more, 11 hours or more, 12 hours or more, 14 hours or more, 16 hours or more, 18 hours or more, 20 hours or more, or 22 hours or more). In some examples, the film can be thermally annealed for 24 hours or less (e.g., 22 hours or less, 20 hours or less, 18 hours or less, 16 hours or less, 14 hours or less, 12 hours or less, 11 hours or less, 10 hours or less, 9 hours or less, 8 hours or less, 7 hours or less, 6 hours or less, 5.5 hours or less, 5 hours or less, 4.5 hours or less, 4 hours or less, 3.5 hours or less, 3 hours or less, 2.5 hours or less, 2 hours or less, or 1.5 hours or less). The time for which the film can be thermally annealed can range from any of the minimum values described above to any of the maximum values described above. For example, the film can be thermally annealed for from 1 hour to 24 hours (e.g., from 1 hour to 12 hours, from 12 hours to 24 hours, from 1 hour to 6 hours, from 6 hours to 12 hours, from 12 hours to 18 hours, from 18 hours to 24 hours, from 2 hours to 20 hours, from 1 hour to 18 hours, from 1 hour to 8 hours, or from 1 hour to 3 hours). In some examples, the film can be thermally annealed for 2 hours.

In some examples, the plasmonic substrate can comprise a film permeated by a plurality of plasmonic nanoholes. In some examples, the film permeated by a plurality of nanoholes can comprise a film of a plasmonic metal permeated by a plurality of plasmonic nanoholes on a substrate. The plasmonic metal can, for example, be selected from the group consisting of Au. Ag, Pd, Cu, Cr, Al, and combinations thereof. In some examples, the plasmonic metal film can have a thickness of 10 nm or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, or 175 nm or more). In some examples, the plasmonic metal film can have a thickness of 200 nm or less (e.g., 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, or 15 nm or less). The thickness of the film of the plasmonic metal can range from any of the minimum values described above to any of the maximum values described above. For example, the plasmonic metal film can have a thickness of from 10 nm to 200 nm (e.g., from 10 nm to 100 nm, from 100 nm to 200 nm, from 10 nm to 50 nm, from 50 nm to 100 nm, from 100 nm to 150 nm, from 150 nm to 200 nm, or from 10 nm to 150 nm).

The plurality of plasmonic nanoholes can have an average diameter. "Average diameter" and "mean diameter" are used interchangeably herein, and generally refer to the statistical mean diameter of the nanoholes in a population of nanoholes. Mean diameter of a nanohole can be measured using methods known in the art, such as evaluation by scanning electron microscopy and/or transmission electron microscopy. For example, the plurality of plasmonic nanoholes can have an average diameter of 10 nm or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 275 nm or more, 300 nm or more, 350 nm or more, 400 nm or more, 450 nm or more, 500 nm or more, 550 nm or more, 600 nm or more, 650 nm or more, 700 nm or more, or 750 nm or more). In some examples, the plurality of plasmonic nanoholes can have an average diameter of 800 nm or less (e.g., 750 nm or less, 700 nm or less, 650 nm or less, 600 nm or less, 550 nm or less, 500 nm or less, 450 nm or less, 400 nm or less, 350 nm or less, 300 nm or less, 275 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, or 15 nm or less). The average diameter of the plurality of plasmonic nanoholes can range from any of the minimum values described above to any of the maximum values described above. For example, the plurality of plasmonic nanoholes can have an average diameter of from 10 nm to 800 nm (e.g., from 10 nm to 400 nm from 400 nm to 800 nm, from 10 nm to 200 nm, from 200 nm to 400 nm, from 400 nm to 600 nm, from 600 nm to 800 nm, from 10 nm to 100 nm, or from 20 nm to 700 nm).

Each plasmonic nanohole within the plurality of plasmonic nanoholes on the substrate can, for example, be separated from its neighboring plasmonic nanohole by an average distance of 3 nm or more (e.g., 5 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, 175 nm or more, 200 nm or more, 225 nm or more, 250 nm or more, 300 nm or more, 350 nm or more, 400 nm or more, 450 nm or more, 500 nm or more, 600 nm or more, 700 nm or more, 800 nm or more, 900 nm or more, 1000 nm or more, 1250 nm or more, 1500 nm or more, 1750 nm or more, 2000 nm or more, 2250 nm or more, 2500 nm or more, or 2750 nm or more). In some examples, each plasmonic nanohole within the plurality of plasmonic nanoholes on the substrate can be separated from its neighboring plasmonic nanohole by an average distance of 3000 nm or less (e.g., 2750 nm or less, 2500 nm or less, 2250 nm or less, 2000 nm or less, 1750 nm or less, 1500 nm or less, 1250 nm or less, 1000 nm or less, 900 nm or less, 800 nm or less, 700 nm or less, 600 nm or less, 500 nm or less, 450 nm or less, 400 nm or less, 350 nm or less, 300 nm or less, 250 nm or less, 225 nm or less, 200 nm or less, 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, or 5 nm or less). The average distance that each plasmonic nanohole within the plurality of plasmonic nanoholes on the substrate is separated from its neighboring plasmonic nanohole can range from any of the minimum values described above to any of the maximum values described above. For example, each plasmonic nanohole within the plurality of plasmonic nanoholes on the substrate can be separated from its neighboring plasmonic nanohole by a distance of from 3 nm to 3000 nm (e.g., from 3 nm to 1500 nm, from 1500 nm to 3000 nm, from 3 nm to 1000 nm, from 1000 nm to 2000 nm, from 2000 nm to 3000 nm, from 3 nm to 50 nm, or from 5 nm to 2500 nm).

The density of the plurality of plasmonic nanoholes on the plasmonic substrate can, for example, be $10^7$ nanoholes/cm$^2$ or more (e.g., $2.5 \times 10^7$ nanoholes/cm$^2$ or more, $5 \times 10^7$ nanoholes/cm$^2$ or more, $7.5 \times 10^7$ nanoholes/cm$^2$ or more, $1 \times 10^8$ nanoholes/cm$^2$ or more, $2.5 \times 10^8$ nanoholes/cm$^2$ or more, $5 \times 10^8$ nanoholes/cm$^2$ or more, $7.5 \times 10^8$ nanoholes/cm$^2$ or more, $1 \times 10^9$ nanoholes/cm$^2$ or more, $2.5 \times 10^9$ nanoholes/cm$^2$ or more, $5 \times 10^9$ nanoholes/cm$^2$ or more, $7.5 \times 10^9$ nanoholes/cm$^2$ or more, $1 \times 10^{10}$ nanoholes/cm$^2$ or more, $2.5 \times 10^{10}$ nanoholes/cm$^2$ or more, $5 \times 10^{10}$ nanoholes/cm$^2$ or more, or $7.5 \times 10^{10}$ nanoholes/cm$^2$ or more). In some examples, the density of the plurality of plasmonic nanoholes on the plasmonic substrate can be $10^{11}$ nanoholes/cm$^2$ or less (e.g., $7.5 \times 10^{10}$ nanoholes/cm$^2$ or less, $5 \times 10^{10}$ nanoholes/cm$^2$ or less, $2.5 \times 10^{10}$ nanoholes/cm$^2$ or less, $1 \times 10^{10}$ nanoholes/cm$^2$ or less, $7.5 \times 10^9$ nanoholes/cm$^2$ or less, $5 \times 10^9$ nanoholes/cm$^2$ or less, $2.5 \times 10^9$ nanoholes/cm$^2$ or less, $1 \times 10^9$ nanoholes/cm$^2$ or less, $7.5 \times 10^8$ nanoholes/cm$^2$ or less, $5 \times 10^8$ nanoholes/cm$^2$ or less, $2.5 \times 10^8$ nanoholes/cm$^2$ or less, $1 \times 10^8$ nanoholes/cm$^2$ or less, $7.5 \times 10^7$ nanoholes/cm$^2$ or less, $5 \times 10^7$ nanoholes/cm$^2$ or less, or $2.5 \times 10^7$ nanoholes/cm$^2$ or less). The density of the plasmonic nanoholes on the plasmonic substrate can range from any of the minimum values described above to any of the maximum values described above. For example, the density of the plurality of plasmonic nanoholes on the plasmonic substrate can be from $10^7$ nanoholes/cm$^2$ to $10^{11}$ nanoholes/cm$^2$ (e.g., from $1 \times 10^7$ nanoholes/cm$^2$ to $1 \times 10^9$ nanoholes/cm$^2$, from $1 \times 10^9$ nanoholes/cm$^2$ to $1 \times 10^{11}$ nanoholes/cm$^2$, from $1 \times 10^7$ nanoholes/cm$^2$ to $1 \times 10^8$ nanoholes/cm$^2$, from $1 \times 10^8$ nanoholes/cm$^2$ to $1 \times 10^9$ nanoholes/cm$^2$, from $1 \times 10^9$ nanoholes/cm$^2$ to $1 \times 10^{10}$ nanoholes/cm$^2$, from $1 \times 10^{10}$ nanoholes/cm$^2$ to $1 \times 10^{11}$ nanoholes/cm$^2$, or from $2.5 \times 10^7$ nanoholes/cm$^2$ to $7.5 \times 10^{10}$ nanoholes/cm$^2$).

The size and/or shape of the plurality of plasmonic nanoholes; the composition of the film permeated by the plurality of plasmonic nanoholes; the separation between each plasmonic nanohole within the plurality of plasmonic nanoholes; the density of the plurality of plasmonic nanoholes on the substrate; or combinations thereof can be selected in view of a variety of factors. In some examples, the size and/or shape of the plurality of plasmonic nanoholes; the composition of the film permeated by the plurality of plasmonic nanoholes; the separation between each plasmonic nanohole within the plurality of plasmonic nanoholes; the density of the plurality of plasmonic nanoholes on the substrate; or combinations thereof can be selected to maximize the electromagnetic field enhancement. In some examples, the size and/or shape of the plurality of plasmonic nanoholes; the composition of the film permeated by the plurality of plasmonic nanoholes; the separation between each plasmonic nanohole within the plurality of plasmonic nanoholes; the density of the plurality of plasmonic nanoholes on the substrate; or combinations thereof can be selected such that the plasmon resonance energy of the plasmonic substrate overlaps with at least a portion of the electromagnetic radiation used to illuminate the plasmonic substrate.

In some examples, the optothermal substrate can comprise a metal film, such as a metal film deposited on a substrate. The metal film can, for example, comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In some examples, the metal film can comprise a metal selected from the group consisting of Al, Ti, Cr, Mn, Fe, Co, Ni, Cu, Mo, Pd, Ag, Cd, Pt, Au, and combinations thereof. In some examples, the methods can further comprise making the optothermal substrate by depositing the metal film on a substrate. The metal film can be deposited on the substrate, for example, by thin film processing techniques, such as sputtering, pulsed layer deposition, molecular beam epitaxy, evaporation, atomic layer deposition, or combinations thereof. The metal film can, for example, have a thickness of from 2 nm to 200 nm.

In some examples, the optothermal substrate comprises an indium tin oxide substrate or an amorphous silicon substrate.

The optothermal substrate can be, for example, in thermal contact with a liquid sample comprising a plurality of capped particles and a plurality of surfactant micelles, the liquid sample having a first temperature. The liquid sample can further comprise, for example, an aqueous solvent. The first temperature can be, for example, 273 K or more (e.g., 275 K or more, 280 K or more, 285 K or more, 290 K or more, 295 K or more, 300 K or more, 305 K or more, 310 K or more, 315 K or more, 320 K or more, 325 K or more, 330 K or more, 335 K or more, or 340 K or more). In some examples, the first temperature can be 343 K or less (e.g., 340 K or less, 335 K or less, 330 K or less, 325 K or less, 320 K or less, 315 K or less, 310 K or less, 305 K or less, 300 K or less, 295 K or less, 290 K or less, 285 K or less, 280 K or less, or 275 K or less). The first temperature can range from any of the minimum values described above to any of the maximum values described above. For example, the first temperature can be from 273 K to 343 K (e.g., from 273 K to 305 K, from 305 K to 343 K, from 273 K to 285 K, from 285 K to 300 K, from 300 K to 315 K, from 315 K to 330 K, from 330 K to 434 K, or from 275 K to 340 K).

The plurality of capped particles have a surface charge and the plurality of surfactant micelles have a surface charge, and the surface charge of the plurality of capped particles and the surface charge of the plurality of surfactant micelles are the same. In some examples, the plurality of capped particles comprise a plurality of particles capped with a capping material, the plurality of surfactant micelles comprise a plurality of micelles formed from a surfactant. In some examples, the capping material and the surfactant are the same. In some examples, the methods further comprise forming the liquid sample by contacting a plurality of particles with a surfactant, wherein the surfactant is provided at a concentration above the critical micelle concentration of the surfactant, thereby forming the plurality of capped particles and the plurality of surfactant micelles. "Capping" refers to the formation of an ionic or covalent bond of molecules to the surface atoms of a particle, this molecule is referred to as a capping agent. "Capping material" refers to a molecule possessing a functional group capable of binding to the surface atoms of a particle by ionic or covalent bond. Such capping materials usually contain functional groups such as thiol (—SH), carboxyl (—COOH), or amine (—NH) groups. In some examples, the capping material can comprise a cationic material or an anionic material. Examples of capping materials include, but are not limited to, cetrimonium bromide (CTAB), cetrimonium chloride (CTAC), sodium dodecyl sulfate (SDS), or combinations thereof. The capping materials can uniformly cover the surface of each of the plurality of particles, thereby forming the capping layer on the surface of each of the plurality of particles to form the plurality of capped particles. The capping material can be used to stabilize the plurality of particles. The capping material can, for example, prevent the oxidation on the surface of the plurality of particles and/or to increase the dispersibility of the plurality of particles. In some examples, the capping material can be attached to the surface of each of the plurality of particles, for example, by coordination bonds. The capping material can also be associated with the plurality of particles via non-covalent interactions. In some examples, the capping material can individually be selected to be a hydrophilic, hydrophobic, or amphiphilic. In addition, the capping material can, in combination, be selected so as to provide a shell surrounding each of the plurality of particles which is hydrophilic, hydrophobic, or amphiphilic.

The surfactant can, for example, be a non-photoresponsive surfactant. In some examples, the surfactant can comprise a cationic surfactant or an anionic surfactant. Examples of cationic surfactants include, but are not limited to, cetrimonium bromide (CTAB), cetrimonium chloride (CTAC), benzalkonium chloride, benzethonium chloride, bronidox, distearyldimethylammonium chloride, tetramethylammonium hydroxide, and combinations thereof. Examples of anionic surfactants include, but are not limited to, ammonium lauryl sulfate, ammonium perfluorononanoate, docusate, perfluorobutanesulfonic acid, perfluorononanoic acid, perfluorooctanesulfonic acid, perfluorooctanoic acid, phospholipid, potassium lauryl sulfate, sodium dodecyl sulfate (SDS), sodium dodecylbenzenesulfonate, sodium laurate, sodium laureth sulfate, sodium lauroyl sarcosinate, sodium myreth sulfate, sodium pareth sulfate, sodium stearate, and combinations thereof. In some examples, the surfactant can comprise cetrimonium bromide (CTAB), cetrimonium chloride (CTAC), sodium dodecyl sulfate (SDS), or a combination thereof.

The concentration of the surfactant in the liquid sample is above the critical micelle concentration of the surfactant. In some examples, the concentration of the surfactant in the liquid sample can be 1 mM or more (e.g., 2 mM or more, 3 mM or more, 4 mM or more, 5 mM or more, 10 mM or more, 15 mM or more, 20 mM or more, 25 mM or more, 30 mM or more, 35 mM or more, 40 mM or more, or 45 mM or more). In some examples, the concentration of the surfactant in the liquid sample can be 50 mM or less (e.g., 45 mM or less, 40 mM or less, 35 mM or less, 30 mM or less, 25 mM or less, 20 mM or less, 15 mM or less, 10 mM or less, 5 mM or less, 4 mM or less, 3 mM or less, or 2 mM or less). The concentration of the surfactant in the liquid sample can range from any of the minimum values described above to any of the maximum values described above. For example, the concentration of the surfactant in the liquid sample can be from 1 mM to 50 mM (e.g., from 1 mM to 25 mM, from 25 mM to 50 mM, from 1 mM to 10 mM, from 10 mM to 20 mM, from 20 mM to 30 mM, from 30 mM to 40 mM, from 40 mM to 50 mM, or from 5 mM to 45 mM).

The concentration of the plurality of capped particles in the liquid sample can be, for example, 1 particle/mm$^3$ or more (e.g., 2.5 particles/mm$^3$ or more, 5 particles/mm$^3$ or more, 7.5 particles/mm$^3$ or more, 1×10$^1$ particles/mm$^3$ or more, 2.5×10$^1$ particles/mm$^3$ or more, 5×10$^1$ particles/mm$^3$ or more, 7.5×10$^1$ particles/mm$^3$ or more, 1×10$^2$ particles/mm$^3$ or more, 2.5×10$^2$ particles/mm$^3$ or more, 5×10$^2$ particles/mm$^3$ or more, 7.5×10$^2$ particles/mm$^3$ or more, 1×10$^3$ particles/mm$^3$ or more, 2.5×10$^3$ particles/mm$^3$ or more, 5×10$^3$ particles/mm$^3$ or more, 7.5×10$^3$ particles/mm$^3$ or more, 1×10$^4$ particles/mm$^3$ or more, 2.5×10$^4$ particles/mm$^3$ or more, 5×10$^4$ particles/mm$^3$ or more, 7.5×10$^4$ particles/mm$^3$ or more, 1×10$^5$ particles/mm$^3$ or more, 2.5×10$^5$ particles/mm$^3$ or more, 5×10$^5$ particles/mm$^3$ or more, 7.5×10$^5$ particles/mm$^3$ or more, 1×10$^6$ particles/mm$^3$ or more, 2.5×10$^6$ particles/mm$^3$ or more, 5×10$^6$ particles/mm$^3$ or more, 7.5×10$^6$ particles/mm$^3$ or more, 1×10$^7$ particles/mm$^3$ or more, 2.5×10$^7$ particles/mm$^3$ or more, 5×10$^7$ particles/mm$^3$ or more, 7.5×10$^7$ particles/mm$^3$ or more, 1×10$^8$ particles/mm$^3$ or more, 2.5×10$^8$ particles/mm$^3$ or more, 5×10$^8$ particles/mm$^3$ or more, 7.5×10$^8$ particles/mm$^3$ or more, 1×10$^9$ particles/mm$^3$ or more, 2.5×10$^9$ particles/mm$^3$ or more, 5×10$^9$ particles/mm$^3$ or more, or 7.5×10$^9$ particles/mm$^3$ or more).

In some examples, the concentration of the plurality of capped particles in the liquid sample can be 10$^{10}$ particles/mm$^3$ or less (e.g., 7.5×10$^9$ particles/mm$^3$ or less, 5×10$^9$ particles/mm$^3$ or less, 2.5×10$^9$ particles/mm$^3$ or less, 1×10$^9$ particles/mm$^3$ or less, 7.5×10$^8$ particles/mm$^3$ or less, 5×10$^8$ particles/mm$^3$ or less, 2.5×10$^8$ particles/mm$^3$ or less, 1×10$^8$ particles/mm$^3$ or less, 7.5×10$^7$ particles/mm$^3$ or less, 5×10$^7$ particles/mm$^3$ or less, 2.5×10$^7$ particles/mm$^3$ or less, 1×10$^7$ particles/mm$^3$ or less, 7.5×10$^6$ particles/mm$^3$ or less, 5×10$^6$ particles/mm$^3$ or less, 2.5×10$^6$ particles/mm$^3$ or less, 1×10$^6$ particles/mm$^3$ or less, 7.5×10$^5$ particles/mm$^3$ or less, 5×10$^5$ particles/mm$^3$ or less, 2.5×10$^5$ particles/mm$^3$ or less, 1×10$^5$ particles/mm$^3$ or less, 7.5×10$^4$ particles/mm$^3$ or less, 5×10$^4$ particles/mm$^3$ or less, 2.5×10$^4$ particles/mm$^3$ or less, 1×10$^4$ particles/mm$^3$ or less, 7.5×10$^3$ particles/mm$^3$ or less, 5×10$^3$ particles/mm$^3$ or less, 2.5×10$^3$ particles/mm$^3$ or less, 1×10$^3$ particles/mm$^3$ or less, 7.5×10$^2$ particles/mm$^3$ or less, 5×10$^2$ particles/mm$^3$ or less, 2.5×10$^2$ particles/mm$^3$ or less, 1×10$^2$ particles/mm$^3$ or less, 7.5×10$^1$ particles/mm$^3$ or less, 5×10$^1$ particles/mm$^3$ or less, 2.5×10$^1$ particles/mm$^3$ or less, 1×10$^1$ particles/mm$^3$ or less, 7.5 particles/mm$^3$ or less, 5 particles/mm$^3$ or less, or 2.5 particles/mm$^3$ or less).

The concentration of the plurality of capped particles in the liquid sample can range from any of the minimum values described above to any of the maximum values described above. For example, the concentration of the plurality of capped particles in the liquid sample can be from 1 particle/mm$^3$ to 10$^{10}$ particles/mm$^3$ (e.g., from 1 particle/mm$^3$ to 10$^5$ particles/mm$^3$, from 10$^5$ particles/mm$^3$ to 10$^{10}$ particles/mm$^3$, from 1 particle/mm$^3$ to 10$^2$ particles/mm$^3$, from 10$^2$ particles/mm$^3$ to 10$^4$ particles/mm$^3$, from 10$^4$ particles/mm$^3$ to $10^8$ particles/mm$^3$, from $10^8$ particles/mm$^3$ to $10^{10}$ particles/mm$^3$, or from $10^1$ particles/mm$^3$ to $10^9$ particles/mm$^3$).

The plurality of capped particles can, for example, have an average particle size of 50 nm or more (e.g., 60 nm or more, 70 nm or more, 80 nm or more, 90 nm or more, 100 nm or more, 125 nm or more, 150 nm or more, 175 nm or more, 200 nm or more, 225 nm or more, 250 nm or more, 275 nm or more, 300 nm or more, 325 nm or more, 350 nm or more, 375 nm or more, 400 nm or more, 425 nm or more, 450 nm or more, 475 nm or more, 500 nm or more, 550 nm or more, 600 nm or more, 650 nm or more, 700 nm or more, 750 nm or more, 800 nm or more, 850 nm or more, 900 nm or more, 950 nm or more, 1 μm or more, 2 μm or more, 3 μm or more, 4 μm or more, 5 μm or more, 6 μm or more, 7 μm or more, 8 μm or more, 9 μm or more, 10 μm or more, 11 μm or more, 12 μm or more, 13 μm or more, 14 μm or more, 15 μm or more, 16 μm or more, 17 μm or more, 18 μm or more, or 19 μm or more).

In some examples, the plurality of capped particles in the liquid sample can have an average particle size of 20 μm or less (e.g., 19 μm or less, 18 μm or less, 17 μm or less, 16 μm or less, 15 μm or less, 14 μm or less, 13 μm or less, 12 μm or less, 11 μm or less, 10 μm or less, 9 μm or less, 8 μm or less, 7 μm or less, 6 μm or less, 5 μm or less, 4 μm or less, 3 μm or less, 2 μm or less, 1 μm or less, 950 nm or less, 900 nm or less, 850 nm or less, 800 nm or less, 750 nm or less, 700 nm or less, 650 nm or less, 600 nm or less, 550 nm or less, 500 nm or less, 475 nm or less, 450 nm or less, 425 nm or less, 400 nm or less, 375 nm or less, 350 nm or less, 325 nm or less, 300 nm or less, 275 nm or less, 250 nm or less, 225 nm or less, 200 nm or less, 175 nm or less, 150 nm or less, 125 nm or less, 100 nm or less, 90 nm or less, 80 nm or less, 70 nm or less, or 60 nm or less).

The average particle size of the plurality of capped particles in the liquid sample can range from any of the minimum values described above to any of the maximum values described above. For example, the plurality of capped particles in the liquid sample can have an average particle size of from 50 nm to 20 μm (e.g., from 50 nm to 10 μm, from 10 μm to 20 μm, from 50 nm to 1 μm, from 1 μm to 10 μm, from 10 μm to 20 μm, or from 60 nm to 15 μm).

The plurality of capped particles in the liquid sample can, for example, comprise a plurality of thermoresponsive particles. In some examples, the plurality of capped particles can comprise a plurality of capped metal particles, a plurality of capped dielectric particles (e.g., SiO$_2$, Si), a plurality of capped polymer particles (e.g., polystyrene particles), a plurality of capped semiconductor particles, or combinations thereof.

In some examples, the plurality of capped particles can comprise a plurality of capped metal particles wherein the plurality of capped metal particles can comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In some examples, the plurality of capped metal particles can comprise a plurality of capped plasmonic particles (e.g., comprising Au, Ag, Pd, Cu, Cr, Al, and combinations thereof.

The methods can further comprise, for example, generating a confinement region at a location in the liquid sample proximate to the first location of the optothermal substrate, wherein at least a portion of the confinement region has a second temperature that is greater than the first temperature such that the confinement region is bound by a temperature gradient. For example, the confinement region is located within at least a portion of the three-dimensional area within the liquid sample defined by the temperature gradient (e.g., the boundary of the confinement region can defined by the temperature gradient). The confinement region can comprise a three dimensional area within the liquid sample where the balance of forces acting on the portion of the plurality of capped particles substantially localizes the portion of the plurality of capped particles. In some examples, the method further comprises repulsing at least a portion of the plurality of surfactant micelles from the confinement region such that the concentration of the plurality of surfactant micelles within the confinement region is lower than the concentration of the plurality of surfactant micelles outside the confinement region.

The second temperature can be, for example, of 276 K or more (e.g., 280 K or more, 285 K or more, 290 K or more, 295 K or more, 300 K or more, 305 K or more, 310 K or more, 315 K or more, 320 K or more, 325 K or more, 330 K or more, 335 K or more, 340 K or more, 345 K or more, 350 K or more, 355 K or more, or 360 K or more). In some examples, the second temperature can be 363 K or less (e.g., 360 K or less, 355 K or less, 350 K or less, 345 K or less, 340 K or less, 335 K or less, 330 K or less, 325 K or less, 320 K or less, 315 K or less, 310 K or less, 305 K or less, 300 K or less, 295 K or less, 290 K or less, 285 K or less, or 280 K or less). The second temperature can range from any of the minimum values described above to any of the maximum values described above. For example, the second temperature can be from 276 K to 363 K (e.g., from 276 K to 315 K, from 315 K to 363 K, from 276 K to 290 K, from 290 K to 310 K, from 310 K to 330 K, from 330 K to 350 K, from 350 K to 363 K, or from 280 to 360 K).

In some examples, the second temperature can be greater than the first temperature by 3 K or more (e.g., 4 K or more, 5 K or more, 6 K or more, 7 K or more, 8 K or more, 9 K or more, 10 K or more, 11 K or more, 12 K or more, 13 K or more, 14 K or more, 15 K or more, 16 K or more, 17 K or more, 18 K or more, or 19 K or more). In some examples, the second temperature can be greater than the first temperature by 20 K or less (e.g., 19 K or less, 18 K or less, 17 K or less, 16 K or less, 15 K or less, 14 K or less, 13 K or less, 12 K or less, 11 K or less, 10 K or less, 9 K or less, 8 K or less, 7 K or less, 6 K or less, 5 K or less, or 4 K or less). The amount that the second temperature is greater than the first temperature by can range from any of the minimum values described above to any of the maximum values described above. For example, the second temperature can be greater than the first temperature by from 3 K to 20 K (e.g., from 3 K 10 K, from 10 K to 20 K, from 3 K to 9 K, from 9 K to 15 K, from 15 K to 20 K, or from 5 K to 15 K).

In some examples, the confinement region is generated by plasmon-enhanced photothermal effects. The confinement region can, for example, have a diameter of 500 nm or more (e.g., 550 nm or more, 600 nm or more, 650 nm or more, 700 nm or more, 750 nm or more, 800 nm or more, 850 nm or more, 900 nm or more, 950 nm or more, 1 μm or more, 2 μm or more, 3 μm or more, 4 μm or more, 5 μm or more, 6 μm or more, 7 μm or more, 8 μm or more, 9 μm or more, 10 μm or more, 20 μm or more, 30 μm or more, 40 μm or more, 50 μm or more, 60 μm or more, 70 μm or more, 80 μm or more, or 90 μm or more). In some examples, the confinement region can have a diameter of 100 μm or less (e.g., 90 μm or less, 80 μm or less, 70 μm or less, 60 μm or less, 50 μm or less, 40 μm or less, 30 μm or less, 20 μm or less, 10 μm or less, 9 μm or less, 8 μm or less, 7 μm or less, 6 μm or less, 5 μm or less, 4 μm or less, 3 μm or less, 2 μm or less, 1 μm or less, 950 nm or less, 900 nm or less, 850 nm or less, 800 nm or less, 750 nm or less, 700 nm or less, 650 nm or less, 600 nm or less, or 550 nm or less). The diameter of the confinement region can range from any of the minimum values described above to any of the maximum values described above. For example, the confinement region can have a diameter of from 500 nm to 100 µm (e.g., from 500 nm to 50 µm, from 50 µm to 100 µm, from 500 nm to 1 µm, from 1 µm to 10 µm, from 10 µm to 100 µm, or from 600 nm to 40 µm). The diameter of the confinement region can, for example, be controlled by the power density of the electromagnetic radiation used to illuminate the optothermal substrate. The diameter of the confinement region can be selected in view of a number of factors. In some examples, the diameter of the confinement region can be selected relative to the average particle size of the plurality of capped particles in the liquid sample.

The methods can further comprise, for example, trapping at least a portion of the plurality of capped particles within the confinement region. The portion of the plurality of capped particles trapped within the confinement region can be trapped, for example, by a thermophoretic force. In some example, the portion of the plurality of capped particles are not damaged during trapping.

The methods can further comprise, for example, depositing at least a portion of the plurality of capped particles on the optothermal substrate at the first location. In some examples, the portion of the plurality of capped particles are not damaged during the deposition. In some examples, the portion of the plurality of capped particles deposited on the substrate are immobilized on the optothermal substrate by electrostatic attraction, depletion attraction, van der Waals force, or a combination thereof. In some examples, the portion of the plurality of capped particles deposited on the substrate comprises two or more capped particles, with each of the portion of the plurality of capped particles deposited on the substrate being bonded to at least one of the other capped particles comprising the portion of the plurality of capped particles deposited on the substrate, and wherein the bonding comprises an electrostatic force, a depletion attraction, a van der Waals force, or combinations thereof. The methods can, in some example, be used to assemble a superstructure of particles in a controllable manner.

The methods can further comprise, for example, illuminating a second location of the optothermal substrate thereby: generating a second confinement region at a location in the liquid sample proximate to the second location of the optothermal substrate, wherein at least a portion of the second confinement region has a third temperature that is greater than the first temperature such that the second confinement region is bound by a temperature gradient; and translocating the deposited portion of the plurality of capped particles from the first location to the second location, depositing at least a second portion of the plurality of capped particles at the second location, or a combination thereof. As used herein, "a second location" and "the second location" are meant to include any number of locations in any arrangement on the optothermal substrate. Thus, for example "a second location" includes one or more second locations. In some embodiments, the second location can comprise a plurality of locations. In some embodiments, the second location can comprise a plurality of locations arranged in an ordered array. In some examples, the optothermal substrate, the light source, the mirror, or a combination thereof can be translocated to illuminate the second location. As used herein translocating refers to any type of movement about any axis (e.g., rotation, translation, etc.) In other words, as used herein, translocation refers to a change in position and/or orientation.

Also disclosed herein are patterned sample made using the methods described herein. Also disclosed herein are methods of use of patterned sample made using the methods described herein, for example using the patterned samples for single-particle sensing, functional optical devices, or combinations thereof.

Also disclosed herein are systems for performing the methods described herein. Referring now to FIG. 1, the systems 100 can comprise an optothermal substrate 102 in thermal contact with a liquid sample 104 comprising a plurality of capped particles 106 and a plurality of surfactant micelles 107; and a light source 108 configured to illuminate the optothermal substrate 102 at a first location 110. In some examples, the system 100 can include a single light source 108. In other examples, more than one light source 108 can be included in the system 100.

In some examples, the systems 100 can further comprise a means for translocating the optothermal substrate 102 and/or the light source 108.

Figure 2:
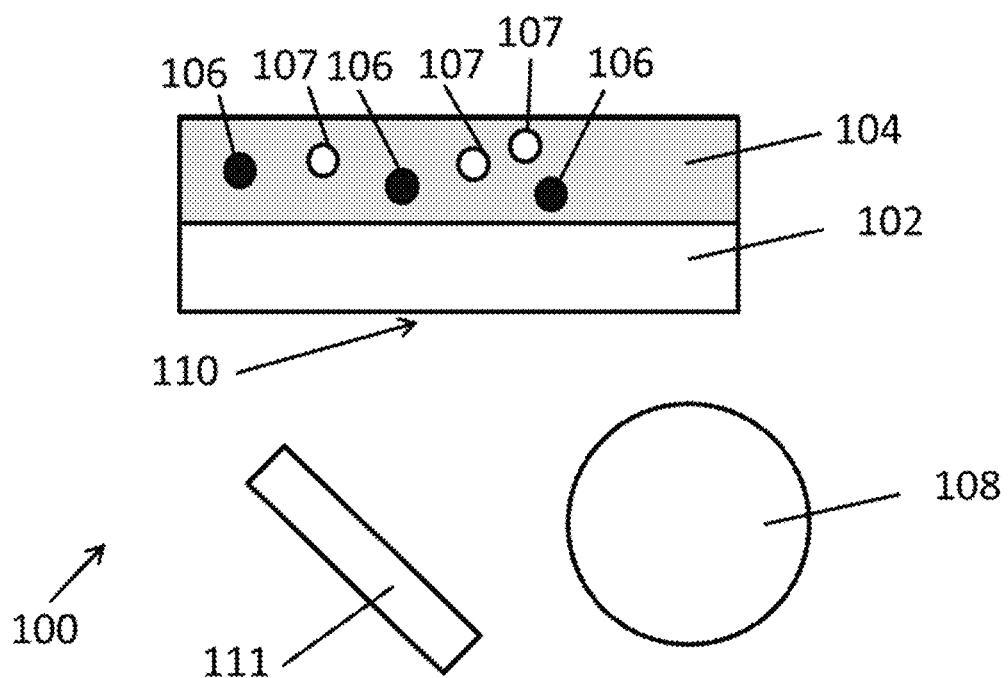
FIG. 2 is a schematic of an exemplary system as disclosed herein.

Referring now to FIG. 2, the system 110 can, in some examples, further comprise a mirror 111, wherein the system 110 can be aligned such that the light source 108 is configured to illuminate the mirror 111 and the mirror 111 is configured to reflect the electromagnetic radiation from the light source 108 to illuminate the first location 110 of the optothermal substrate 102. In some examples, the systems 100 can further comprise a means for translocating the mirror 111.

Figure 3:
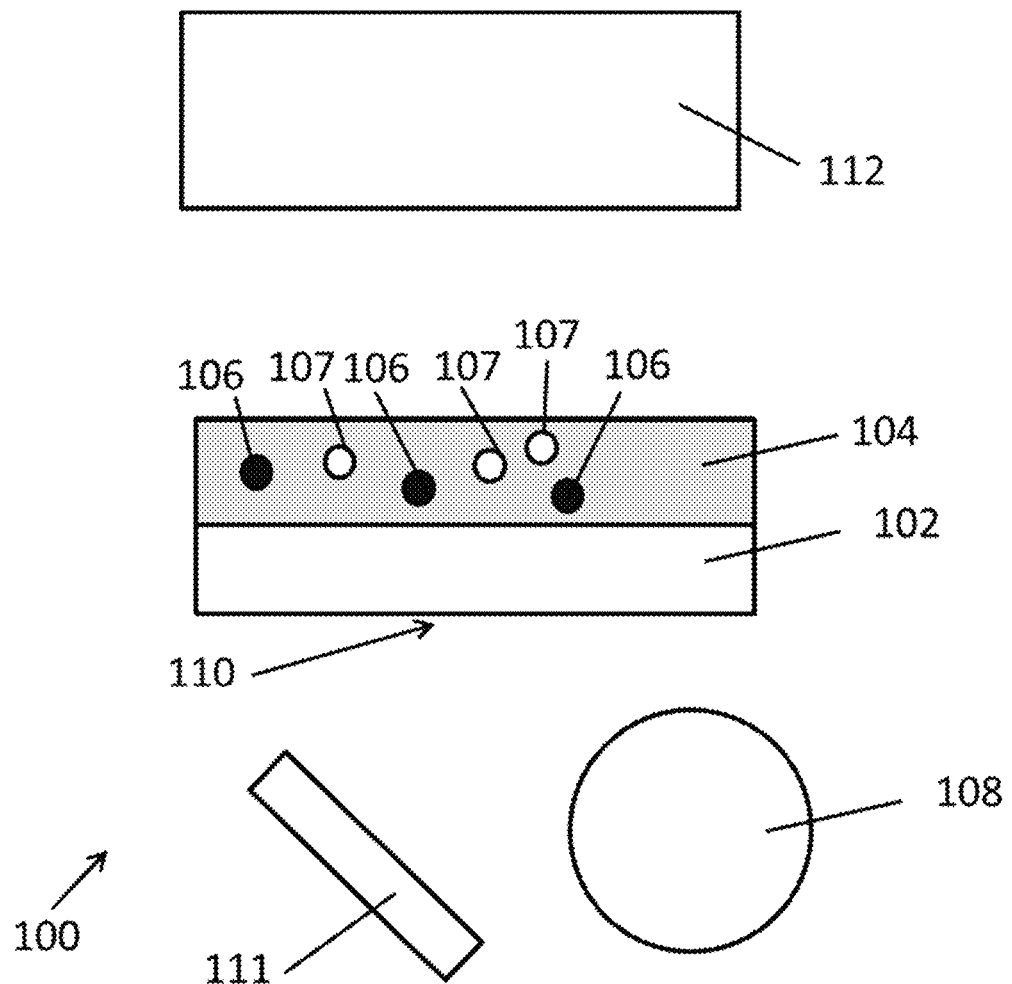
FIG. 3 is a schematic of an exemplary system as disclosed herein.

Referring now to FIG. 3, the system 110 can, in some examples, further comprise an instrument 112 configured to capture an electromagnetic signal from the optothermal substrate 102. The instrument 112 can comprise, for example, a camera, an optical microscope, an electron microscope, a spectrometer, or combinations thereof. Examples of spectrometers include, but are not limited to, Raman spectrometers, UV-vis absorption spectrometers, IR absorption spectrometers, fluorescence spectrometers, and combinations thereof.

In some examples, the system 110 can further comprise a first lens 114. In some examples, the system 110 can further comprise a second lens 116. The lenses may independently be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, or a gradient index lens.

Figure 4:
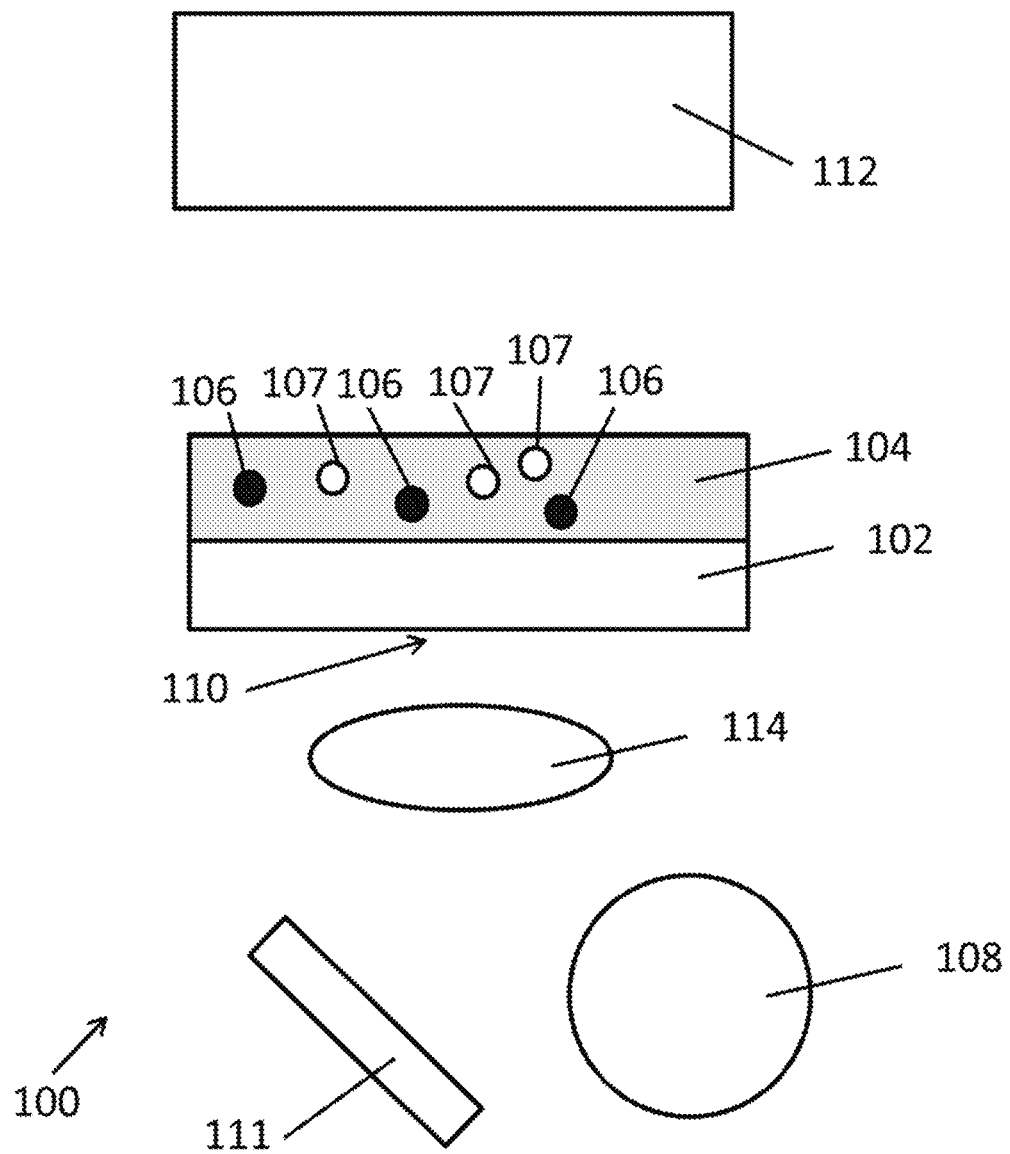
FIG. 4 is a schematic of an exemplary system as disclosed herein.

Referring now to FIG. 4, in some examples, the system 110 can be configured such that the light source 108 is below the first lens 114 and the optothermal substrate 102 is above the first lens 114.

Figure 5:
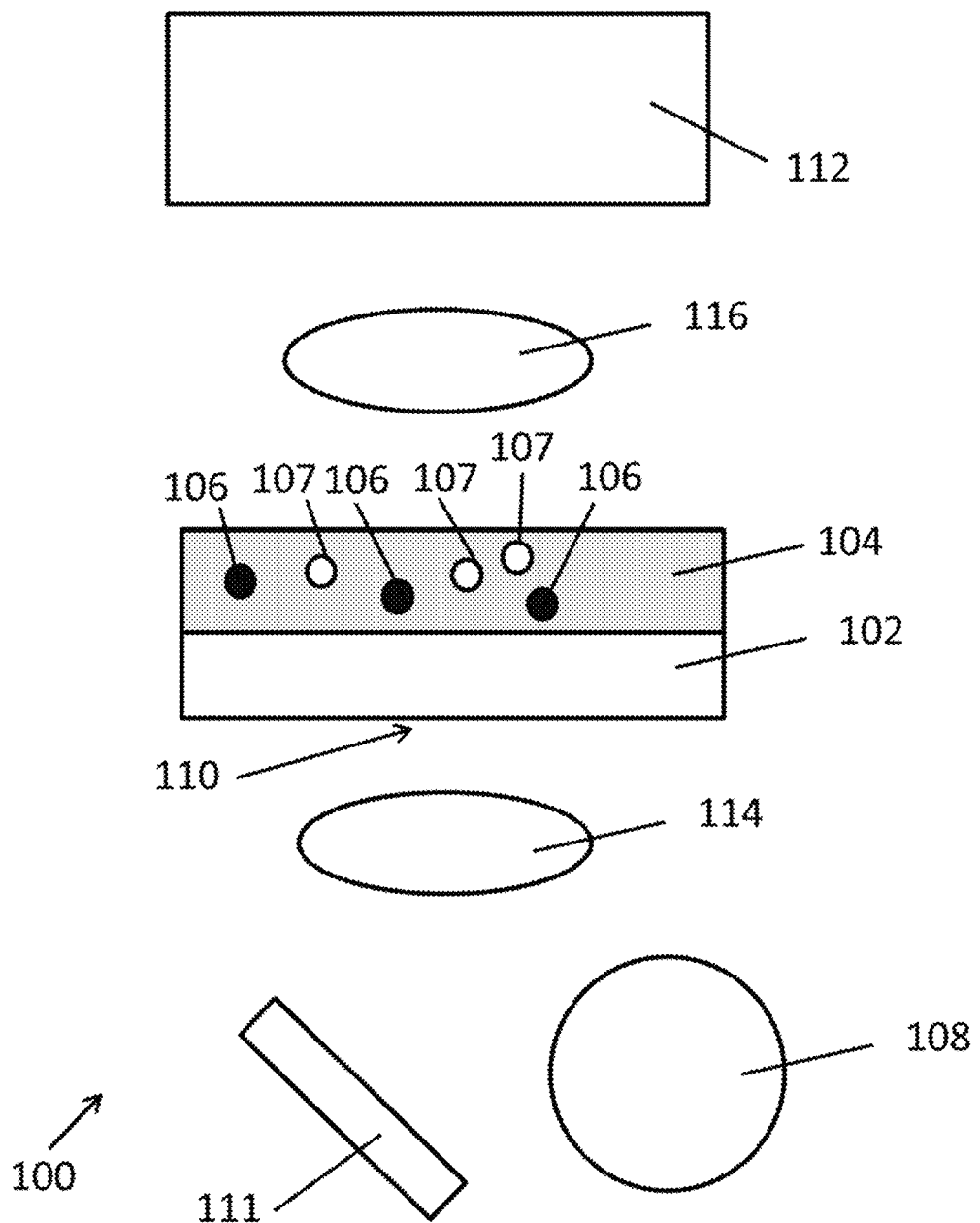
FIG. 5 is a schematic of an exemplary system as disclosed herein.

Referring now to FIG. 5, in some examples, the system 110 is aligned such that the light source 108 is below the first lens 114, the optothermal substrate 102 is above the first lens 114, the second lens 116 is above the optothermal substrate 102, and the instrument 112 is above the second lens 116.

Figure 6:
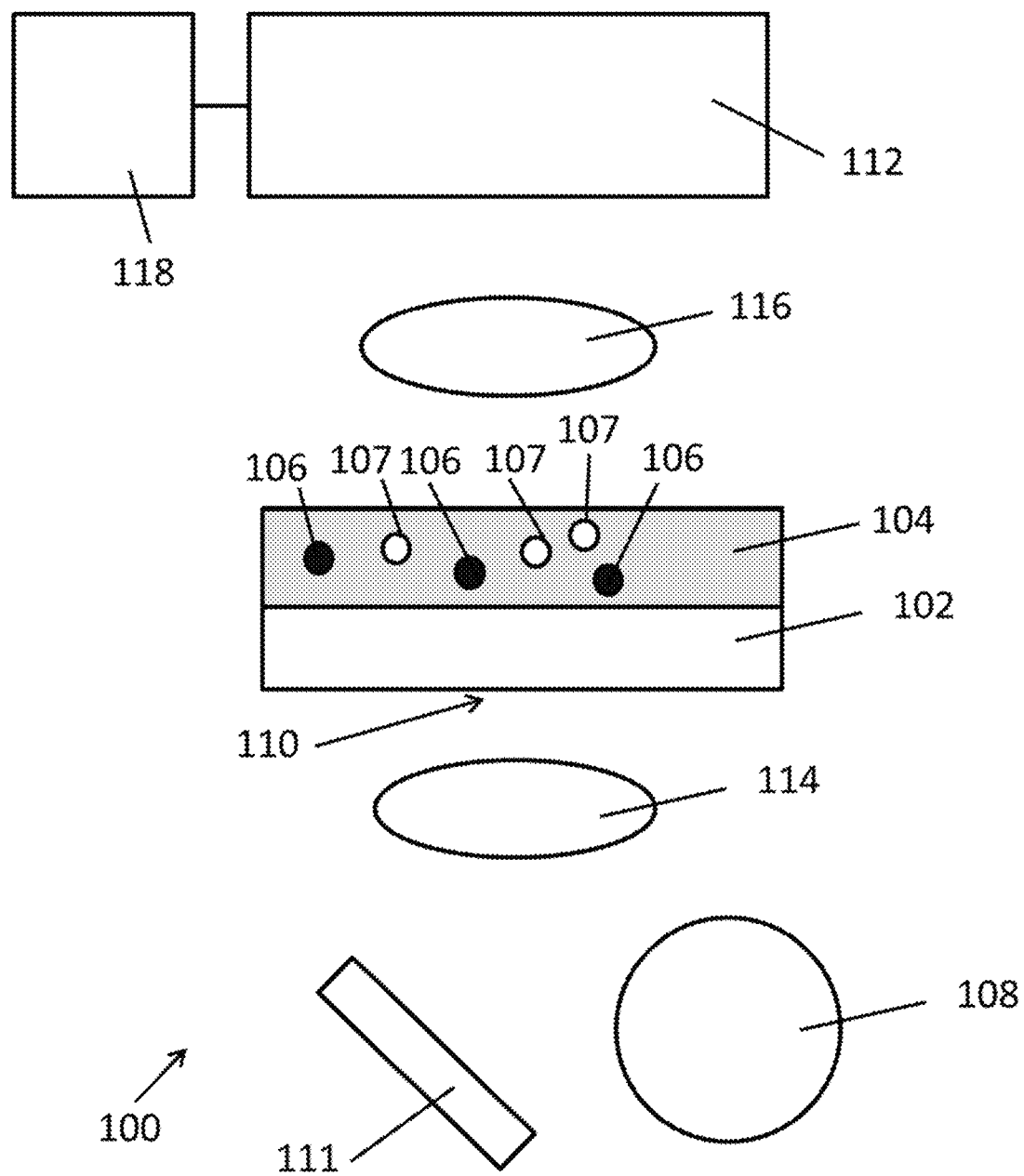
FIG. 6 is a schematic of an exemplary system as disclosed herein.

In some examples, the systems 110 can further comprise a computing device 118 configured to receive and process electromagnetic signals from the instrument 112, for example as shown in FIG. 6.

Figure 7:
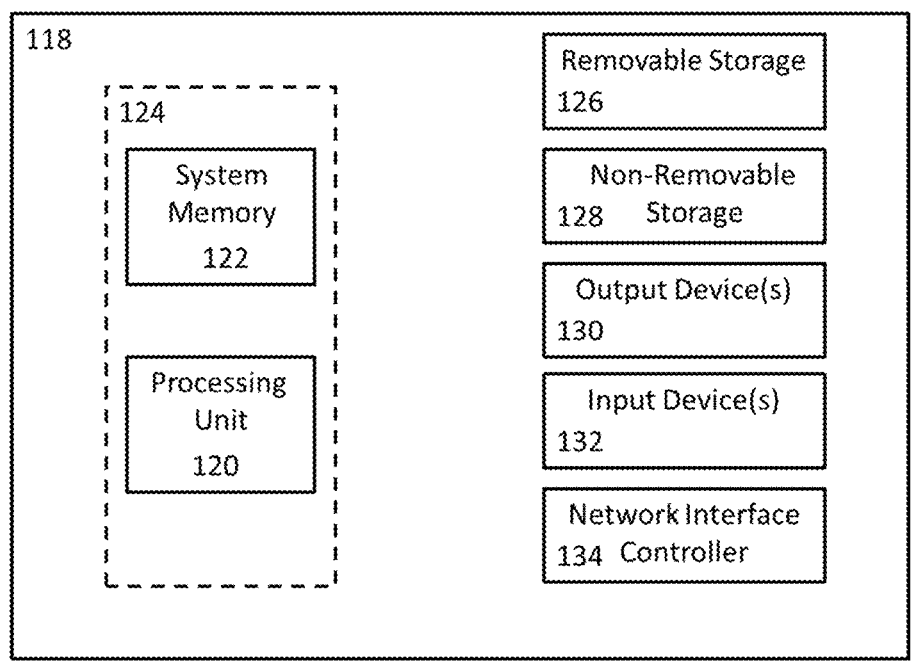
FIG. 7 is a schematic of an exemplary computing device.

FIG. 7 illustrates an example computing device 118 upon which examples disclosed herein may be implemented. The computing device 118 can include a bus or other communication mechanism for communicating information among various components of the computing device 118. In its most basic configuration, computing device 118 typically includes at least one processing unit 120 (a processor) and system memory 122. Depending on the exact configuration and type of computing device, system memory 122 may be volatile (such as random access memory (RAM)), non-volatile (such as read-only memory (ROM), flash memory, etc.), or some combination of the two. This most basic configuration is illustrated in FIG. 7 by a dashed line 124. The processing unit 120 may be a standard programmable processor that performs arithmetic and logic operations necessary for operation of the computing device 118.

The computing device 118 can have additional features/functionality. For example, computing device 118 may include additional storage such as removable storage 126 and non-removable storage 128 including, but not limited to, magnetic or optical disks or tapes. The computing device 118 can also contain network connection(s) 134 that allow the device to communicate with other devices. The computing device 118 can also have input device(s) 132 such as a keyboard, mouse, touch screen, antenna or other systems configured to communicate with the camera in the system described above, etc. Output device(s) 130 such as a display, speakers, printer, etc. may also be included. The additional devices can be connected to the bus in order to facilitate communication of data among the components of the computing device 118.

The processing unit 120 can be configured to execute program code encoded in tangible, computer-readable media. Computer-readable media refers to any media that is capable of providing data that causes the computing device 118 (i.e., a machine) to operate in a particular fashion. Various computer-readable media can be utilized to provide instructions to the processing unit 120 for execution. Common forms of computer-readable media include, for example, magnetic media, optical media, physical media, memory chips or cartridges, a carrier wave, or any other medium from which a computer can read. Example computer-readable media can include, but is not limited to, volatile media, non-volatile media and transmission media. Volatile and non-volatile media can be implemented in any method or technology for storage of information such as computer readable instructions, data structures, program modules or other data and common forms are discussed in detail below. Transmission media can include coaxial cables, copper wires and/or fiber optic cables, as well as acoustic or light waves, such as those generated during radio-wave and infra-red data communication. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processing unit 120 can execute program code stored in the system memory 122. For example, the bus can carry data to the system memory 122, from which the processing unit 120 receives and executes instructions. The data received by the system memory 122 can optionally be stored on the removable storage 126 or the non-removable storage 128 before or after execution by the processing unit 120.

The computing device 118 typically includes a variety of computer-readable media. Computer-readable media can be any available media that can be accessed by device 118 and includes both volatile and non-volatile media, removable and non-removable media. Computer storage media include volatile and non-volatile, and removable and non-removable media implemented in any method or technology for storage of information such as computer readable instructions, data structures, program modules or other data. System memory 122, removable storage 126, and non-removable storage 128 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 118. Any such computer storage media can be part of computing device 118.

It should be understood that the various techniques described herein can be implemented in connection with hardware or software or, where appropriate, with a combination thereof. Thus, the methods, systems, and associated signal processing of the presently disclosed subject matter, or certain aspects or portions thereof, can take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs can implement or utilize the processes described in connection with the presently disclosed subject matter, e.g., through the use of an application programming interface (API), reusable controls, or the like. Such programs can be implemented in a high level procedural or object-oriented programming language to communicate with a computer system. However, the program(s) can be implemented in assembly or machine language, if desired. In any case, the language can be a compiled or interpreted language and it may be combined with hardware implementations.

In certain examples, system memory 122 comprises computer-executable instructions stored thereon that, when executed by the processor 120, cause the processor 120 to receive an electromagnetic signal from the instrument 112, process the electromagnetic signal to obtain a characteristic of the optothermal substrate 102; and output the characteristic of the optothermal substrate 102.

The analysis of signals captured by the instrument can be carried out in whole or in part on one or more computing device. For example, the system may comprise one or more additional computing device.

In some examples, the electromagnetic signal received by the processor from the instrument can comprise an image, a spectrum (e.g., Raman, UV-vis, IR, fluorescence), a micrograph, or combinations thereof. The characteristic of the optothermal substrate can comprise, for example, the presence, location, size, shape, and/or quantity of a portion of the plurality of capped particles trapped within the confinement region; the presence, location, composition, size, shape, and/or quantity of plasmonic particles comprising the optothermal substrate; the presence, location, composition, size, shape, and/or quantity of plasmonic nanoholes comprising the optothermal substrate; the presence, location, composition, an/or thickness of the metal film comprising the optothermal substrate; or combinations thereof. In some examples, the characteristic of the optothermal substrate can be monitored over time, for example, to identify the effect of trapping the portion of the plurality of capped particles within the confinement region.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

Viewing colloidal particles as atoms, researchers have been exploring the assembly of these so called colloidal "atoms" into complex structures, known as colloidal matter. The colloidal matter also exhibits unique collective behavior beyond what occurs at the atomic scale, enabling new functions and devices (Manoharan V N. *Science* 2015, 349; Fan J A et al. *Science* 2010, 328, 1135-1138). Rationally designed assemblies of colloidal particles such as plasmonic Fano structures, Janus particle assemblies, and chiral clusters feature various distinct physical and chemical performances. The construction of colloidal assemblies and matter can be challenging due to the precise engineering of attractive interactions needed to induce the bonding between the colloidal particles. Intrinsic inter-particle attraction for colloidal bonding can be exploited, including electrostatic attraction, magnetic interaction, and hydrophobic attraction. Active colloidal particles responsive to an external electric field, magnetic field, or incident light can be manipulated by the external fields into targeted configurations followed by the bonding. Recent progress has shown that the colloidal particles regio-selectively modified with organic or biological molecules (e.g., DNA), also known as patchy colloids, can achieve directional bonding to control symmetry in the colloidal superstructures. Another strategy is to mix the colloidal particles with non-adsorbed polymer or small particles, which can induce depletion attraction between the colloidal particles due to the osmotic-pressure imbalance. Anisotropic depletion interactions have also been achieved for site-specific bonding.

With an ever-increasing interest to enrich the structures of colloidal matter for new properties and to understand the factors that determine their structures and dynamics, a versatile on-demand technique that can construct colloidal matter of arbitrary structures with colloidal particles of a wide range of sizes, materials and surface chemistry is highly desired. To develop such a technique will require progress in both colloid manipulation and bonding. Optical tweezers have proved effective in colloid manipulation (Grier D G. *Nature* 2003, 424, 810-816). However, the trapping and manipulation of nanoscale colloids with optical tweezers is challenging. Plasmonic tweezers can capture nanoscale particles using the plasmon-enhanced optical force, however, lack the capability for dynamic manipulation (Juan M L et al. *Nature Photon.* 2011, 5, 349-356).

Herein, a method of assembling colloidal matter in a modular brick like manner under a light-controlled temperature field is discussed. This modular brick like construction method for assembling colloidal matter can solve challenges in the existing assembly techniques. For example, the modular brick like construction method id applicable to diverse colloidal sizes (from sub-wavelength scale to micron scale) and diverse materials (polymeric, dielectric and metallic colloids), has tunable bonding strength and length, can be used to form versatile colloidal configurations (e.g., from one-dimensional (1D) configurations to three-dimensional (3D) configurations), and can be operated under low-power (100-1000 times lower than optical tweezers). Therefore, the modular brick like construction method can release the rigorous design rules required in the existing techniques and enrich the structural complexity in colloidal matter.

Figure 9:
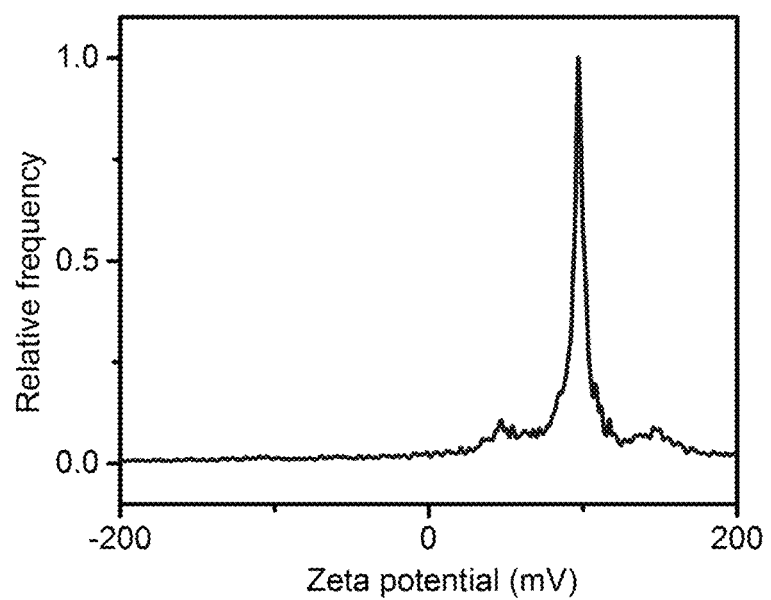
FIG. 9 is a plot of the Zeta potential of 2 µm polystyrene beads dispersed in 10 mM CTAC solution.

The general concept of the modular brick like construction method for colloidal matter is illustrated in FIG. 8a-FIG. 8h. First, looking at the macro scale modular brick assembly process, several components are required: the modular bricks as the building blocks, the interlocking features or linking components on the bricks, and a handling tools like to do the construction (FIG. 8a-FIG. 8d). To mimic the macro scale modular brick assembly process, the methods described herein used diverse colloidal particles as the building blocks (FIG. 8e). To enable bonding between the colloidal particles, an ionic surfactant, (e.g., cetyltrimethylammonium chloride (CTAC)) is added into the colloidal dispersion in a concentration above its critical micelle concentration ($c_{cmc}$, 0.13-0.16 mM). The ionic surfactant molecules can be adsorbed onto the colloidal particles to obtain charged surfaces, which in the case of CTAC will result in positively charged surfaces (FIG. 9). Meanwhile, the surfactant molecules not adsorbed onto the colloidal particles form charged micelles above $c_{cmc}$, which is termed ionic depletants, serving as the roles of both "macro ions" and "micellar depletants" (FIG. 8f). To optically manipulate the colloidal particles, a continuous-wave laser and an optothermal-responsive substrate (e.g., a plasmonic thin film (porous or continuous), such as Au thin film) was used to convert the photon energy of the laser to thermal energy (FIG. 8g). The colloidal particles are driven by the light-directed thermoelectric field and trapped at the hot regime. At the laser beam location, micellar depletion occurs to closely positioned colloidal particles, leading to bonding between the closely positioned colloidal particles and thus directional assembly. With the dynamic control of the laser beam, the colloidal particles can be arranged and assembled into different structures, as shown in FIG. 8h.

For the methods described herein, the substrates were prepared by depositing a 4.5 nm Au thin film on glass slides with thermal deposition (Denton thermal evaporator, base pressure: $9 \times 10^{-6}$ Torr) followed by thermal annealing at 550° C. for 2 hours.

The colloidal particles used herein include polystyrene beads, silica beads, gold nanospheres, or combinations thereof. The as-purchased polystyrene beads and silica beads (Bangs Laboratories, Inc.) were dispersed in cetyltrimethylammonium chloride (CTAC) solutions with a volume ratio of 1:20000. The as-purchased 200 nm gold nanospheres in phosphate-buffered saline (PBS) (0.1 mM, Sigma-Aldrich) were centrifuged for 10 min (4500 rpm) and re-dispersed in CTAC solutions with a volume ratio of 1:1000. For the assembly of hybrid colloidal structures, the polystyrene beads, silica beads, or centrifuged Au nanospheres were co-dispersed in the CTAC solutions. The colloidal dispersions were added onto the substrates with a chamber of 1 mm in thickness.

The optical setup for the modular brick like construction method of the colloidal matter included a 532 nm diode-pumped solid-state laser (Coherent, Genesis MX STM-1 W) expanded with a 5× beam expander and projected onto a digital micromirror device (DMD); the DMD was used to generate and project multiple laser beams onto the substrates. The optical images reflected off the DMD were focused onto the substrate, which was placed on a motorized stage. The size of the beam was reduced by 500 times after being relayed by a 1000 mm doublet lens, a 200 mm doublet lens, an infinity-corrected tube lens and a 40× objective (Nikon, NA 0.75) in a Nikon inverted microscope. For dark-field imaging, an air condenser was used to focus the incident white light onto the sample from the top and the scattering light was collected with the 40× objective from the bottom. A linear visible polarizer (Thorlabs) was inserted between the white light source and the condenser to control the incident light polarization. Either the DMD or the motorized stage was used to manipulate the trapped colloidal particles.

Figure 10:
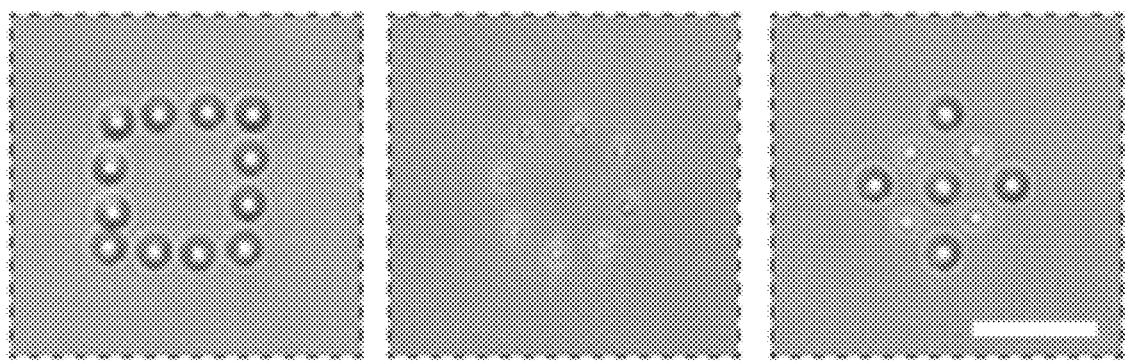
FIG. 10 shows optical images of parallel trapping of polystyrene beads with different sizes with a light-directed thermoelectric field. Scale bar: 10 µm.
Figure 11:
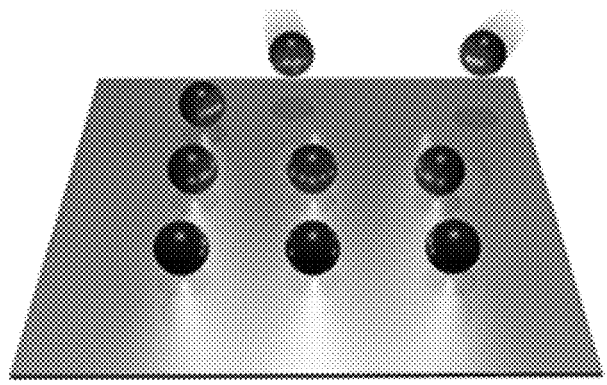
FIG. 11 is a schematic illustration of colloidal trapping with a light-controlled temperature field.
Figure 12:
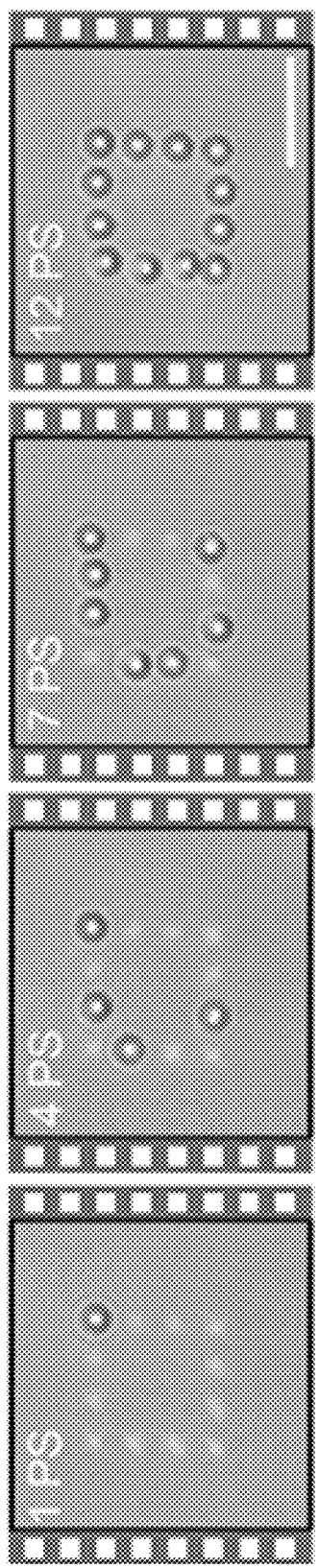
FIG. 12 shows parallel trapping by the light-controlled temperature field of twelve 2 µm polystyrene beads into a square. Scale bar: 10 µm.
Figure 13:
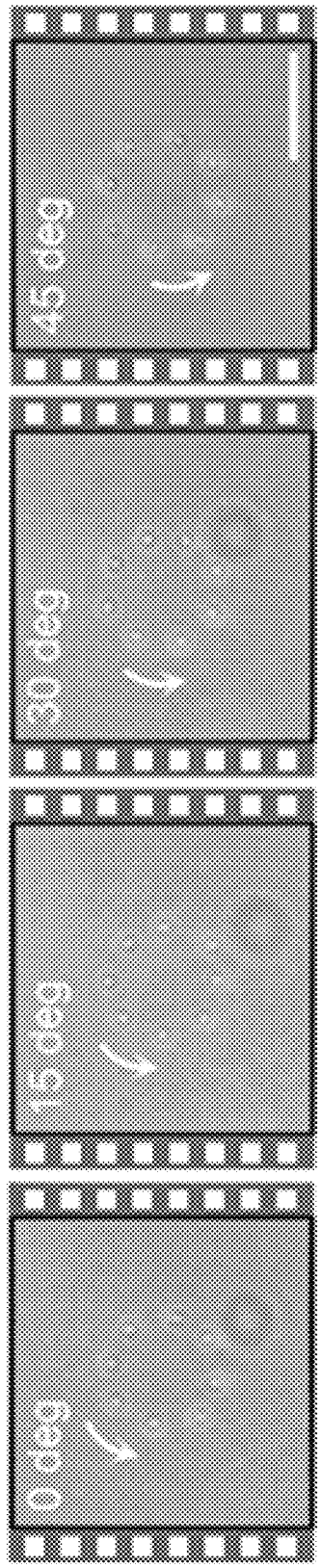
FIG. 13 shows rotation of eight 0.96 µm polystyrene beads by the light-controlled temperature field after being trapped in a circle by the light-controlled temperature field. Scale bar: 10 µm.
Figure 14:
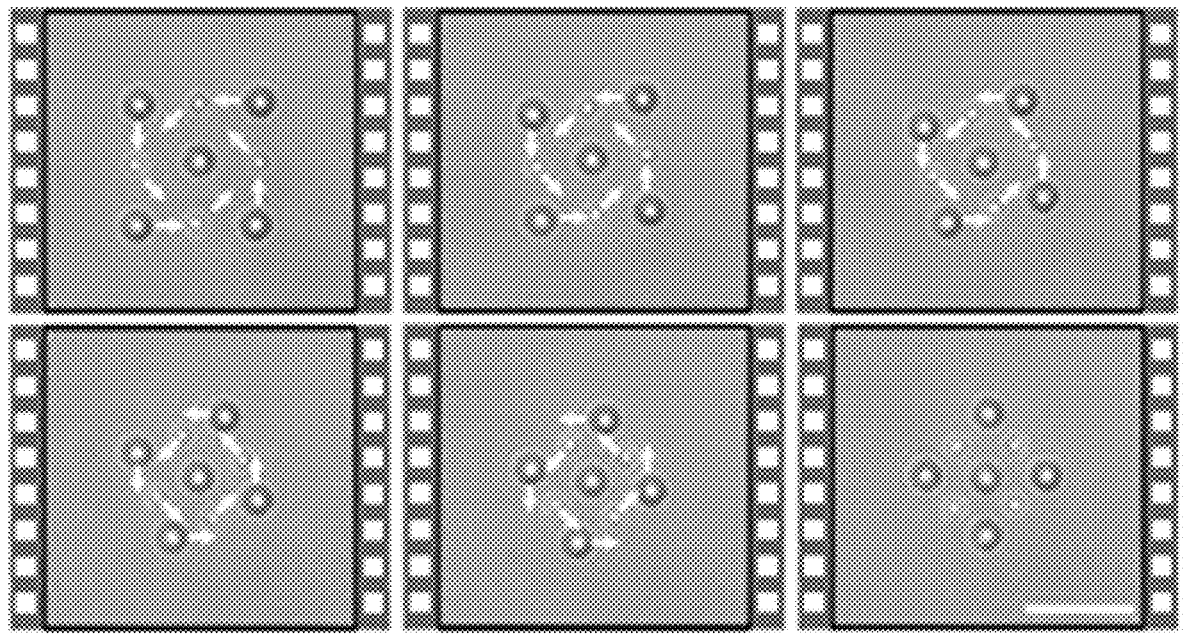
FIG. 14 shows the rotation of a hybrid pattern of trapped 2 µm and 0.96 µm polystyrene beads by the light-controlled temperature field. Scale bar: 10 µm.
Figure 15:
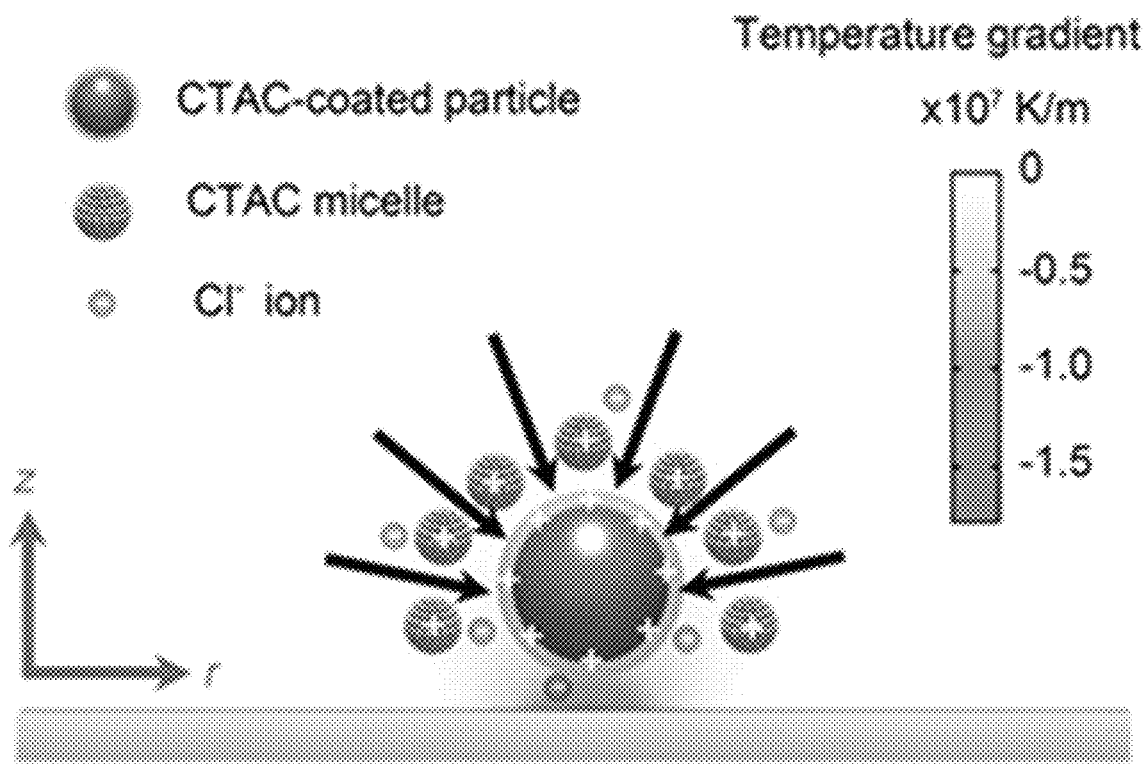
FIG. 15 is a schematic illustration of the working principle of the colloidal trapping with a light-directed thermoelectric field. The black arrows indicate the trapping force. The temperature gradient field along z axis is calculated when a laser beam with a diameter of 2 µm and an optical power of 0.253 mW is incident onto the substrate.

To demonstrate the parallel manipulation of colloidal particles, a digital micromirror device (DMD) was used to generate and project multiple laser beams on the gold plasmonic substrate to simultaneously capture and arrange polystyrene (PS) beads with diameters of 2 μm and 0.96 μm in designed patterns, as shown in FIG. 10 and FIG. 11. With the light-controlled temperature field, dynamic manipulation of the polystyrene beads was achieved (FIG. 12-FIG. 14). The laser heating of the gold plasmonic film generates a thermal "hot spot" on the substrate and creates an intense temperature gradient field (FIG. 15) due to the high opto-thermal conversion efficiency of the gold. Finite element method numerical simulations (COMSOL Multiphysics) were employed to analyze the temperature-gradient distribution around the laser beam focused at the substrate-water interface. For simplicity, a 2D axisymmetric model comprised of a glass substrate, an Au film, and water was established. Since the physics involved heat transfer in solids and fluids, the pre-defined conjugate heat transfer and Laminar flow models were used. A Gaussian distribution heat source was placed at the substrate-fluid interface to model the heating from the laser beam. Room temperature was set at all other boundaries.

Thermophoresis drives the highly charged CTAC micelles to the cold region with the thermal diffusion coefficient $D_T \propto \Psi_d^2$, where $\Psi_d$ is the surface potential of the micelles.

The charged micelles act as "macro ions" and introduce a thermoelectric field pointing from the cold regime to the hot regime, which drives the positively charged polystyrene beads to the laser spots with an electrostatic thermopotential $(\Delta T/T)\Psi_0$, where $\Delta T$ is the temperature difference, T is the temperature, and $\Psi_0$ is determined by the thermal diffusion coefficient of the ions. The trapping velocity of the polystyrene beads can be calculated with the Helmholtz-Smoluchowski electrophoretic mobility $\varepsilon\Psi_p/\eta$ (Lin L et al. *ACS Nano* 2016, 10, 9659-9668):

$$v = \varepsilon(\nabla T/T)\Psi_0\Psi_p/\eta \quad (1)$$

where ε is the dielectric constant of the solvent, η is viscosity, ∇T is the temperature gradient and $\Psi_p$ is the surface potential of the particles.

To further evaluate the trapping capability, the escape velocities of the trapped polystyrene beads were measured. The escape velocities of the trapped polystyrene beads were measured with a motorized sample stage with precise velocity control. A single polystyrene bead was trapped with a laser beam irradiated on the Au thin film substrate. A certain value of moving velocity of the sample stage was set to introduce a drag force on the trapped particle. The escape velocity was defined as the critical velocity when the trapping force of the particle was balanced by the drag force.

Figure 16:
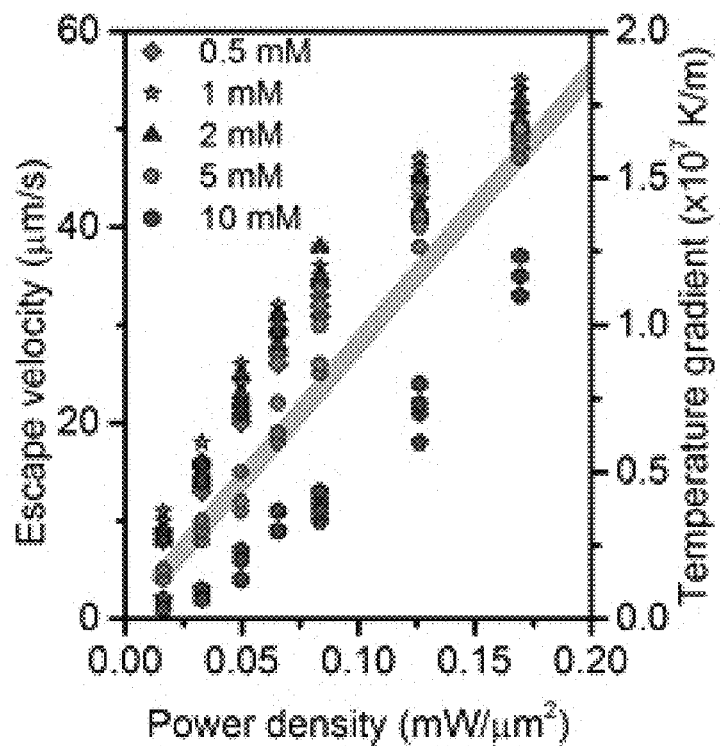
FIG. 16 shows the measured escape velocities of the trapped polystyrene colloidal particles with a 2 µm diameter. The line indicates the maximum temperature gradient along r axis (as shown in FIG. 15) as a function of the optical power.
Figure 17:
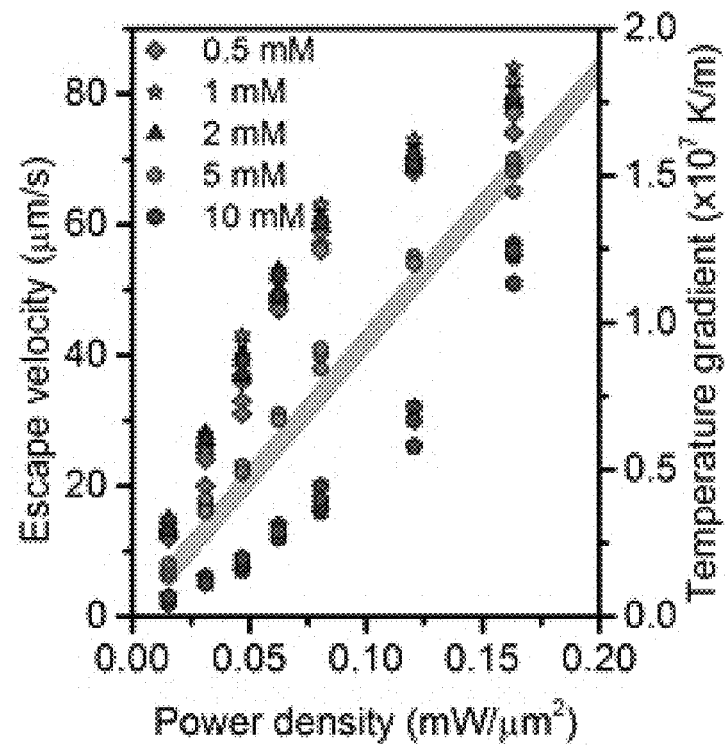
FIG. 17 shows the measured escape velocities of the trapped polystyrene colloidal particles with a 0.96 µm diameter. The line indicates the maximum temperature gradient along r axis (as shown in FIG. 15) as a function of the optical power.
Figure 18:
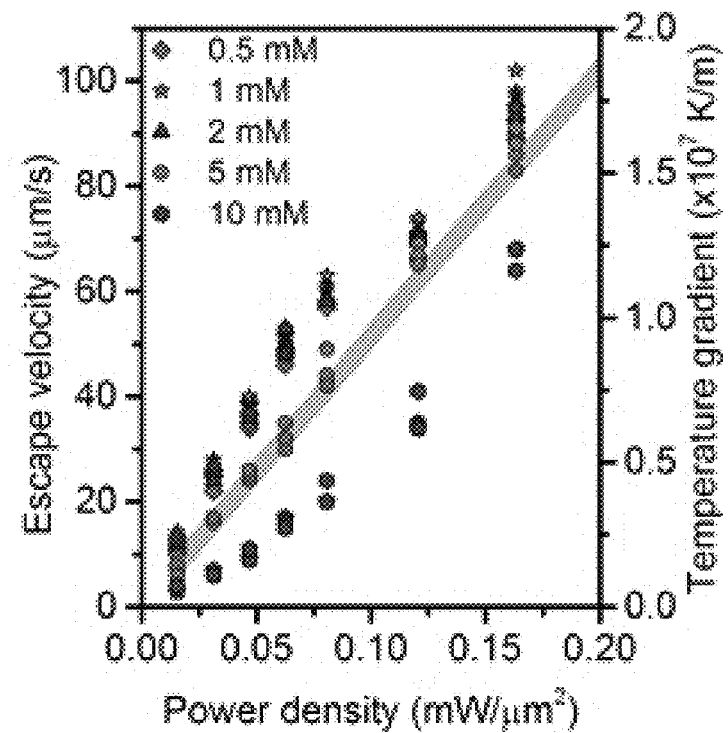
FIG. 18 shows the measured escape velocities of the trapped polystyrene colloidal particles with a 500 nm diameter. The line indicates the maximum temperature gradient along r axis (as shown in FIG. 15) as a function of the optical power.
Figure 19:
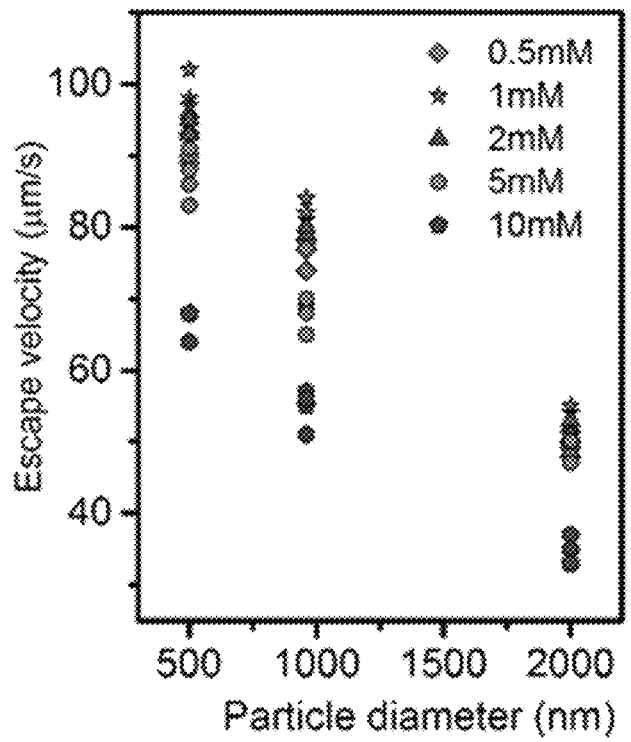
FIG. 19 shows the escape velocities of the trapped polystyrene bead as a function of the particle sizes at different CTAC concentrations, showing a decreased escape velocity with an increased particle size. The optical power: 0.17 mW/μm².
Figure 20:
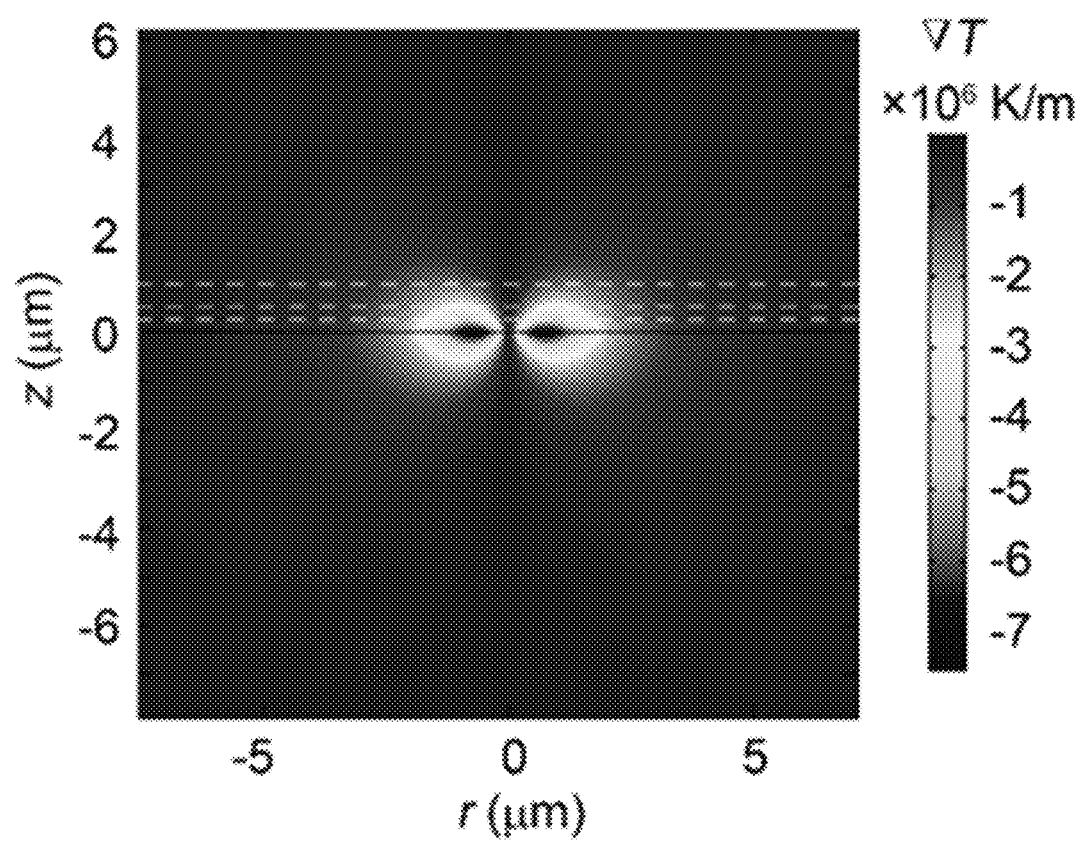
FIG. 20 shows the cross section of the simulated radial temperature gradient distribution. The white dashed lines indicate z=250 nm, 0.48 μm, and 1 μm, corresponding to the central locations of the 500 nm, 0.96 μm and 2 μm polystyrene beads, respectively. The maximum temperature gradient decreases when z is increased.

The escape velocities of the trapped polystyrene beads measured as a function of the optical power and the CTAC concentration are shown in FIG. 16-FIG. 18. An increase of optical power improves the escape velocity due to the increased temperature gradient ∇T (as shown by the lines in FIG. 16-FIG. 18). An increase of CTAC concentration improves the micelle concentration and the viscosity of the solvent. The former enhances thermoelectric field and the latter reduces the electrophoretic mobility of the colloidal particles, leading to the maximum escape velocity at ~1 mM CTAC. Surprisingly, the escape velocity and trapping stability significantly increase when the size of the trapped particles is decreased (FIG. 19), which can be attributed to the increased temperature gradient around the smaller particles (FIG. 20). Therefore, the light-controlled thermoelectric field can manipulate nanoscale particles at a much lower optical power than optical tweezers.

Figure 21:
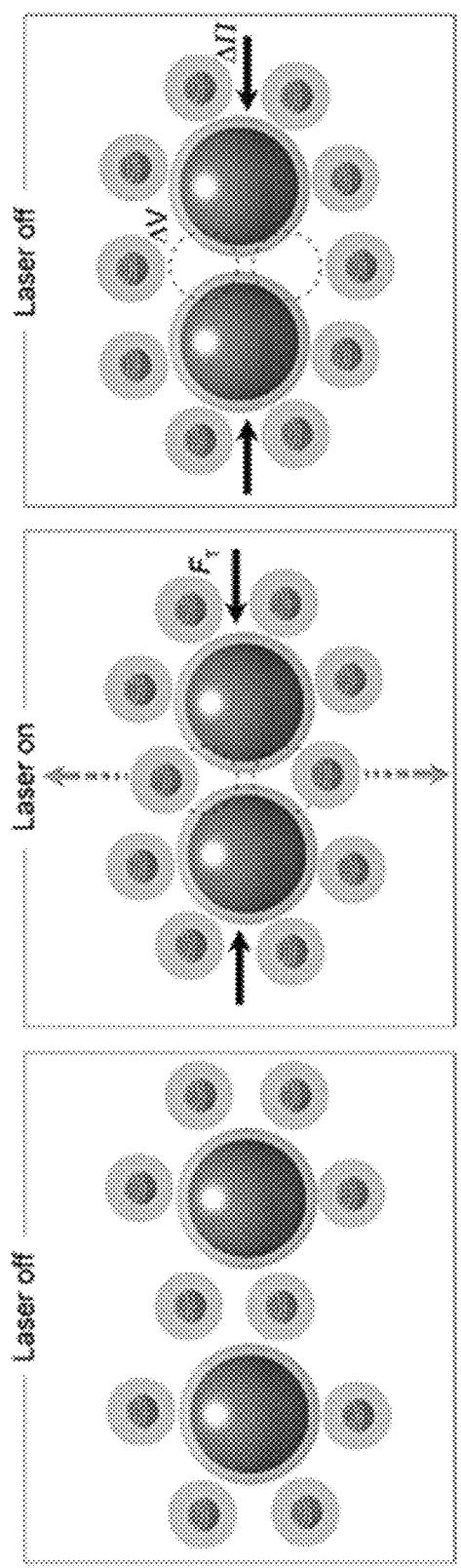
FIG. 21 is a schematic illustration of the depletion attraction between two colloidal particles, which is enhanced by the light-controlled temperature field.

With the achievement of manipulation of the colloidal particles, an attraction force between the colloidal particles is induced to bond them together. The bonding mechanism is illustrated in FIG. 21. Without any external energy, both the CTAC micelles and the colloidal particles are dispersed in the solvent in their free forms. Spontaneous self-assembly of the colloidal particles may happen if the depletants are driven outside the depletion region by the thermal perturbation and entropy. However, the bonding force is weak and the resultant colloidal assembly is unstable. When the laser beam illuminates two colloidal particles (middle panel of FIG. 21), the laser heating causes thermophoresis. Under the temperature field, the CTAC micelles migrate to the cold region and the colloidal particles migrate to the hot region with a trapping force $F_T$. As a result, the thermophoresis depletes the micelles at the particle-particle spacing with a depletion volume $\Delta V$ and an osmotic-pressure difference $\Delta\Pi$, which binds the colloids together with the depletion attraction force. Control experiments indicated that the particle-substrate depletion attraction is not the source of the trapping force. Briefly, use of an anionic surfactant (sodium dodecyl sulfate) and a non-ionic surfactant (Triton X-100) did not lead to colloidal trapping. After colloidal trapping, when the laser is turned off (right panel of FIG. 21), the thermoelectric field disappears and the bonding between the colloidal particles is retained once the depletion potential $U_d=-\Delta V\Delta\Pi$ overcomes the electrostatic repulsive interaction $U_e$.

To further elucidate the bonding between the colloidal particles, the total interaction potential between two polystyrene beads at various CTAC concentrations was calculated. To estimate the total interaction potential $U_{total}$ between colloidal particles, electrostatic interaction $U_e$, Van der Waals interaction $U_v$, and depletion attraction $U_d$ were considered:

$$U_{total}=U_e+U_v+U_d$$

The electrostatic interaction between two polystyrene beads is (Russel W B et al. *Colloidal Dispersions*. Cambridge University Press: Cambridge, 1989):

$$U_e = 32\pi\varepsilon r_p \left(\frac{k_BT}{ze}\right)^2 \left[\tanh\left(\frac{ze\Psi_p}{4k_BT}\right)\right]^2 \exp(-\kappa d)$$

where $\varepsilon$ is the solvent permittivity, $r_p$ is particle radius, $k_B$ is the Boltzmann constant, T is the absolute temperature, z is the particle charge valence, e is the elemental charge, $\psi_p$ is the surface potential of the particle, $\kappa$ is the inverse Debye length determined by the ionic strength, and d is the particle surface-to-surface distance. Above the critical micelle concentration ($c_{cmc}$, ~0.13 for CTAC) (Pignolet C et al. *J Colloid Interface Sci* 2010, 349(1), 41-48), $\kappa$ is a function of $c_{cmc}$ and the CTAC concentration (Tulpar A et al. *Langmuir* 2001, 17(26), 8451-8454):

$$\kappa=[N_Ae^2/ek_BT(\Sigma z_ic_{cmc}+(c_s-c_{cmc})\omega)]^{1/2}$$

where $N_A$ is the Avogadro's number, $z_i$ is the valence of the surfactant cations and counterions, $c_s$ is the CTAC concentration, and $\omega$ is the fraction of dissociated counterions, which is estimated as 0.25.

Figure 22:
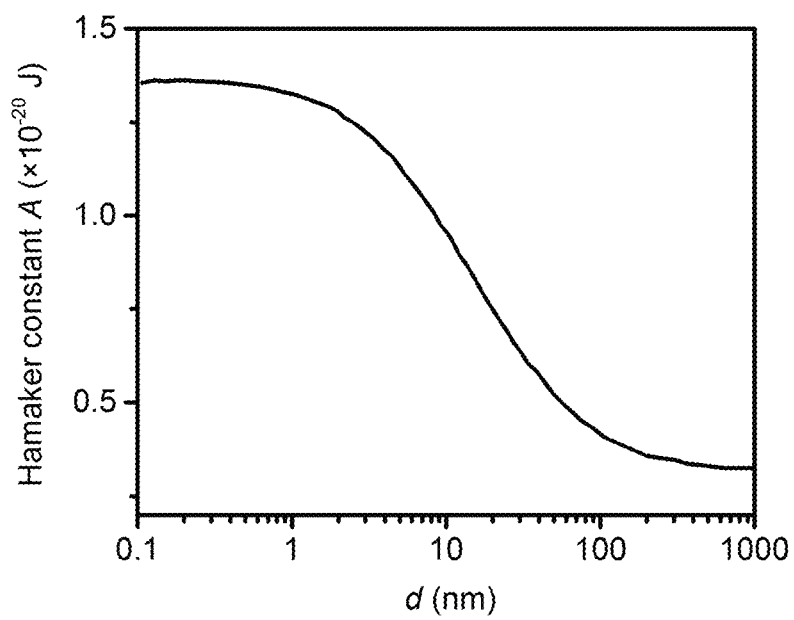
FIG. 22 shows the retarded Hamaker constant between two polystyrene beads in deionized (DI) water as a function of the interparticle distance.

The Van der Waals interaction between two polystyrene beads is (Derjaguin B V et al. *Surface force*. Springer: New York, 1987):

$$U_v = -\frac{Ar_p}{12d}$$

where A is the Hamaker constant, which is a function of d due to the retardation effect. Since a wide range of interparticle distances is considered herein, a fully retarded Hamaker constant between two polystyrene beads in deionized (DI) water is taken into consideration (Prieve D C and Russel W B. *J Colloid Interface Sci* 1988, 125(1), 1-13), as plotted in FIG. 22.

To interpret the depletion attraction between colloidal particles at the existence of CTAC surfactants, three factors were considered: (1) the micelles cannot be completely excluded from the depletion region in contrast to hard spheres; (2) the CTAC surfactants cannot be treated as non-absorbed molecules; (3) the electrostatic interaction exists between CTAC micelles and the particles (i.e., depletant-particle interaction). The depletion attraction is calculated with the depletion volume $\Delta V$ and the osmotic-pressure difference $\Delta\Pi$:

$$U_d=-\Delta V\Delta\Pi$$

Figure 23:
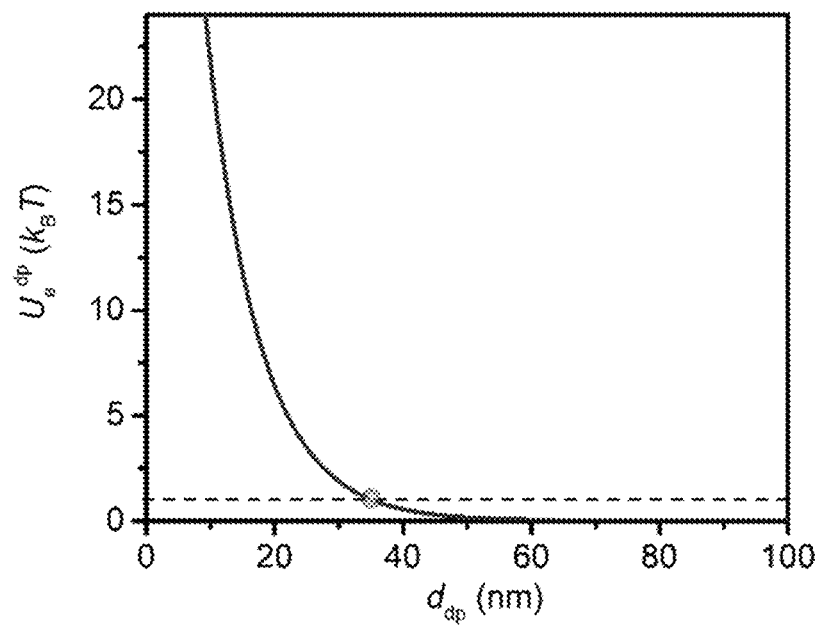
FIG. 23 shows the electrostatic interaction potential between the CTAC micelle and the polystyrene bead as a function of the micelle-particle distance. The dashed curves shows $U_e^{dp}=1$ $k_BT$ and the blue ball indicates the intersection point.

The depletion volume is (Iracki T D et al. *Langmuir* 2010, 26(24), 18710-18717; Edwards T D et al. *Langmuir* 2012, 28(39), 13816-13823):

$$\Delta V=\pi[(4/3)(r_p+r_d^{eff})^3(1-(3/4)(r_p+r_d^{eff}+d)(r_p+r_d^{eff})^{-1}+ (1/16)(r_p+r_d^{eff}+d)^3(r_p+r_d^{eff})^{-3})]$$

where $r_d^{eff}$ is the effective micelle radius of the CTAC micelles, which is:

$$r_d^{eff}=r_d+m\kappa^{-1}$$

where $r_d$ is the hard-sphere radius of the micelles and m is an additional factor that arises from the micelle-particle interaction. To estimate the depletion radius, the electrostatic interaction between the CTAC micelles and the charged polystyrene beads was calculated:

$$U_e^{dp} = 4\pi\varepsilon\Psi_d\Psi_p\frac{r_dr_p}{(r_d+r_p+d_{dp})}\exp(-\kappa d_{dp})$$

where $\psi_d$ is the surface potential of the CTAC micelles, and $d_{dp}$ is the surface-to-surface distance between the micelle and the polystyrene bead. For the 2 μm polystyrene beads in 10 mM CTAC solution, the potential as a function of the micelle-particle distance is shown in FIG. 23. The effective micelle-particle distance is estimated at $U_e^{dp}=1$ $k_BT$, suggesting that m=4.2.

The osmotic-pressure difference $\Delta\Pi$ is a function of the micelle number density n:

$$\Delta\Pi=\beta nk_BT$$

where $\beta$ is introduced as the depletion fraction because the micellar depletants are much softer than the hard spheres. A fitting with the experimental data gives $\beta$~0.15. n is given by:

$$n = \frac{N_A}{N_{agg}}(c_s - c_{cmc})$$

where $N_{agg}$ is the aggregation number of the CTAC micelles (Roelants E et al. *Langmuir* 1987, 3(2), 209-214).

Figure 24:
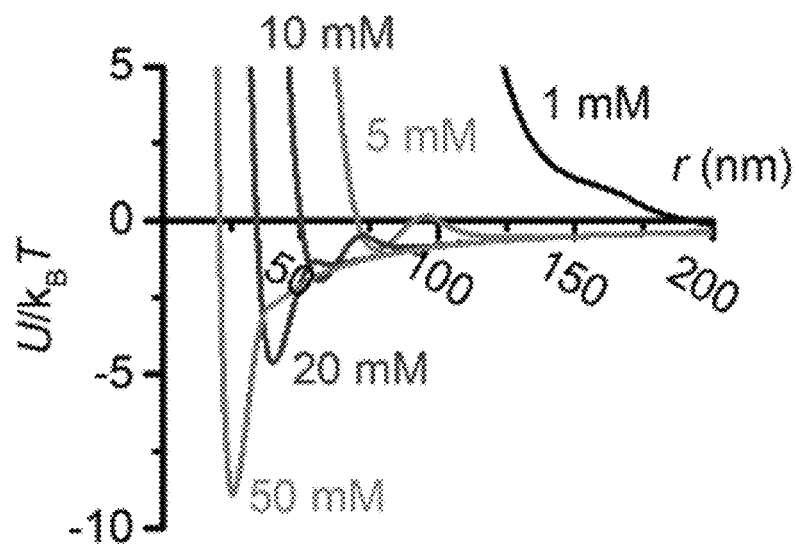
FIG. 24 shows the calculated interaction potential between two polystyrene beads with a diameter of 2 μm.
Figure 25:
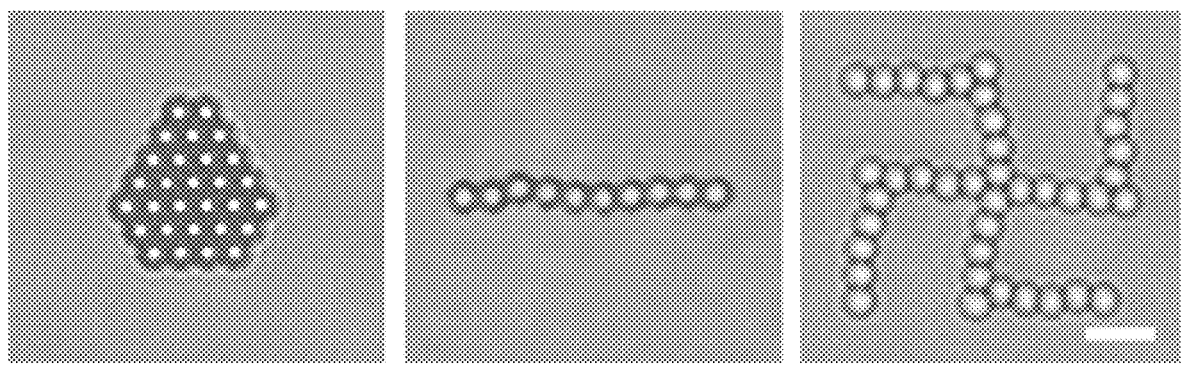
FIG. 25 shows optical images of colloidal superstructures of polystyrene beads with a diameter of 2 μm. Scale bar: 5 μm.
Figure 26:
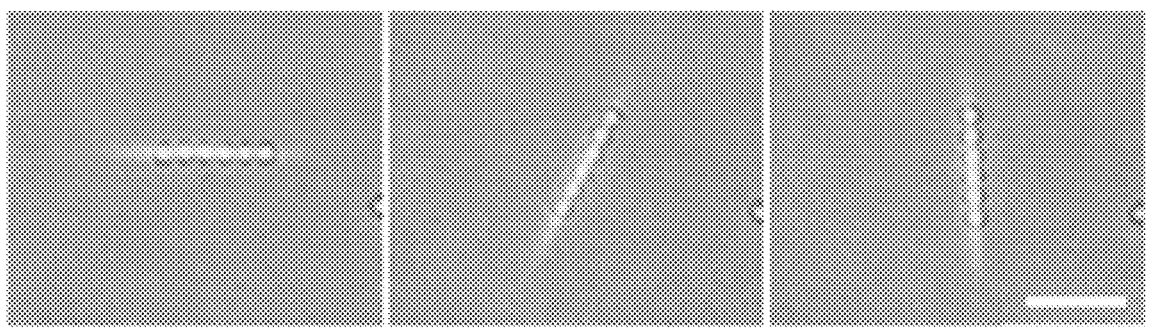
FIG. 26 shows bright-field optical images of the trapping and rotation of six 2 μm polystyrene beads with a 1D optical image. Scale bar: 10 μm.
Figure 27:
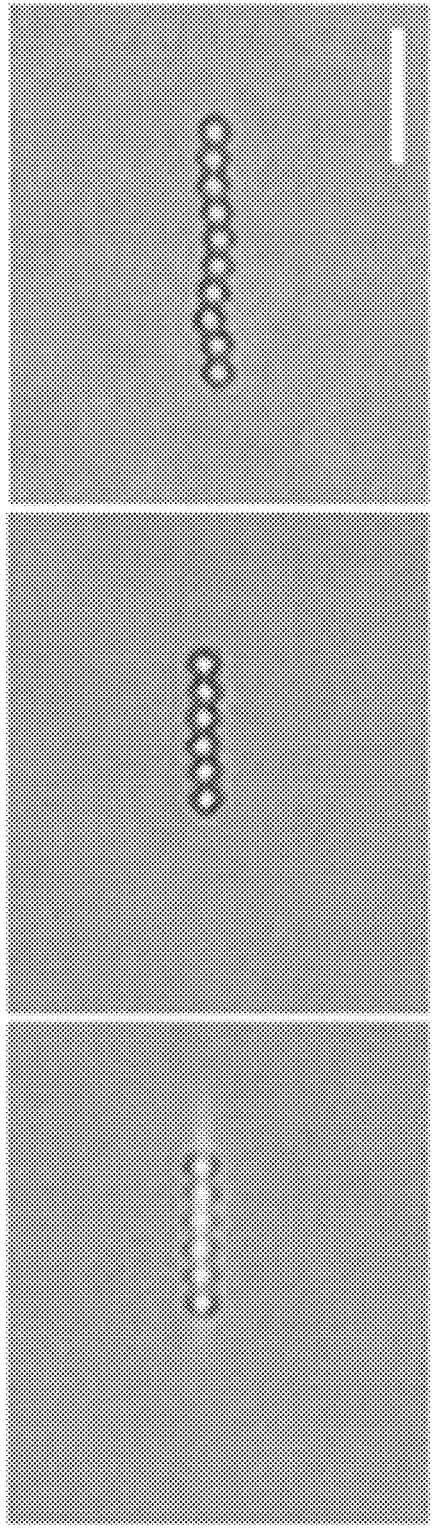
FIG. 27 shows bright field optical images of a 1D assembly of colloidal particles is maintained after the laser is turned off. The colloidal chain is elongated by adding polystyrene beads into the chain. Scale bar: 10 μm.
Figure 28:
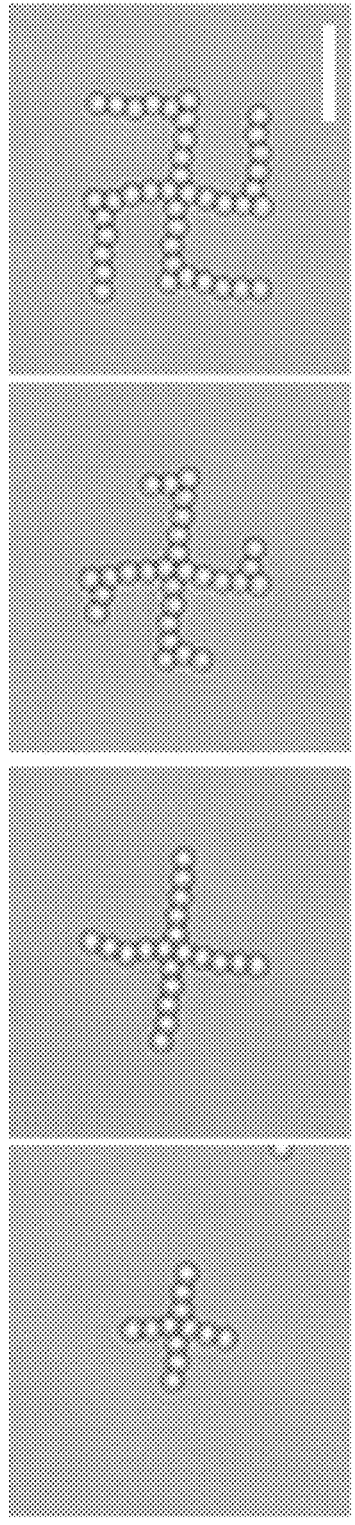
FIG. 28 shows the assembly of a chiral structure of 2 μm polystyrene beads. Scale bar: 10 μm.
Figure 29:
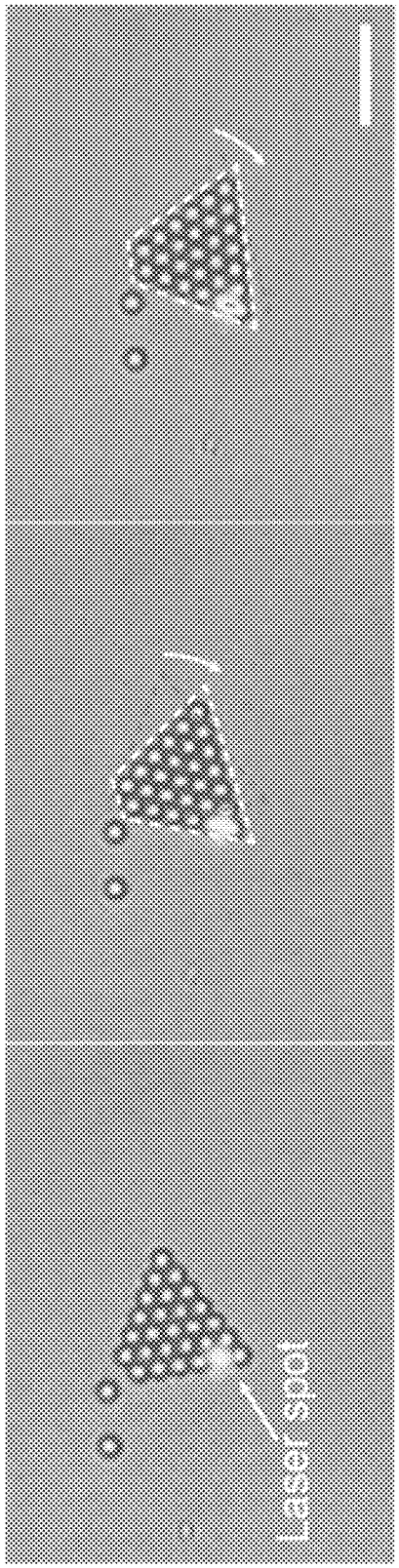
FIG. 29 shows the rotation of 2D assembly of 2 μm polystyrene beads. Scale bar: 10 μm.

In summary, the total interaction potential between two polystyrene beads at various CTAC concentrations was calculated and said calculations considered the micelle-particle interaction with an effective micelle radius $r_d^{eff}$ and the softness of the micelles with a depletion fraction $\beta$. A decreased minimum interaction potential occurs at the smaller bonding length when the CTAC concentration is increased, which improves the osmotic-pressure difference $\Delta\Pi$ and the ionic strength. For 2 μm polystyrene beads (FIG. 24), a stable colloidal bonding occurs at the bonding length of 56 nm when the CTAC concentration is 10 mM. The bonding becomes stronger with the shorter bonding length when the CTAC concentration is further increased. With the light-controlled colloidal manipulation and bonding, the modular brick-like construction of both thermodynamically stable close-packed colloidal assembly and thermodynamically unstable 1D chain and chiral structure of colloidal particles were demonstrated, as shown in the right panels of FIG. 25 and in FIG. 26-FIG. 28. These colloidal superstructures retain after the laser is turned off, which can be further manipulated by the light-controlled thermoelectric field (FIG. 29).

Figure 30:
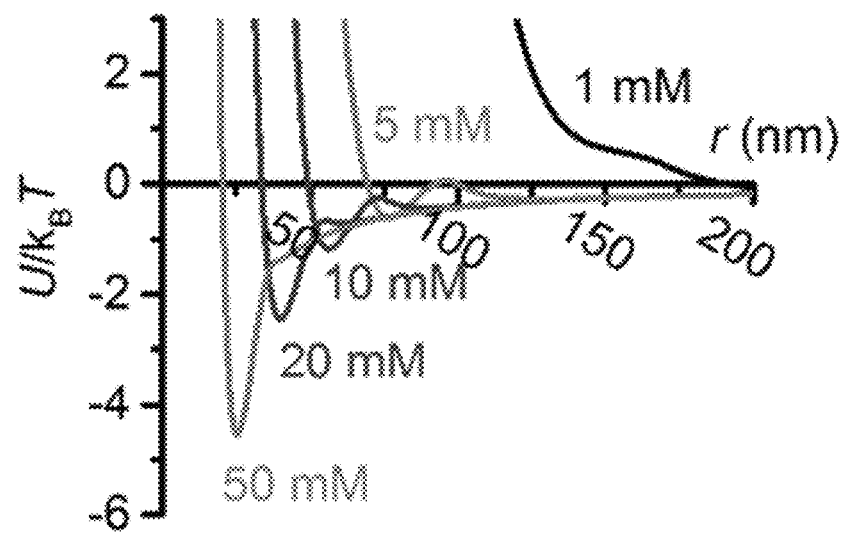
FIG. 30 shows the calculated interaction potential between two polystyrene beads with a diameter of 0.96 μm.
Figure 31:
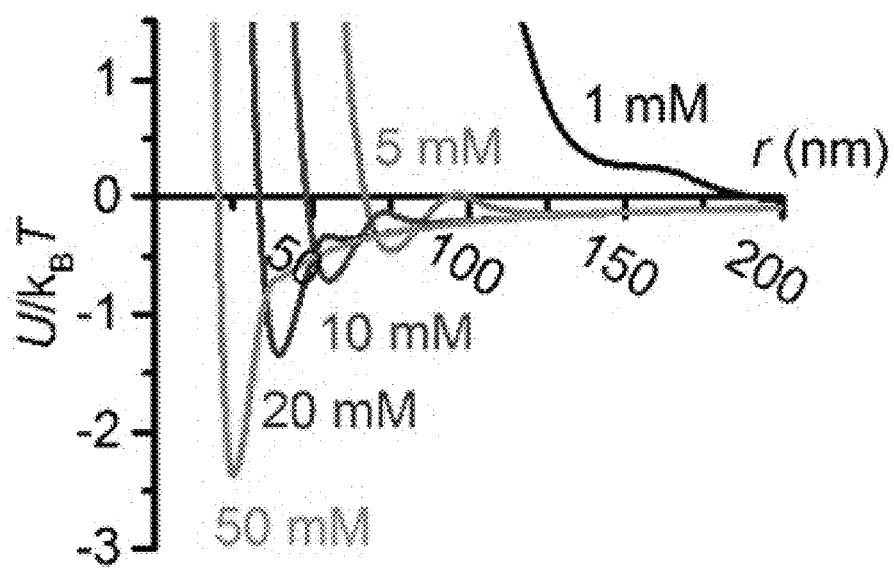
FIG. 31 shows the calculated interaction potential between two polystyrene beads with a diameter of 500 nm.
Figure 32:
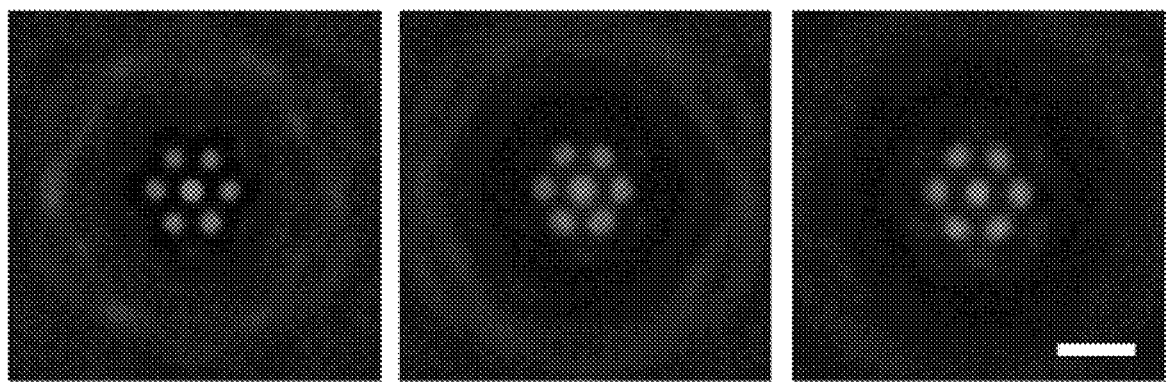
FIG. 32 shows optical images of colloidal superstructures of polystyrene beads with a diameter of 0.96 μm. The optical images are recorded at the blue (left panel), green (middle panel), and red (right panel) channels and with the distances between the focus plane of the 100× objective (NA: 0.9) and the substrate as 12.275, 13.125 and 13.950 μm, respectively. Scale bar: 2 μm.

For the smaller polystyrene beads (FIG. 30 and FIG. 31), the critical CTAC concentration for the stable colloidal bonding is increased. A heptamer with 0.96 μm polystyrene beads was built at a bonding length of 40 nm using a CTAC concentration of 20 mM. As shown in the right panels of FIG. 32, the two-dimensional (2D) heptamer of colloidal particles exhibits interesting light transmission and focusing properties, where the observed color of transmitted light depends on the objective (or detector) location.

Figure 33:
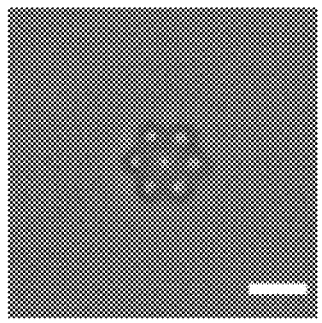
FIG. 33 is a bright-field optical image (transmission mode) of a heptamer assembled from seven 0.96 μm polystyrene beads recorded with a 40× objective (NA: 0.75). Scale bar: 2 μm.
Figure 34:
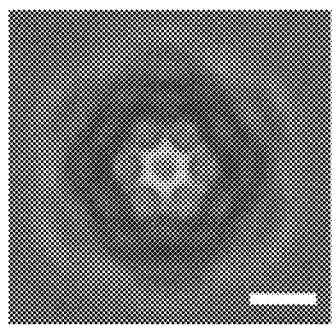
FIG. 34 is an optical image of a heptamer assembled from seven 0.96 μm polystyrene beads recorded with a 100× objective (NA: 0.9), with the distance between the focus plane of the objective and the substrate of 10.675 μm. Scale bar: 2 μm.
Figure 35:
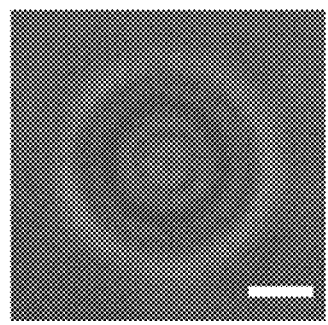
FIG. 35 is an optical image of a single 0.96 μm polystyrene recorded with a 100× objective (NA: 0.9), with the distance between the focus plane of the objective and the substrate of 10.675 μm. Scale bar: 2 μm.
Figure 36:
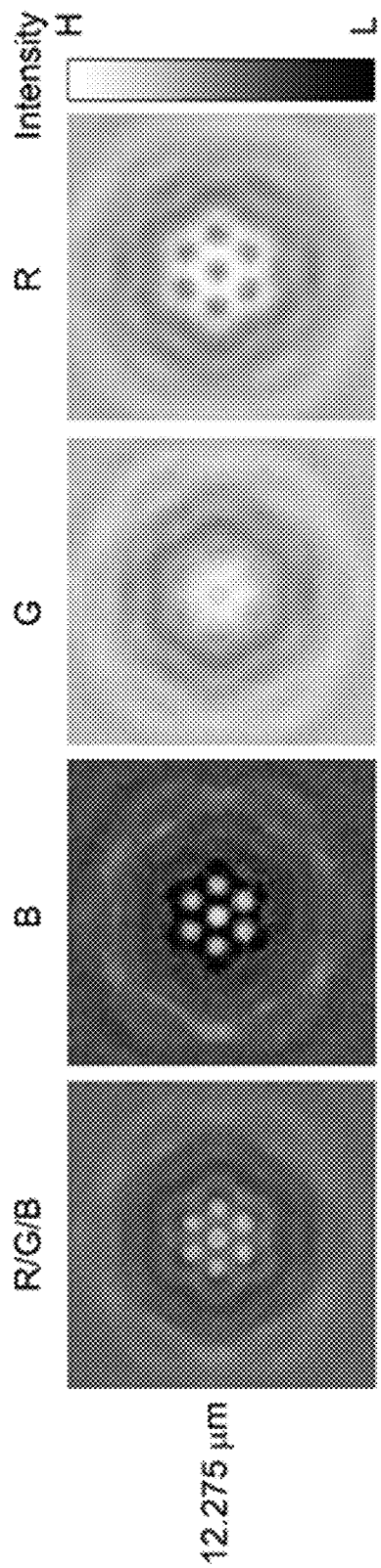
FIG. 36 shows the optical images of a heptamer assembled from seven 0.96 μm polystyrene beads recorded with the 100× objective (NA: 0.9) are decomposed with different channels: blue (B), green (G) and red (R) to show its transmittance in different channels. The distance between the focus plane of the objective and the substrate is 12.275 μm. A halogen white light source was used for the imaging. Scale bar: 2 μm.
Figure 37:
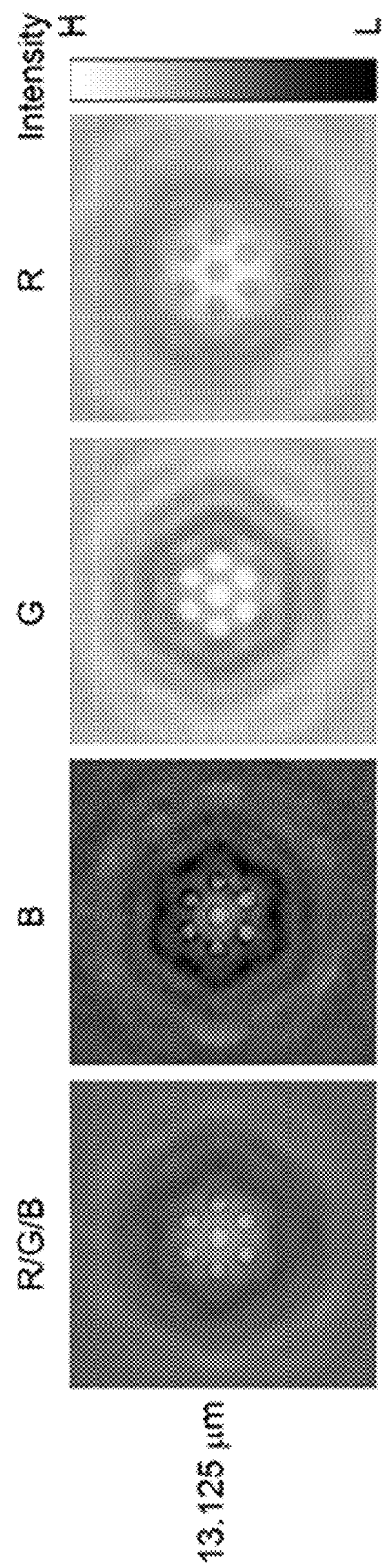
FIG. 37 shows the optical images of a heptamer assembled from seven 0.96 μm polystyrene beads recorded with the 100× objective (NA: 0.9) are decomposed with different channels: blue (B), green (G) and red (R) to show its transmittance in different channels. The distance between the focus plane of the objective and the substrate is 13.125 μm. A halogen white light source was used for the imaging. Scale bar: 2 μm.
Figure 38:
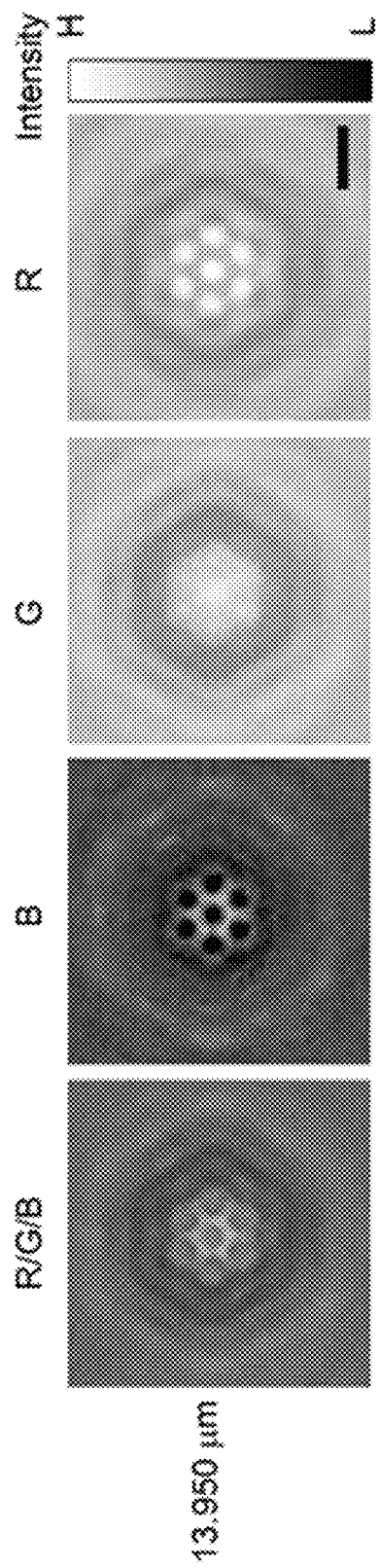
FIG. 38 shows the optical images of a heptamer assembled from seven 0.96 μm polystyrene beads recorded with the 100× objective (NA: 0.9) are decomposed with different channels: blue (B), green (G) and red (R) to show its transmittance in different channels. The distance between the focus plane of the objective and the substrate is 13.950 μm. A halogen white light source was used for the imaging. Scale bar: 2 μm.

The light-transmission characteristics of a heptamer assembled from seven 0.96 μm polystyrene beads, as shown in FIG. 33, were studied. The spherical polystyrene beads can act as micro-lenses to focus light. The focused light by individual micro-lenses in the assembly can interact to exhibit interesting optical phenomena. As shown in FIG. 34, a 100× objective with the numerical aperture (NA) of 0.9 was used to record the transmission of white light through the heptamer assembly, with the distance between the focus plane of the objective and the substrate of 10.675 μm, with an intense orange color observed through the polystyrene beads. For comparison, the optical image of a single 0.96 μm polystyrene bead was also recorded, which does not show similar color effect (FIG. 35). To analyze the color effect of the assembly, the optical images recorded with the distance between the focus plane of the objective and the substrate of 12.275 μm, 13.125 μm, and 13.950 μm were decomposed with different color channels, as shown in FIG. 36-FIG. 38, respectively. In FIG. 36, where the distance between the focus plane of the objective and the substrate was 12.275 μm, an enhanced transmission was observed in the blue channel, while no obvious enhanced transmission was observed in the green channel and a suppressed transmission was observed in the red channel, which led to a blue color in the optical image recorded in all the channels. When the distance between the focus plane of the objective and the substrate was increased, the wavelength of the extracted light redshifted, with an enhanced transmission in the green and red regions, respectively, and resulted in an intense green and orange color through the polystyrene beads, as shown in FIG. 37 and FIG. 38, respectively.

Figure 39:
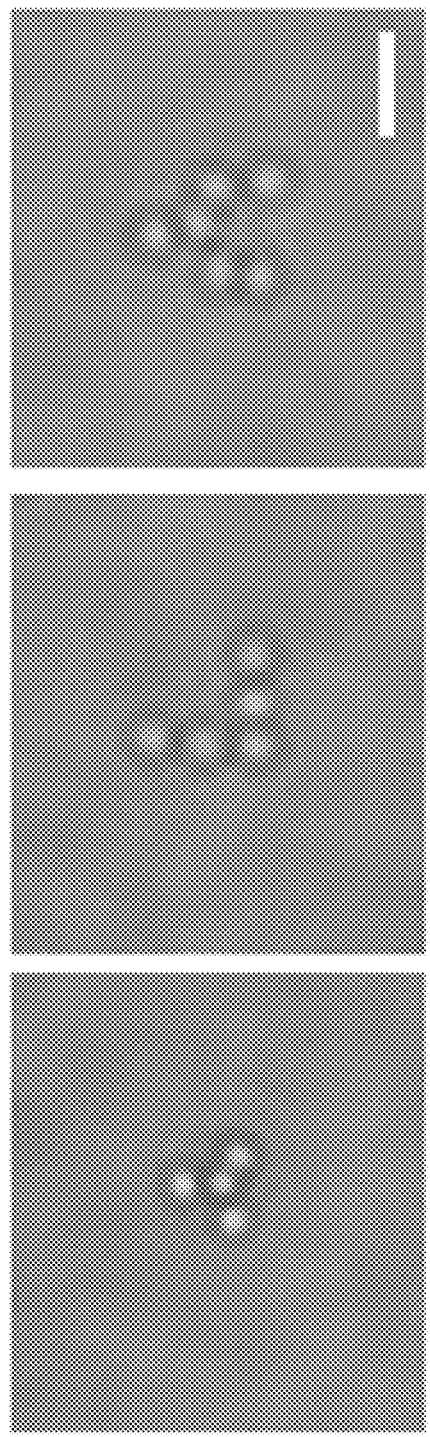
FIG. 39 shows the optical images of colloidal superstructures of polystyrene beads with a diameter of 500 nm. Scale bar: 2 μm.

To demonstrate the bonding between nanoscale colloidal particles, 500 nm polystyrene beads were assembled into various thermodynamically unstable colloidal superstructures at a bonding length of 25 nm in 50 mM CTAC solution, as shown in the right panels of FIG. 39.

Figure 40:
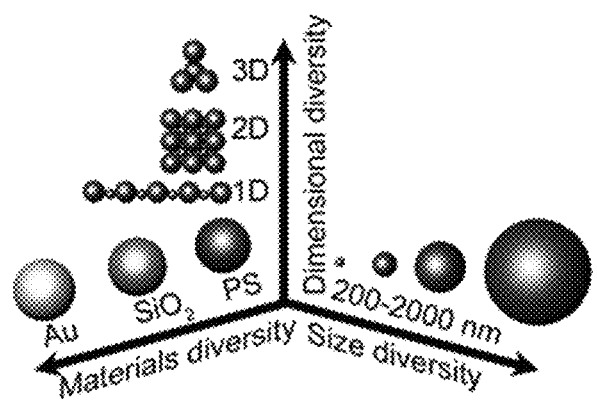
FIG. 40 is a schematic illustration of the general applicability of the concept of modular brick like construction of assemblies of colloidal particles.
Figure 41:
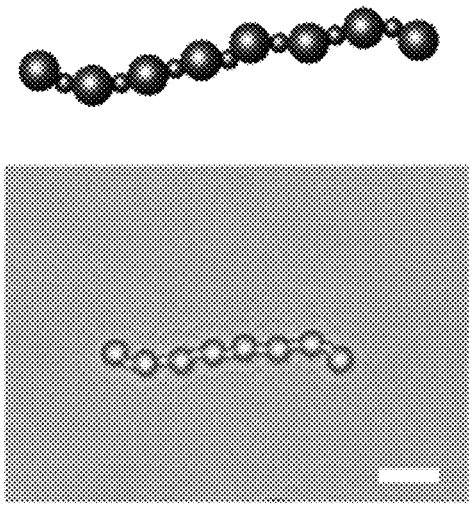
FIG. 41 shows a schematic illustration (top panel) and bright-field optical image (bottom panel) of a 1D hybrid assembly of 2 μm and 0.96 μm polystyrene beads. Scale bar: 5 μm.
Figure 42:
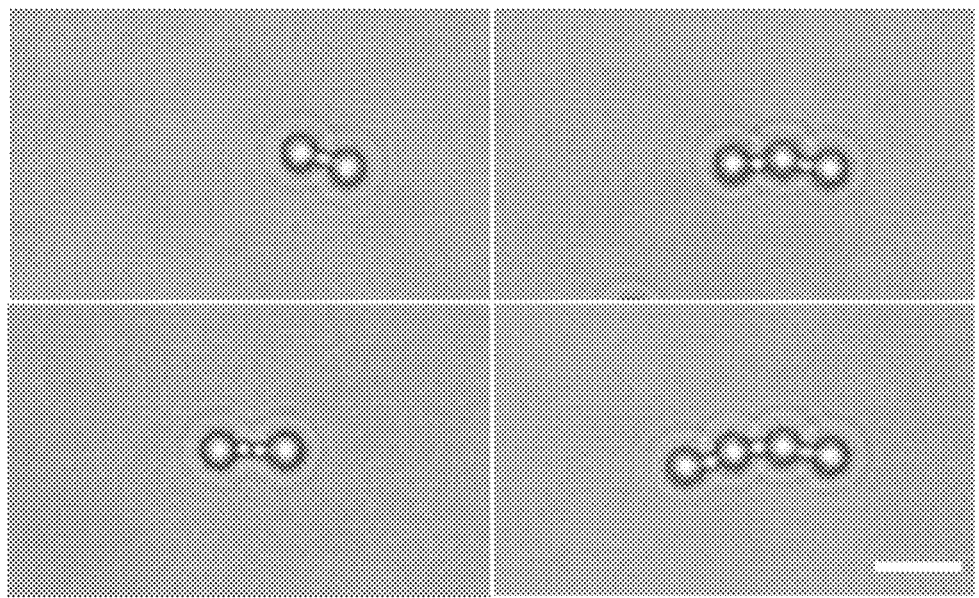
FIG. 42 shows the assembly of heterogeneous 1D chains of 2 μm and 0.96 μm polystyrene beads. Scale bar: 5 μm.

To examine the general applicability of the modular brick like construction method of assemblies of colloidal particles, diverse colloidal superstructures of complex configurations were built using colloidal particles of a wide range of materials and sizes (FIG. 40). FIG. 41-FIG. 44 show a 1D hybrid chain, a 2D hybrid lattice, and a 2D double-layer 'Saturn-rings' built from polystyrene beads 2 μm and 0.96 μm in diameter. As shown in FIG. 45, reconfigurable 3D colloidal superstructures can be achieved by exploiting the optical scattering force and the thermoelectric field to provide both out-of-plane and in-plane manipulations of the colloidal particles in a precise manner.

Figure 46:
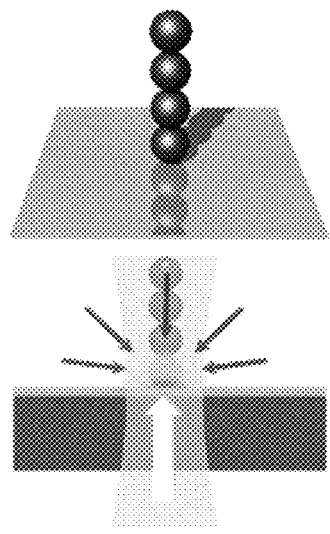
FIG. 46 shows a schematic illustration of the 3D reconfiguration and manipulation of colloidal assemblies. An upward optical scattering force aligns the colloidal particles along light-propagation direction that is normal to the substrate. The grey and white arrows represent the trapping force generated by the thermoelectric field and the optical scattering force, respectively.
Figure 47:
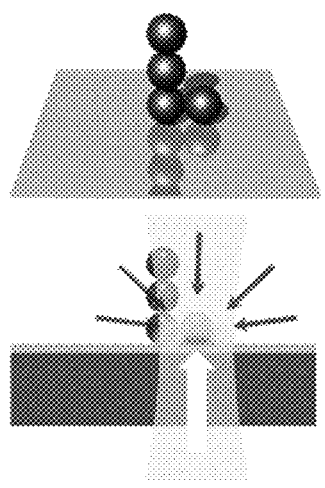
FIG. 47 shows a schematic illustration of the 3D reconfiguration and manipulation of colloidal assemblies. When the laser is directed to another location, the light-controlled thermoelectric field drags the bottom colloidal particle to change the configuration of the assembly. The grey and white arrows represent the trapping force generated by the thermoelectric field and the optical scattering force, respectively.
Figure 48:
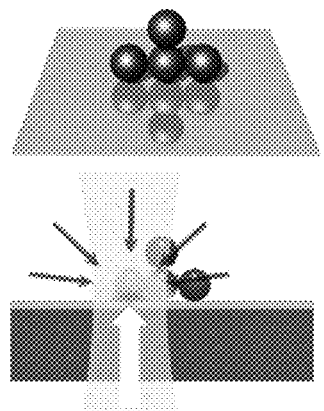
FIG. 48 shows a schematic illustration of the 3D reconfiguration and manipulation of colloidal assemblies. A well-controlled scanning of the laser beam can reconfigure the colloidal assembly in a precise manner. The grey and white arrows represent the trapping force generated by the thermoelectric field and the optical scattering force, respectively.

To achieve 3D configuration and manipulation of the colloidal assemblies, the out-of-plane scattering force was introduced by using a 100× objective (NA: 0.9). As shown in FIG. 46, the incident light from the bottom of the substrate exerts an upward scattering force to align the colloidal particles along the light propagation direction that is normal to the substrate. The depletion attraction force is strong enough to retain the bonding of the colloidal particles in the assembly. Through dynamic control of the laser beam and thus the location of the thermoelectric field, the colloidal particles can be selectively moved to reconfigure the assembly (FIG. 47 and FIG. 48).

Figure 49:
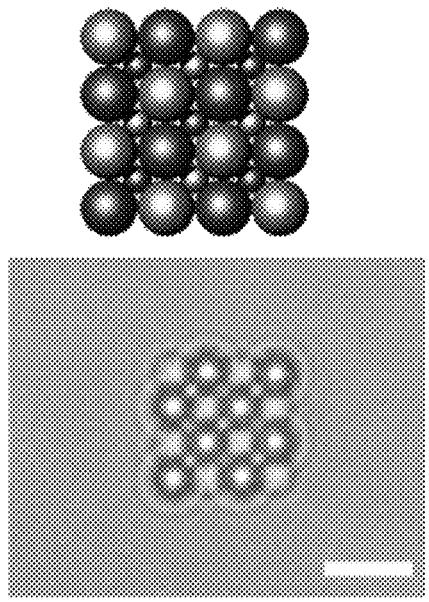
FIG. 49 shows a schematic illustration (top panel) and bright-field optical image (bottom panel) of a 2D hybrid super-lattice of 2 μm polystyrene, 0.96 μm polystyrene, 2 μm silica, and 1 μm silica beads. Scale bar: 5 μm.
Figure 50:
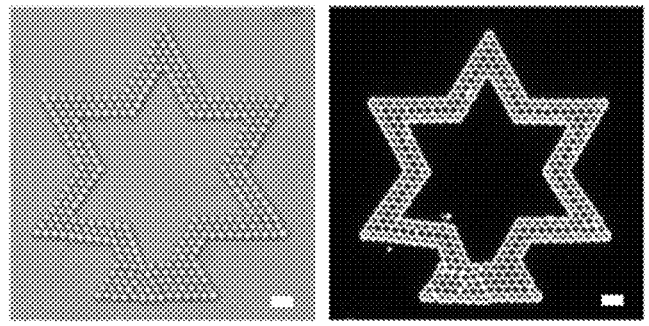
FIG. 50 shows a bright-field (left panel) and dark-field (right panel) optical images of a 2D assembly of a star pattern of 2 μm silica beads. Scale bars: 5 μm.
Figure 51:
FIG. 51 shows schematic illustrations (left panels) and dark-field optical images (right panels) of a 500 nm polystyrene bead (top panels), a 200 nm Au nanosphere (middle panels), and heterogeneous dimer consisted of a 500 nm polystyrene bead and a 200 nm Au nanosphere (bottom panels). Scale bar: 2 μm.
Figure 52:
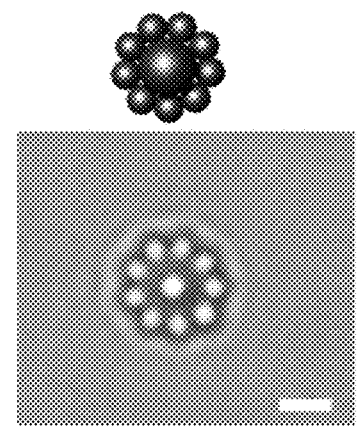
FIG. 52 shows a schematic illustration (top panel) and bright-field optical image (bottom panel) of a 2D assembly of 'Saturn-ring' structure with 2 μm and 0.96 μm polystyrene beads. Scale bar: 2 μm.
Figure 53:
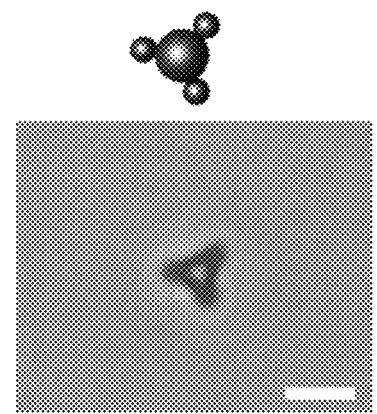
FIG. 53 shows a schematic illustration (top panel) and bright-field optical image (bottom panel) of a 2D assembly of a 0.96 μm polystyrene with three 500 nm polystyrene beads as satellites. Scale bar: 2 μm.
Figure 54:
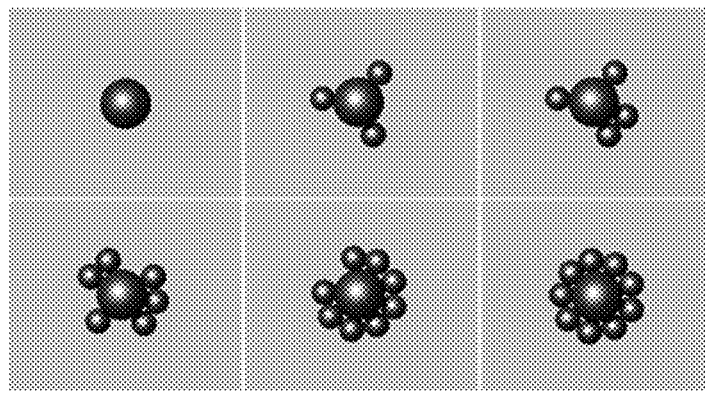
FIG. 54 shows schematic images of the assembly of the "Saturn-ring" structure with 0.96 μm and 500 nm polystyrene beads. The corresponding bright-field optical images of the assembly process are shown in FIG. 55.
Figure 55:
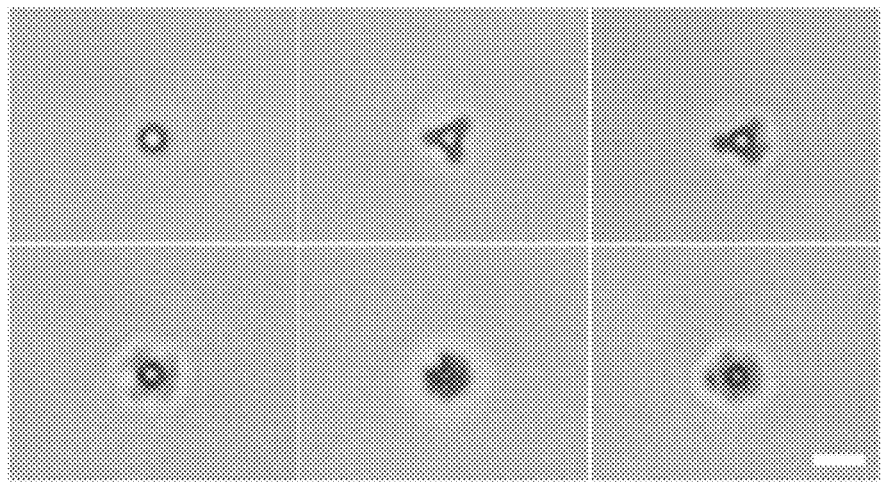
FIG. 55 shows bright-field optical images of the assembly of the "Saturn-ring" structure with 0.96 μm and 500 nm polystyrene beads. The corresponding schematic illustrations of the assembly process are shown in FIG. 54. Scale bar: 2 μm.
Figure 56:
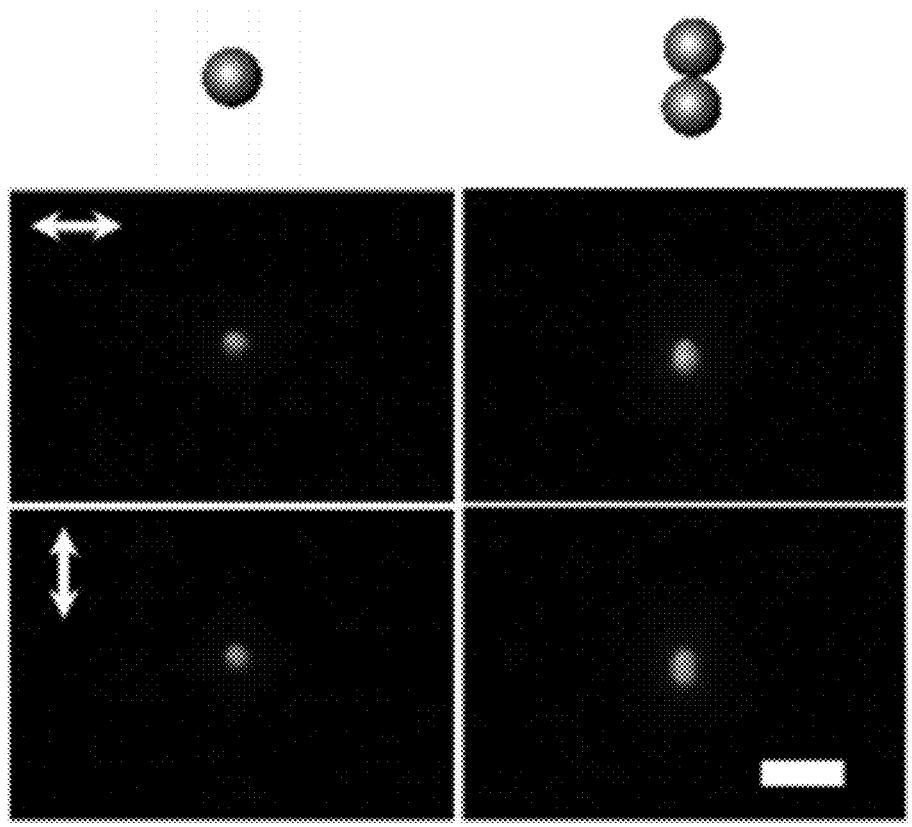
FIG. 56 shows schematic illustrations and dark-field optical images of a single Au nanosphere 200 nm in diameter (left panels) and a dimer consisting of two 200 nm Au nanospheres (right panels). Arrows in the optical images of indicate the use of different incident-light polarizations. Scale bar: 2 μm.

The modular brick like construction method of assembling colloidal particles was further extended to build colloidal superstructures of various materials. FIG. 49 shows a 2D hybrid super-lattice of 2 μm polystyrene, 0.96 μm polystyrene, 2 μm silica, and 1 μm silica beads where the different beads are arranged in a precisely controlled fashion. FIG. 50 shows a large-area star pattern of 2 μm $SiO_2$ colloids. The assembly of an Au nanoparticle and a polystyrene bead into a heterogeneous dimer was also demonstrated (FIG. 51), such a dimer is also known as an optoplasmonic molecule where the photonic-plasmonic coupling can lead to interesting optical phenomena (Ahn W et al. *ACS Nano* 2012, 6, 951-960). In FIG. 52-FIG. 55 show 'Saturn-ring' structures with polystyrene beads of different sizes. Finally, the assembly of a metallic dimer with plasmonic coupling was demonstrated. FIG. 56 shows the dark-field optical images of an Au nanosphere dimer when the polarization of the incident light is vertical and parallel to the dimer axis, respectively. An enhanced light scattering by the dimer is observed for the parallel incidence due to the near-field plasmonic coupling. With the tunable bonding length and thus the inter-particle distance, the plasmonic coupling in the colloidal assemblies can be precisely controlled, which underpins an emerging field of metasurfaces and metamaterials (Banzer P et al. *Nat. Commun.* 2016, 7, 13117).

In conclusion, both macroscopic modular brick construction methods and atomic systems were mimicked to develop the modular brick like construction method for assembling colloidal particles to build diverse colloidal matter based on an opto-thermo-fluidic platform. The modular brick like construction of optical matter with enriched structures and reconfigurability, in combination with real-space imaging of the motions of individual particles by optical microscopy, can advance the understanding of general principles of self-assembly. The scale-up of the directed assembly for a large quantity of designer structures and materials can lead to a wide range of technical applications of colloidal matter.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A method comprising:
   illuminating a first location of an optothermal substrate with electromagnetic radiation at a power density of 0.2 mW/μm$^2$ or less;

wherein the optothermal substrate converts at least a portion of the electromagnetic radiation into thermal energy;

wherein the optothermal substrate is in thermal contact with a liquid sample comprising a plurality of capped particles and a plurality of surfactant micelles, the liquid sample having a first temperature;

wherein the plurality of capped particles comprise a plurality of particles capped with a capping material;

wherein the capping material comprises a cationic material or an anionic material, such that the plurality of capped particles have a surface charge;

wherein the plurality of surfactant micelles comprise a plurality of micelles formed from a surfactant;

wherein the surfactant comprises a cationic surfactant or an anionic surfactant, such that the plurality of surfactant micelles have a surface charge; and wherein the surface charge of the plurality of capped particles and the surface charge of the plurality of surfactant micelles are the same;

thereby:

generating a confinement region at a location in the liquid sample proximate to the first location of the optothermal substrate, wherein at least a portion of the confinement region has a second temperature that is greater than the first temperature such that the confinement region is bound by a temperature gradient;

trapping at least a portion of the plurality of capped particles within the confinement region, said portion of the plurality of capped particles trapped within the confinement region being a trapped portion of the plurality of capped particles;

repulsing at least a portion of the plurality of surfactant micelles from the confinement region; and depositing at least a portion of the trapped portion of the plurality of capped particles on the optothermal substrate proximate to the first location, said portion of the trapped portion of the plurality of capped particles deposited on the optothermal substrate proximate to the first location being a deposited portion of the plurality of capped particles;

wherein the deposited portion of the plurality of capped particles comprises two or more deposited capped particles, wherein each of the two or more deposited capped particles is bonded to at least one other deposited capped particle by a bonding force and the bonding force comprises depletion attraction.

2. The method of claim 1, wherein the electromagnetic radiation is provided by a light source and the light source is configured to illuminate a mirror and the mirror is configured to reflect the electromagnetic radiation from the light source to illuminate the first location of the optothermal substrate.

3. The method of claim 1, wherein the electromagnetic radiation is provided by a light source and the light source is configured to illuminate a digital micromirror device, the digital micromirror device comprising a plurality of mirrors, and wherein the digital micromirror device is configured to reflect the electromagnetic radiation from the light source to illuminate the first location of the optothermal substrate.

4. The method of claim 1, wherein the optothermal substrate comprises a plasmonic substrate, a metal film, or a combination thereof.

5. The method of claim 1, wherein the optothermal substrate comprises a plasmonic substrate and the plasmonic substrate comprises a plurality of plasmonic particles, a film of a plasmonic metal permeated by a plurality of plasmonic nanoholes, or a combination thereof.

6. The method of claim 5, wherein the plurality of plasmonic particles and/or the film of the plasmonic metal comprise a metal selected from the group consisting of Au, Ag, Pd, Cu, Cr, Al, and combinations thereof.

7. The method of claim 1, wherein the optothermal substrate comprises a plasmonic substrate having a plasmon resonance energy and the electromagnetic radiation comprises a wavelength that overlaps with at least a portion of the plasmon resonance energy of the plasmonic substrate and the confinement region is thereby generated by plasmon-enhanced photothermal effects.

8. The method of claim 1, wherein the optothermal substrate comprises a metal film comprising a metal selected from the group consisting of Al, Ti, Cr, Mn, Fe, Co, Ni, Cu, Mo, Pd, Ag, Cd, Pt, Au, and combinations thereof.

9. The method of claim 1, wherein the surfactant and the capping material are independently selected from the group consisting of cetrimonium bromide (CTAB), cetrimonium chloride (CTAC), sodium dodecyl sulfate (SDS), and combinations thereof.

10. The method of claim 1, wherein the capping material and the surfactant are the same.

11. The method of claim 1, further comprising forming the liquid sample by contacting a plurality of particles with the surfactant, wherein the surfactant is provided at a concentration above the critical micelle concentration of the surfactant, thereby forming the plurality of capped particles and the plurality of surfactant micelles.

12. The method of claim 1, wherein the trapped portion of the plurality of capped particles are trapped by a thermophoretic force.

13. The method of claim 1, wherein the bonding force further comprises an electrostatic force, a van der Waals force, or combinations thereof.

14. The method of claim 1, further comprising illuminating a second location of the optothermal substrate thereby:

generating a second confinement region at a location in the liquid sample proximate to the second location of the optothermal substrate, wherein at least a portion of the second confinement region has a third temperature that is greater than the first temperature such that the second confinement region is bound by a temperature gradient, wherein the second confinement region is in thermal contact with at least a portion of the deposited portion of the plurality of capped particles proximate to the first location; and translocating at least the portion of the deposited portion of the plurality of capped particles in thermal contact with the second confinement region from proximate to the first location to proximate to the second location.

15. The method of claim 14, wherein the optothermal substrate is translocated to illuminate the second location; wherein the electromagnetic radiation is provided by a light source, and the light source is translocated to illuminate the second location; wherein the electromagnetic radiation is provided by an artificial light source, the artificial light source being configured to illuminate a mirror and the mirror is configured to reflect the electromagnetic radiation from the artificial light source to illuminate the optothermal substrate, and the mirror is translocated to illuminate the second location; or a combination thereof.

16. The method of claim 1, further comprising illuminating a second location of the optothermal substrate thereby:

generating a second confinement region at a location in the liquid sample proximate to the second location of the optothermal substrate, wherein at least a portion of the second confinement region has a third temperature that is greater than the first temperature such that the second confinement region is bound by a temperature gradient;

trapping at least a second portion of the plurality of capped particles within the second confinement region, said second portion of the plurality of capped particles trapped within the second confinement region being a second trapped portion of the plurality of capped particles;

repulsing at least a second portion of the plurality of surfactant micelles from the second confinement region; and depositing at least a portion of the second trapped portion of the plurality of capped particles proximate to the second location, said portion of the second trapped portion of the plurality of capped particles deposited proximate to the second location being a second deposited portion of the plurality of capped particles;

wherein the second deposited portion of the plurality of capped particles comprises one or more second deposited capped particles, wherein:

when the second deposited portion of the plurality of capped particles comprises one second deposited capped particle, the one second deposited capped particle is bonded to at least one other of the two or more deposited capped particle by a second bonding force; and when the second deposited portion of the plurality of capped particles comprises two or more second deposited capped particles, each of the one or more second deposited capped particles is bonded to: the at least one other of the two or more deposited capped particle by the second bonding force, at least one other second deposited capped particle by the second bonding force, or a combination thereof;

wherein the second bonding force comprises depletion attraction.

17. The method of claim 16, wherein the optothermal substrate is translocated to illuminate the second location; wherein the electromagnetic radiation is provided by a light source, and the light source is translocated to illuminate the second location; wherein the electromagnetic radiation is provided by an artificial light source, the artificial light source being configured to illuminate a mirror and the mirror is configured to reflect the electromagnetic radiation from the artificial light source to illuminate the optothermal substrate, and the mirror is translocated to illuminate the second location; or a combination thereof.

* * * * *